US008179020B2

(12) United States Patent
Adachi et al.

(10) Patent No.: US 8,179,020 B2
(45) Date of Patent: May 15, 2012

(54) VIBRATORY ACTUATOR AND DRIVE DEVICE USING THE SAME

(75) Inventors: Yusuke Adachi, Osaka (JP); Takayuki Hayashi, Kyoto (JP); Eiichi Nagaoka, Hyogo (JP)

(73) Assignee: Panasonic Corporation, Osaka (JP)

( * ) Notice: Subject to any disclaimer, the term of this patent is extended or adjusted under 35 U.S.C. 154(b) by 271 days.

(21) Appl. No.: 12/664,086

(22) PCT Filed: Jun. 13, 2008

(86) PCT No.: PCT/JP2008/001533
§ 371 (c)(1),
(2), (4) Date: Dec. 11, 2009

(87) PCT Pub. No.: WO2008/152820
PCT Pub. Date: Dec. 18, 2008

(65) Prior Publication Data
US 2010/0176690 A1    Jul. 15, 2010

(30) Foreign Application Priority Data

Jun. 14, 2007  (JP) .................................. 2007-157146
Jun. 14, 2007  (JP) .................................. 2007-157149
Jun. 14, 2007  (JP) .................................. 2007-157151

(51) Int. Cl.
*H02N 2/04* (2006.01)
(52) U.S. Cl. ................................................. 310/323.16
(58) Field of Classification Search .......... 310/323.01–323.21, 328
See application file for complete search history.

(56) References Cited

U.S. PATENT DOCUMENTS

| 5,698,930 A | * | 12/1997 | Takagi .................... 310/323.03 |
| 5,912,525 A | * | 6/1999 | Kobayashi et al. ...... 310/323.03 |
| 2006/0238072 A1 | * | 10/2006 | Funakubo ................ 310/323.16 |

FOREIGN PATENT DOCUMENTS

| JP | 03-251088 | 11/1991 |
| JP | 09-285155 | 10/1997 |
| JP | 2003-244978 | 8/2003 |
| JP | 2004-304963 | 10/2004 |

OTHER PUBLICATIONS

International Search Report for corresponding Application No. PCT/JP2008/001533 mailed Jul. 22, 2008.
Form PCT/ISA/237.

* cited by examiner

*Primary Examiner* — Derek Rosenau
(74) *Attorney, Agent, or Firm* — Renner, Otto, Boisselle & Sklar, LLP

(57) ABSTRACT

A vibratory actuator is provided in which a movable body can be stably driven even when a groove is formed in an abutment body by the friction between the driver element and the abutment body. An ultrasonic actuator (2) includes an actuator body (4) which performs a longitudinal vibration and a bending vibration, and a driver element (8a, 8b) which is provided on one of side surfaces of the actuator body (4) which is a mounting surface (40a), and performs an orbital motion in accordance with the vibrations of the actuator body (4) to output a driving force. The driver element (8a, 8b) includes a first driver element (8a) and a second driver element (8b) which are provided on the mounting surface (40a) at different positions in a longitudinal direction of the actuator body (4). The first driver element (8a) and the second driver element (8b) are located at different positions in a thickness direction of the actuator body (4).

55 Claims, 21 Drawing Sheets

FIG. 25
(a) 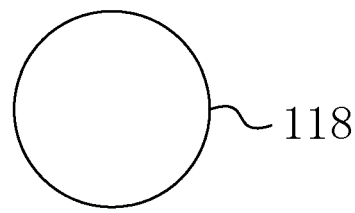
(b) 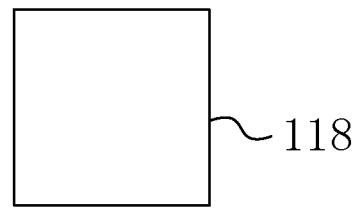
FIG. 26
(a) 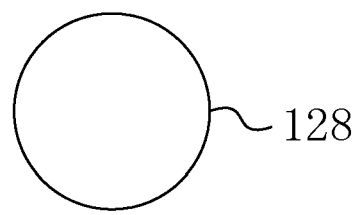
(b) 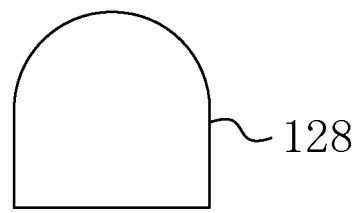

FIG. 27
(a) 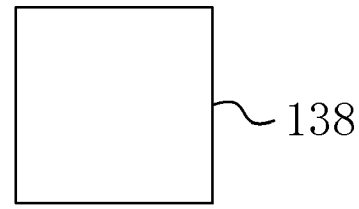
(b) 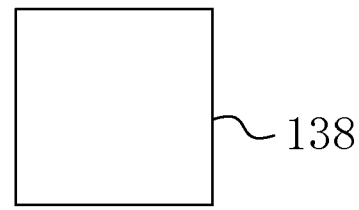
FIG. 28
(a) 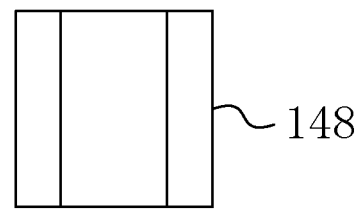
(b) 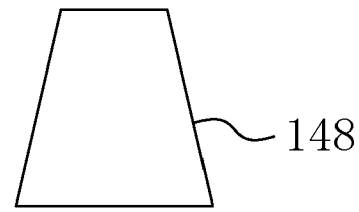

VIBRATORY ACTUATOR AND DRIVE DEVICE USING THE SAME

TECHNICAL FIELD

The present invention relates to vibratory actuators including a piezoelectric element and drive devices including the vibratory actuators.

BACKGROUND ART

Conventionally, as a vibratory actuator having a piezoelectric element, one which is disclosed in Patent Document 1 is known.

The vibratory actuator of Patent Document 1 includes an actuator body including a piezoelectric element and two driver elements attached to the actuator body.

The actuator body includes a plate-like piezoelectric element having a longitudinal direction. By applying alternating currents having different phases to two pairs of diagonally opposite electrodes, a longitudinal vibration (so-called an expanding/contracting vibration) in a longitudinal direction of the piezoelectric element and a bending vibration in a lateral direction of the piezoelectric element are induced in a coordinated manner. As a result, the driver elements perform an orbital motion, more specifically, an elliptical motion in a plane including the longitudinal direction and the lateral direction of the piezoelectric element.

The two driver elements, which are in the form of substantially a hemisphere, are provided on a long side surface of the actuator body. The long side surface faces in the vibration direction of the bending vibration of the actuator body, and is bent and deformed in accordance with the bending vibration performed by the actuator body. In other words, the long side surface of the actuator body undulates. The two driver elements are attached to an antinode of the bending vibration of the long side surface where the bending displacement is maximum.

The vibratory actuator thus configured is provided between a stationary body, and a movable body which can be moved relative to the stationary body. Specifically, the vibratory actuator is fixed to one of the stationary body and the movable body while the driver elements abut on the other (also referred to hereinafter as an abutment body) of the stationary body and the movable body. In this state, when the vibratory actuator is activated to cause the driver elements to perform the orbital motion as described above, the driver elements orbit while pressing themselves against the abutment body to increase a friction force in a zone of the orbital motion, and orbits while being apart from the abutment body or with the friction force between the driver elements and the abutment body being reduced in another zone of the orbital motion. When the driver elements orbit while pressing themselves against the abutment body, a driving force is transmitted to the movable body by means of the friction force between the driver element and the abutment body, whereby the movable body is driven in a predetermined direction.

In this case, the actuator body is biased by a biasing member in a direction in which the driver elements are pressed against the abutment body, whereby the friction force between the driver elements and the abutment body is increased. As a result, the driving force of the actuator body is efficiently transmitted to the movable body. Specifically, the biasing member is provided on a surface of the actuator body opposite to the surface on which the driver elements are provided. The biasing member biases the actuator body toward the abutment body.

Citation List
Patent Document
PATENT DOCUMENT 1: Japanese Laid-Open Patent Publication No. 2004-304963

SUMMARY OF THE INVENTION

Technical Problem

Incidentally, in the vibratory actuator which drives the movable body by means of the friction force between the driver element and the abutment body as described above, the driver elements and the abutment body gradually wear. As a result, grooves are formed in the abutment body along tracks of the driver elements. When the movable body is moved within a narrow range, a groove formed by one driver element is separated from a groove formed by the other driver element. When the movable body is moved within a wide range, both of the grooves formed by the driver elements merge. In the grooves thus merging, the groove formed by one driver element overlaps the groove formed by the other driver element, and the groove formation is accelerated in the overlapping portion by both of the driver elements. Therefore, the groove depth becomes deeper in the overlapping portion than in the other portions. The friction force between the driver elements and the abutment body differs between the portions having different groove depths, and therefore, the driving force applied to the movable body varies therebetween. As a result, the movable body can no longer be stably driven. Also, a step is formed at a portion where the groove depth changes. When a driver element passes through the step, the friction force between the driver element and the abutment body suddenly changes. This also prevents the movable body from being stably driven.

Of the present inventions, a first invention has been made in view of the aforementioned problem. It is an object of the first invention to provide a vibratory actuator capable of stably driving the movable body even when grooves are formed in the abutment body due to the friction between the driver elements and the abutment body. This object is referred to hereinafter as a first object.

Also, the aforementioned vibratory actuator has another problem. Specifically, in the vibratory actuator, the actuator body is biased toward the abutment body by the biasing member, while a reaction force from the abutment body against which the driver elements are pressed acts on the actuator body. The biasing force of the biasing member and the reaction force from the abutment body act on the actuator body as a moment which rotates the actuator body. As a result, the moment alters the attitude of the actuator body, which changes the abutment state between the driver elements and the abutment body, and therefore, it is likely that a desired driving force cannot be output to the movable body.

Of the present inventions, a second invention has been made in view of the aforementioned problem. It is an object of the second invention to reduce the change of the attitude of the actuator body. This object is referred to hereinafter as a second object.

Also, the aforementioned vibratory actuator has still another problem. Specifically, as described above, the pressing force of the driver elements to the abutment body is enhanced by the biasing force of the biasing member. In this case, it is preferable that the driver elements be located on a straight line extending in the direction of the biasing force of the biasing member. In other words, it is preferable that the biasing force of the biasing member acting on the driver elements act in the same direction as that of the pressing force of the driver elements to the abutment body. If the driver elements are not located on the straight line extending in the direction of the biasing force of the biasing member, for example, if the direction of the pressing force and the direction of the biasing force are deviated in a direction perpendicular to a plane in which the driver elements perform an orbital motion (i.e., a thickness direction of the plate-shaped actuator body), the biasing force is inclined in the perpendicular direction with respect to the direction of the pressing force of the driver element, i.e., the biasing force acts on the actuator body so that the actuator body is inclined in the perpendicular direction. As a result, the driver elements perform an orbital motion in a plane which is inclined in a direction perpendicular to a plane in which the driver elements normally perform an orbital motion. In other words, the biasing force for enhancing the pressing force of the driver elements acting on the abutment body cannot be efficiently used, and therefore, the friction force between the driver elements and the abutment body is not sufficient, so that the driving force is unlikely to be sufficiently transmitted to the movable body.

The present invention has been made in view of the aforementioned problem. It is an object of the present invention to efficiently transfer the driving force from the driver elements to the movable body. This object is referred to hereinafter as a third object.

Solution to the Problem

The present invention achieves these objects by providing a plurality of driver elements in a direction perpendicular to a plane in which the driver elements perform an orbital motion.

Specifically, in order to achieve the first object, in the first invention, a first driver element and a second driver element are offset in a direction perpendicular to a plane in which the first and second driver elements perform an orbital motion.

Specifically, a vibratory actuator according to the first invention includes an actuator body formed of or formed to include a piezoelectric element, and configured to perform a plurality of vibrations having different vibration directions, and a driver element provided on a mounting surface which is one of side surfaces of the actuator body, and configured to perform an orbital motion in accordance with the vibrations of the actuator body to output a driving force in a predetermined driving direction. The driver element includes a first driver element and a second driver element on the mounting surface at different positions in a direction along the driving direction. The first driver element and the second driver element are located at different positions in a direction perpendicular to a plane in which the first and second driver elements perform the orbital motion.

Moreover, a drive device according to the first invention includes a stationary body and a movable body which can be moved relative to each other, and the vibratory actuator of claim 1 interposed between the stationary body and the movable body. The vibratory actuator is provided on one of the stationary body and the movable body while the driver element abuts on the other of the stationary body and the movable body. The drive device further includes a biasing member configured to bias the actuator body so as to press the driver element against the other of the stationary body and the movable body.

Moreover, in order to achieve the second object, in the second invention, a plurality of driver elements are provided in a direction perpendicular to a plane in which the driver elements perform the orbital motion, and the driver elements form a driver element group. The driver elements in the driver element group are arranged at positions offset from each other in a direction in which the driving force is output.

Specifically, the second invention is directed to a vibratory actuator including an actuator body formed of or formed to include a piezoelectric element, and configured to perform a plurality of vibrations having different vibration directions, and a driver element provided on a mounting surface which is one of side surfaces of the actuator body, and configured to perform an orbital motion in accordance with the vibrations of the actuator body to output a driving force in a predetermined driving direction. The driver element includes a group of driver elements provided in a direction perpendicular to a plane in which the driver element performs the orbital motion. The driver elements in the driver element group are arranged at positions offset from each other in a direction along the driving direction.

Moreover, in order to achieve the third object, in the third invention, a plurality of driver elements are provided at different positions in a direction perpendicular to a plane in which the driver elements perform an orbital motion.

Specifically, a vibratory actuator according to a third invention includes an actuator body formed of or formed to include a piezoelectric element, and configured to perform a plurality of vibrations having different vibration directions, and a plurality of driver elements provided on a mounting surface which is one of side surfaces of the actuator body, and configured to perform an orbital motion in accordance with the vibrations of the actuator body to output a driving force. The driver elements are provided at different positions in a direction perpendicular to a plane in which the driver elements perform an orbital motion.

Moreover, a drive device according to the third invention includes a stationary body and a movable body which can be moved relative to each other, and the vibratory actuator interposed between the stationary body and the movable body. The vibratory actuator is provided on one of the stationary body and the movable body while the driver element abuts on the other of the stationary body and the movable body. The drive device further includes a biasing member configured to bias the actuator body so as to press the driver element against the other of the stationary body and the movable body.

ADVANTAGES OF THE INVENTION

According to the first invention, in a vibratory actuator in which a plurality of driver elements, specifically the first and second driver elements, are provided in a direction along the driving direction. The first and second driver elements are offset in a direction perpendicular to a plane in which the first and second driver elements perform an orbital motion. As a result, grooves formed in an abutment body on which the first and second driver elements abut are offset from each other in the perpendicular direction, whereby it is possible to prevent a groove formed by the first driver element and a groove formed by the second driver element from merging to form portions having different depths or a step in the groove. As a result, it is possible to prevent a friction force between the driver element and the abutment body from significantly varying and suddenly changing, whereby an object can be stably driven by the vibratory actuator.

Moreover, according to the second invention, a plurality of driver elements are provided in a direction perpendicular to a plane in which the driver elements perform an orbital motion, and the driver elements are located at positions offset in a direction along the driving direction, whereby the abutment area between the actuator body and the abutment body can be expanded in the direction along the driving direction. As a result, the rotation of the actuator body in the plane in which the driver elements perform an orbital motion can be restrained, and therefore, the attitude of the actuator body can be stabilized, whereby a desired driving force can be transmitted from the driver elements to the movable body.

Moreover, according to the third invention, a plurality of driver elements are provided at different positions in a direction perpendicular to a plane in which the driver elements perform an orbital motion, whereby abutment points between the actuator body and the abutment body can be increased in the perpendicular direction. As a result, the actuator body can be prevented from being inclined in the perpendicular direction, whereby a biasing force applied to the actuator body can effectively enhance a friction force between the driver elements and the abutment body, and therefore, a driving force can be efficiently transmitted from the driver elements to the movable body.

BRIEF DESCRIPTION OF THE DRAWINGS

FIG. 25 is a cross-sectional view of a driver element according to another embodiment, (a) is a plan view and (b) is a front view.

FIG. 26 is a cross-sectional view of a driver element according to still another embodiment, (a) is a plan view and (b) is a front view.

FIG. 27 is a cross-sectional view of a driver element according to still another embodiment, (a) is a plan view and (b) is a front view.

FIG. 28 is a cross-sectional view of a driver element according to still another embodiment, (a) is a plan view and (b) is a front view.

DESCRIPTION OF EMBODIMENTS

Embodiments of the present invention will be described hereinafter in detail with reference to the accompanying drawings.

<<Embodiment 1 of the Invention>>

Figure 2:
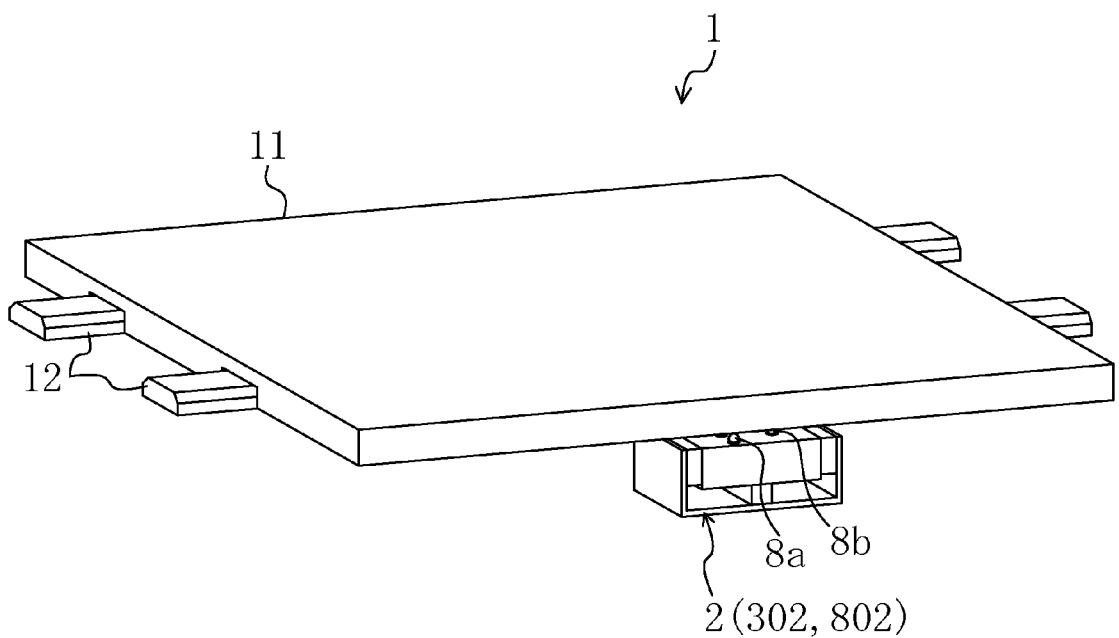
FIG. 2 is a perspective view of a drive device.

As shown in FIG. 2, a drive device 1 according to Embodiment 1 of the present invention includes a stage 11, an ultrasonic actuator 2, and a controller (not shown) which drives and controls the ultrasonic actuator 2.

The stage 11 is slidably attached to guides 12 which are arranged in parallel with each other and are fixed to a base (not shown) which is a stationary body. In other words, the stage 11 is configured to be movable in a direction in which the guides 12 extend. The stage 11 constitutes a movable body. The direction in which the guides 12 extend is a moving direction of the stage 11. The stage 11 is a plate-like member having substantially a rectangular shape as viewed from the top and is formed of alumina. Note that the material for the stage 11 is not limited to alumina and may be any material. The ultrasonic actuator 2 is provided on a back surface (a side on which the guides 12 are provided) so that driver elements 8a and 8b described later abut on the stage 11.

Figure 1:
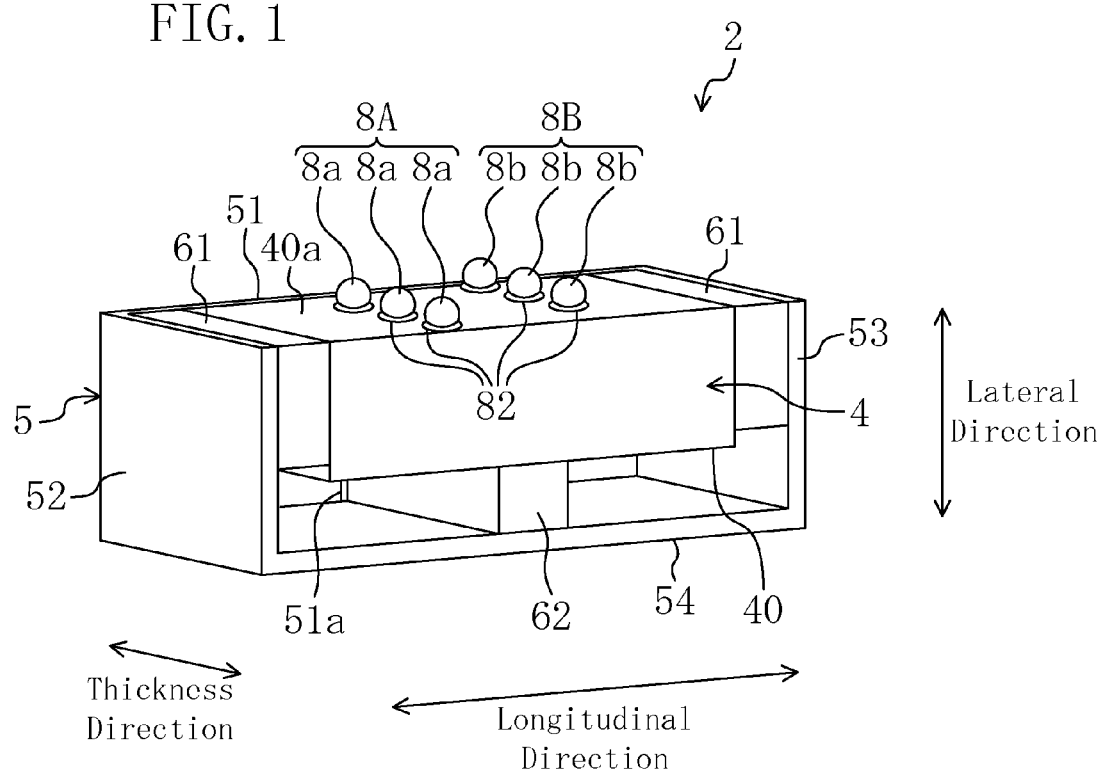
FIG. 1 is a perspective view of an ultrasonic actuator according to Embodiment 1 of the present invention.

As shown in FIG. 1, the ultrasonic actuator 2 includes an actuator body 4 which generates vibrations, the driver elements 8a and 8b which transfer a driving force of the actuator body 4 to the stage 11, a case 5 which accommodates the actuator body 4, support rubbers 61 which are interposed between the actuator body 4 and the case 5 and elastically support the actuator body 4, and a biasing rubber 62 which biases the stage 11 toward the actuator body 4. The ultrasonic actuator 2 constitutes a vibratory actuator (the same applies to each embodiment described below).

The actuator body 4 is formed of a piezoelectric element unit 40.

The piezoelectric element unit 40 has substantially a rectangular parallelepiped shape having a pair of substantially rectangular principal surfaces facing each other, a pair of long side surfaces facing each other, perpendicular to the principal surface and extending in a longitudinal direction of the principal surface, and a pair of short side surfaces facing each other, perpendicular to both the principal surface and the long side surface, and extending in a lateral direction of the principal surface.

Figure 3:
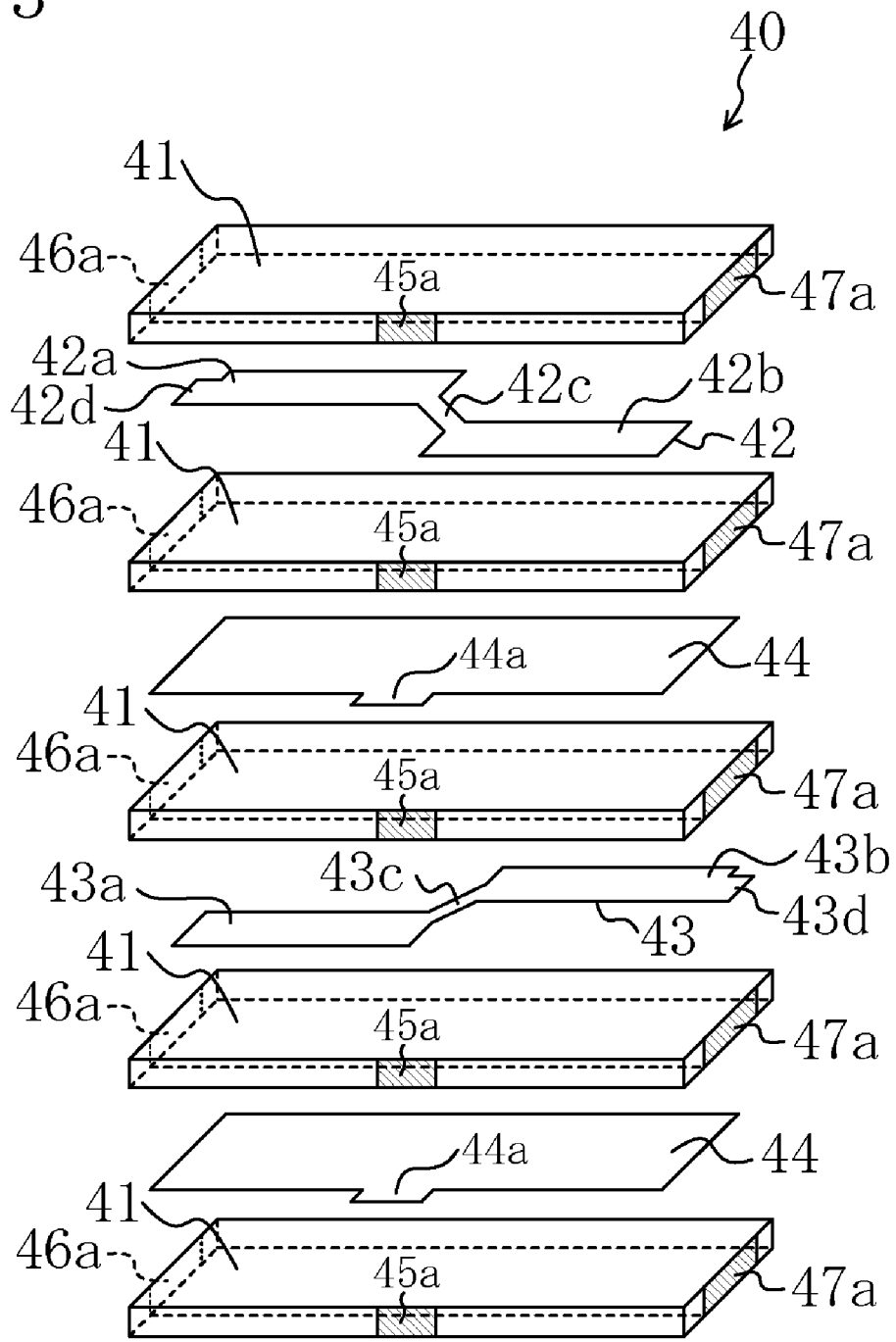
FIG. 3 is an exploded perspective view of a piezoelectric element unit.

As shown in FIG. 3, the piezoelectric element unit 40 includes five piezoelectric layers (piezoelectric elements) 41 and four internal electrode layers 42, 44, 43 and 44, which are alternately stacked. The internal electrode layers 42, 44, 43 and 44 are a first power supply electrode layer 42, a common electrode layer 44, a second power supply electrode layer 43, and another common electrode layer 44, with the piezoelectric layer 41 being interposed between any two of the internal electrode layers that are adjacent in the stacking direction. The first power supply electrode layer 42, the second power supply electrode layer 43 and the common electrode layers 44 are printed on the principal surfaces of the respective corresponding piezoelectric layers 41.

The piezoelectric layers 41 are each an insulating layer formed of a ceramic material, such as lead zirconate titanate or the like, which has substantially a rectangular parallelepiped shape including a pair of principal surfaces, a pair of long side surfaces and a pair of short side surfaces as with the piezoelectric element unit 40. Moreover, in each piezoelectric layer 41, an external electrode 45a is formed at a middle portion in the longitudinal direction of one of the long side surfaces, an external electrode 46a is formed at a middle portion in the lateral direction of one of the short side surfaces, and an external electrode 47a is formed at a middle portion in the lateral direction of the other short side surface.

The common electrode layers 44 are provided over substantially the entire principal surfaces of the respective corresponding piezoelectric layers 41 and have substantially a rectangular shape. Moreover, a lead electrode 44a is formed at one of long side portions of each common electrode layer 44, extending from a middle portion in the longitudinal direction of the common electrode layer 44 to the external electrode 45a of the corresponding piezoelectric layer 41.

Figure 4:
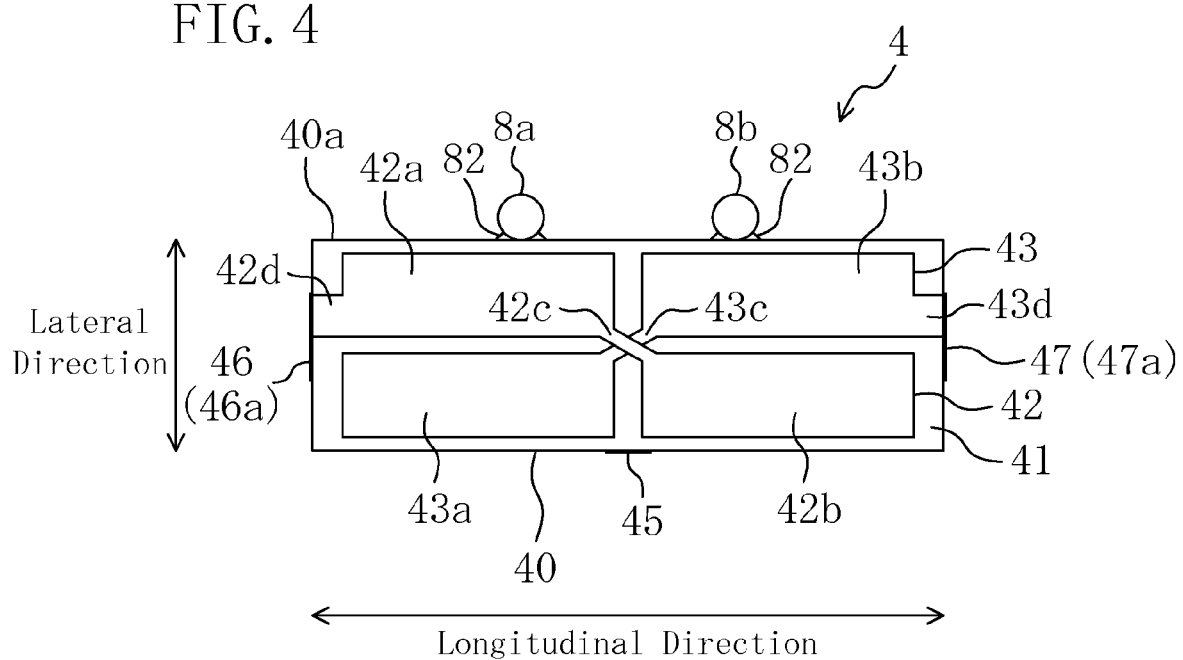
FIG. 4 is a schematic front view showing a schematic configuration of an actuator body.

Suppose that the principal surface of each piezoelectric layer 41 is divided into two in the longitudinal direction and in the lateral direction, i.e., four areas. As shown in FIG. 4, the first power supply electrode layer 42 has a pair of first electrodes 42a and 42b formed in one of two pairs of diagonally opposite areas of the principal surface, respectively, and a conductive electrode 42c conductively coupling the first electrodes 42a and 42b. Each first electrode 42a (42b) has substantially a rectangular shape, which overlaps the common electrode layer 44 as viewed in the stacking direction. In other words, each first electrode 42a (42b) faces the common electrode layer 44 with the corresponding piezoelectric layer 41 being interposed therebetween. Moreover, one (first electrode 42a) of the first electrodes 42a and 42b is provided with a lead electrode 42d extending to the external electrode 46a of the corresponding piezoelectric layer 41.

The second power supply electrode layer 43 has a pair of second electrodes 43a and 43b formed in the other of the two pairs of diagonally opposite areas of the principal surface of the corresponding piezoelectric layer 41, respectively, and a conductive electrode 43c conductively coupling the second electrodes 43a and 43b. The second electrode 43a is located in one of the other pair of areas which is adjacent to the first electrode 42a in the lateral direction and the first electrode 42b in the longitudinal direction as viewed in the stacking direction. The second electrode 43b is located in the other area which is adjacent to the first electrode 42a in the longitudinal direction and the first electrode 42b in the lateral direction as viewed in the stacking direction. Each second electrode 43a (43b) has substantially a rectangular shape, which overlaps the common electrode layer 44 as viewed in the stacking direction. In other words, each second electrode 43a (43b) faces the common electrode layer 44 with the corresponding piezoelectric layer 41 being interposed therebetween. Moreover, one (second electrode 43b) of the second electrodes 43a and 43b is provided with a lead electrode 43d extending to the external electrode 47a of the corresponding piezoelectric layer 41.

In the piezoelectric element unit 40 which is configured by alternately stacking the piezoelectric layers 41 and the internal electrode layers 42, 44, 43 and 44, the external electrodes 45a of the piezoelectric layers 41 align in the stacking direction at the middle portions in the longitudinal direction of the one long side surface of the piezoelectric element unit 40, thereby forming an integrated external electrode 45. The lead electrodes 44a formed in the common electrode layers 44 are electrically connected to the external electrode 45. Likewise, the external electrodes 46a of the piezoelectric layers 41 align in the stacking direction at the middle portions in the lateral direction of the one short side surface of the piezoelectric element unit 40, thereby forming an integrated external electrode 46. The lead electrode 42d of the first power supply electrode layer 42 is electrically connected to the external electrode 46. Moreover, the external electrodes 47a of the piezoelectric layers 41 align in the stacking direction at the middle portions in the lateral direction of the other short side surface of the piezoelectric element unit 40, thereby forming an integrated external electrode 47. The lead electrode 43d of the second power supply electrode layer 43 is electrically connected to the external electrode 47.

Figure 5:
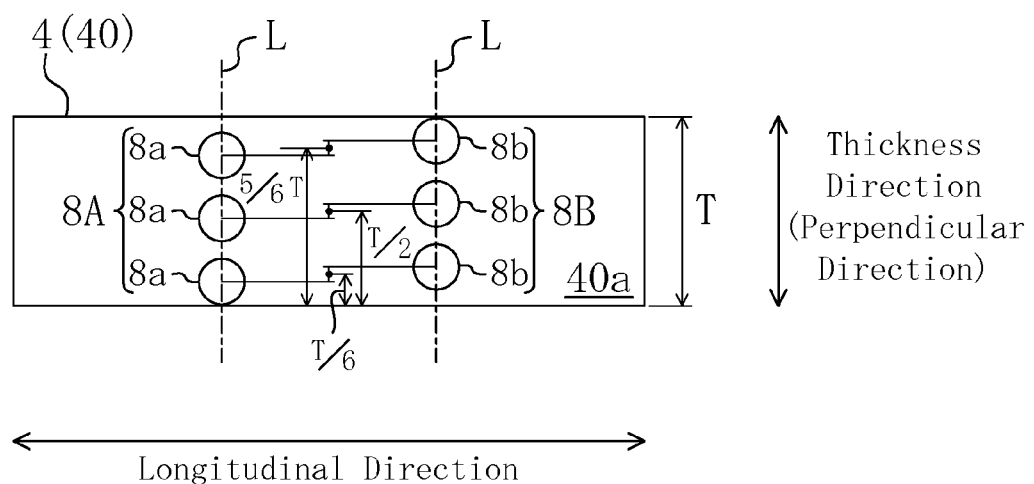
FIG. 5 is a plan view of the actuator body showing an arrangement of driver elements.

On the other long side surface 40a of the piezoelectric element unit 40 at which the external electrode 45a is not provided (i.e., one of a pair of surfaces facing in a vibration direction of a bending vibration, also referred to hereinafter as a mounting surface), six driver elements 8a and 8b are provided as shown in FIGS. 1 and 5.

The driver elements 8a and 8b have a spherical shape and are formed of zirconia, alumina, silicon nitride, silicon carbide, tungsten carbide or the like. Moreover, the driver elements 8a and 8b are attached by a point contact to the mounting surface 40a of the piezoelectric element unit 40 via an adhesive 82 (see FIG. 4). Here, the term "point contact" is not limited to a state in which the driver elements 8a and 8b exactly contact the mounting surface 40a, and also means a state in which the driver elements 8a and 8b and the mounting surface 40a have substantially a point contact with each other with the adhesive 82 being interposed between the driver elements 8a and 8b and the mounting surface 40a.

It is desirable that the adhesive 82 be made of a material which is softer than materials for the piezoelectric element unit 40 and the driver elements 8a and 8b. Specifically, examples of the material for the adhesive 82 include synthetic resins, such as, particularly, epoxy resins and silicone resins. The use of such a material allows the driver elements 8a and 8b to be fixed to the mounting surface 40a while avoiding the damping of vibrations described later of the piezoelectric element unit 40 to the extent possible.

Moreover, the driver elements 8a and 8b are located on the mounting surface 40a at a distance corresponding to 30 to 35% of the full length of the mounting surface 40a from both end portions in the longitudinal direction of the piezoelectric element unit 40 (the positions of the driver elements 8a and 8b are indicated by straight lines L in FIG. 5). In other words, the positions correspond to respective antinodes of the second-order mode of a bending vibration described later of the piezoelectric element unit 40, where the vibration is maximum. The driver elements 8a and 8b are divided into a first driver element group 8A including the first driver elements 8a located at one in the longitudinal direction of the two positions corresponding to the respective antinodes of the second-order mode of a bending vibration, and a second driver element group 8B including the second driver elements 8b located at the other position in the longitudinal direction.

As shown in FIG. 5, in each driver element group 8A (8B), the driver elements 8a (8b) are aligned in a thickness direction (also referred to hereinafter as a perpendicular direction) of the piezoelectric element unit 40. More specifically, the driver elements 8a (8b) are arranged in the straight line L extending in the thickness direction. The perpendicular direction is also the stacking direction of the piezoelectric element unit 40, a direction perpendicular to a plane in which the driver elements 8a (8b) perform an orbital motion described later, and a direction perpendicular to both a vibration direction of a bending vibration and a vibration direction of a longitudinal vibration described later of the piezoelectric element unit 40. Moreover, the driver elements 8a (8b) are equally spaced in the perpendicular direction.

Note that the first driver elements 8a of the first driver element group 8A and the second driver elements 8b of the second driver element group 8B are offset from each other in the perpendicular direction, and are located at different positions in the perpendicular direction. Specifically, the first driver elements 8a of the first driver element group 8A and the second driver elements 8b of the second driver element group 8B are alternately located only in terms of positions in the perpendicular direction (i.e., a first driver element 8a, a second driver element 8b, a first driver element 8a, a second driver element 8b, and so on), although the first driver elements 8a and the second driver elements 8b are located at different positions in the longitudinal direction. Moreover, the first driver elements 8a and the second driver elements 8b are equally spaced in the perpendicular direction. Specifically, an offset in the perpendicular direction between the first first-driver element 8a and the first second-driver element 8b, an offset in the perpendicular direction between the first second-driver element 8b and the second first-driver element 8a, an offset in the perpendicular direction between the second first-driver element 8a and the second second-driver element 8b, and so on are equal to each other (the first and second driver elements are numbered from one end in the perpendicular direction).

Moreover, the first driver elements 8a and the second driver elements 8b, which are alternately arranged in the perpendicular direction, are also arranged so that a middle position t in the perpendicular direction between an N-th (N=1, 2, ..., n) first-driver element 8a and an N-th second-driver element 8b which are numbered from one end in the perpendicular direction, satisfies the following:

$$t = \{(2N-1)/(2n)\} \times T \quad (1)$$

where t: a position in the perpendicular direction on the mounting surface 40a with reference to the one end in the perpendicular direction n: the total number of driver elements arranged in the perpendicular direction (three in this embodiment)

T: a dimension in the perpendicular direction of the mounting surface 40a (a thickness of the actuator body 4)

Specifically, in this embodiment, the middle position in the perpendicular direction between the first driver element 8a and the second driver element 8b which are located closest to the one end in the perpendicular direction (the lower side of FIG. 5) is located at a distance of T/6 from the edge at the one end in the perpendicular direction of the mounting surface 40a. The middle position in the perpendicular direction between the second closest first driver element 8a and the second closest second driver element 8b to the one end in the perpendicular direction is located at the middle in the perpendicular direction of the mounting surface 40a. The middle position in the perpendicular direction between the third closest first driver element 8a and the third closest second driver element 8b (located on the upper side of FIG. 5) to the one end in the perpendicular direction is located at a distance of 5 T/6 from the edge at the one end in the perpendicular direction of the mounting surface 40a. In other words, the offset between the middle position in the perpendicular direction between the first first- and second-driver elements 8a and 8b from the one end in the perpendicular direction, and the middle position in the perpendicular direction between the second first- and second-driver elements 8a and 8b, and the offset between the middle position in the perpendicular direction between the second first- and second-driver elements 8a and 8b and the middle position in the perpendicular direction between the third first- and second-driver elements 8a and 8b, are each T/3.

As a result, the first driver elements 8a and the second driver elements 8b are alternately arranged at offsets of T/6 in the perpendicular direction from one end to the other end in the perpendicular direction. The offset of T/6 in the perpendicular direction is larger than a width in the perpendicular direction of an abutment area of each of the first and second driver elements 8a and 8b at which the driver element abuts on the stage 11. Preferably, the offset of T/6 is larger than a width in the perpendicular direction of a groove which is expected to be formed in the stage 11.

In the actuator body 4 described above, when the external electrode 45 is grounded, and a first alternating current having a predetermined frequency is applied to the external electrode 46 while a second alternating current having a phase shifted by 90° from the first alternating current is applied to the external electrode 47, the alternating currents having the phases shifted by 90° from each other are applied to a pair of the diagonally opposite first electrodes 42a and 42b and another pair of the diagonally opposite second electrodes 43a and 43b provided on the principal surface of the piezoelectric layer 41. As a result, a longitudinal vibration (so-called an expanding/contracting vibration) and a bending vibration (so-called a lateral vibration) are induced in the longitudinal direction and in the lateral direction, respectively.

Figure 6:
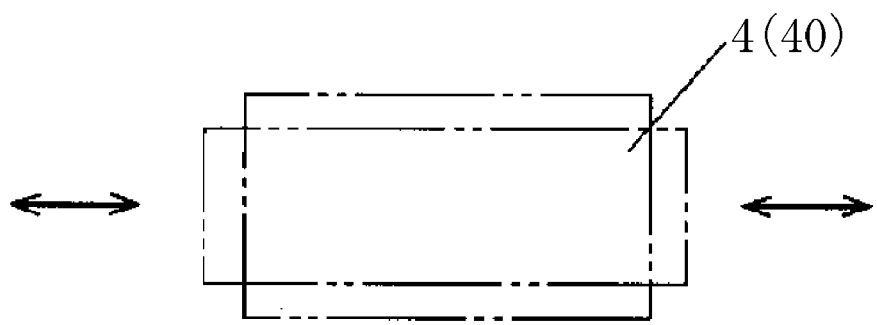
FIG. 6 is a conceptual diagram showing a displacement of the actuator body in a longitudinal direction by the first-order mode of a longitudinal vibration.
Figure 7:
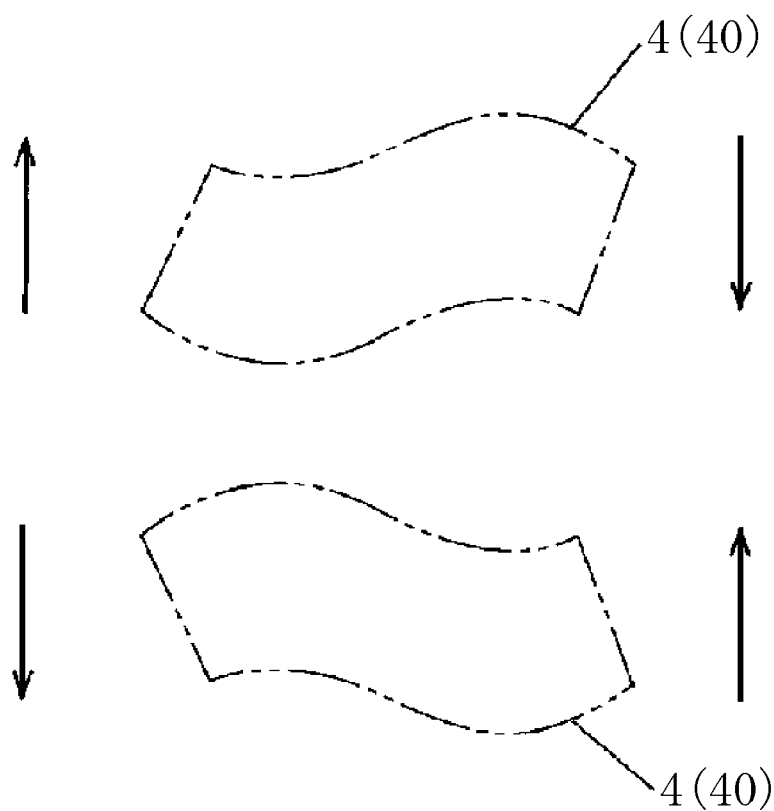
FIG. 7 is a conceptual diagram showing a displacement of the actuator body by the second-order mode of a bending vibration.

The resonance frequency of the longitudinal vibration and the resonance frequency of the bending vibration are each determined based on a material, a shape and the like of the actuator body 4, i.e., the piezoelectric element unit 40. Moreover, both the resonance frequencies are affected by a force supporting the actuator body 4 and a portion supporting the actuator body 4. In view of these facts, both the resonance frequencies are caused to be substantially equal to each other, and alternating currents having a frequency in the vicinity thereof and having phases shifted by 90° from each other are applied to the respective external electrodes 46 and 47. For example, the shape and the like of the piezoelectric element unit 40 are designed so that the resonance frequency in the first-order mode (see FIG. 6) of the longitudinal vibration and the resonance frequency in the second-order mode (see FIG. 7) of the bending vibration are equal to each other, and moreover, alternating currents in the vicinity of the resonance frequency and having phases shifted by 90° from each other are applied as described above, whereby the first-order mode of the longitudinal vibration and the second-order mode of the bending vibration are induced in a coordinated manner in the piezoelectric element unit 40. As a result, changes in shape sequentially occur as shown in FIGS. 8(*a*), 8(*b*), 8(*c*) and 8(*d*).

Figure 8:
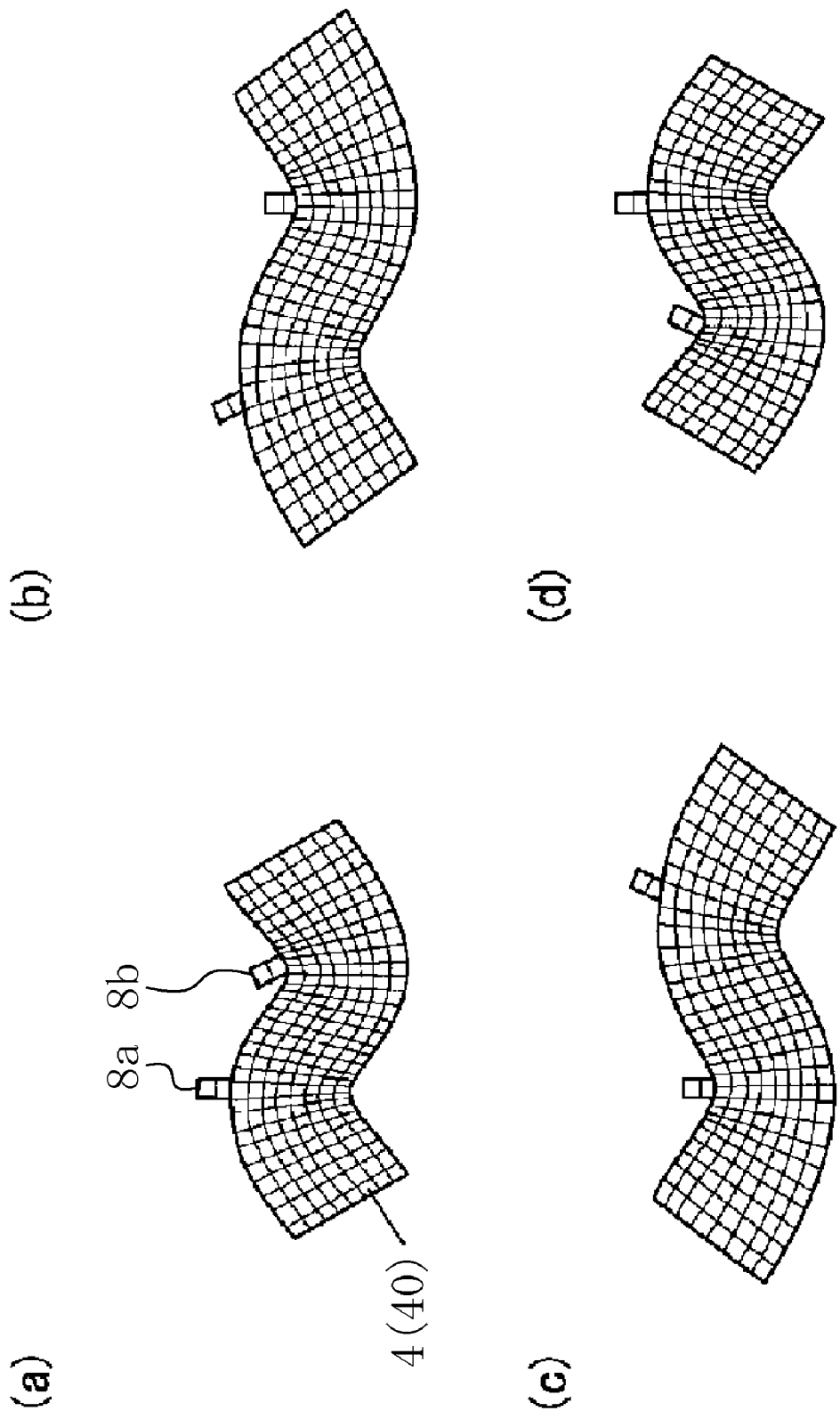
FIG. 8 is a conceptual diagram showing operation of the actuator body.

As a result, each driver element 8*a* (8*b*) provided on the piezoelectric element unit 40 performs substantially an elliptical motion, i.e., an orbital motion in a plane parallel to the principal surface of the piezoelectric element unit 40, i.e., a plane including the longitudinal direction and the lateral direction (a plane parallel to the drawing sheet in FIG. 8).

The case 5 is formed of a resin and is in the shape of substantially a box having substantially a rectangular parallelepiped shape corresponding to the piezoelectric element unit 40. The case 5 has a principal wall portion 51 which is parallel to the principal surface of the piezoelectric element unit 40 and has substantially a rectangular shape, a first short side wall portion 52 which is provided at a short side portion located on one side (the left side of FIG. 1) in the longitudinal direction of the principal wall portion 51, a second short side wall portion 53 which is provided at a short side portion located on the other side (the right side of FIG. 1) in the longitudinal direction of the principal wall portion 51, and a long side wall portion 54 which is provided at a long side portion located on one side (the lower side of FIG. 1) in the lateral direction of the principal wall portion 51. In other words, the case 5 has the following shape. No wall portion is provided at a side facing the principal wall portion 51 and at a long side portion (corresponding to the long side surface of the piezoelectric element unit 40 on which the driver elements 8*a* and 8*b* are provided) located on the other side (the upper side of FIG. 1) in the lateral direction of the principal wall portion 51. As a result, the case 5 is open at the one side in the stacking direction (the normal direction of the principal wall portion 51) of the piezoelectric element unit 40 and at the other side in the lateral direction.

The case 5 thus configured accommodates the actuator body 4. The actuator body 4 is accommodated in the case 5 so that one of the principal surfaces of the piezoelectric element unit 40 faces the principal wall portion 51, and one (a long side surface on which the external electrode 45 is provided) of the long side surfaces of the piezoelectric element unit 40 to face the long side wall portion 54. In this case, the driver elements 8*a* and 8*b* protrude from the case 5 toward the other side in the lateral direction. Moreover, the support rubbers 61 are interposed between one of the short side surfaces of the piezoelectric element unit 40 and the first short side wall portion 52 of the case 5 and between the other short side surface of the piezoelectric element unit 40 and the second short side wall portion 53 of the case 5, respectively. Both the short side surfaces of the piezoelectric element unit 40 each correspond to an antinode of a longitudinal vibration. However, as the support rubbers 61 are formed of an elastic material, the support rubbers 61 can support the piezoelectric element unit 40 without damping the longitudinal vibration of the piezoelectric element unit 40. The support rubbers 61 abut not only on the actuator body 4 and the first and second short side wall portions 52 and 53, but also on an inner surface of the principal wall portion 51. Moreover, the biasing rubber 62 is interposed between the one long side surface of the piezoelectric element unit 40 and the long side wall portion 54 of the case 5. The biasing rubber 62 abuts not only on the actuator body 4 and the long side wall portion 54, but also on the inner surface of the principal wall portion 51.

Electrodes 51*a* are provided at portions of the inner surface of the principal wall portion 51 on which the support rubbers 61 and the biasing rubber 62 abut (only an electrode abutting on the biasing rubber 62 is shown). These electrodes are conductively coupled to respective terminal electrodes (not shown) provided on an outer surface of the principal wall portion 51.

Each support rubber 61 is formed of conductive rubber obtained by mixing metal particles into silicone rubber and has substantially a rectangular parallelepiped shape. The support rubbers 61 elastically support the actuator body 4 while biasing the actuator body 4 in the longitudinal direction. Also, the support rubbers 61 conductively couple the external electrodes 46 and 47 of the piezoelectric element unit 40 to electrodes which are provided at portions of the inner surface of the principal wall portion 51 corresponding to positions where the support rubbers 61 are located, and are conductively coupled to the terminal electrodes.

The biasing rubber 62 is also formed of conductive rubber obtained by mixing metal particles into silicone rubber and has substantially a rectangular parallelepiped shape as with the support rubbers 61. The biasing rubber 62 is used to bias the actuator body 4 in the lateral direction thereof (i.e., the lateral direction corresponds to a biasing direction). The biasing rubber 62 also conductively couples the external electrode 45 of the piezoelectric element unit 40 to the electrodes 51*a* on the inner surface of the principal wall portion 51.

Note that an elastic member, such as a leaf spring or the like, may be used instead of each of the support rubbers 61 and the biasing rubber 62.

Specifically, power can be supplied to the piezoelectric element unit 40 by supplying power to the terminal electrodes provided on the outer surface of the case 5.

As shown in FIG. 2, the ultrasonic actuator 2 thus configured is provided so that the driver elements 8*a* and 8*b* abut on the back surface of the stage 11, while the case 5 is fixed to the base (not shown). Specifically, the ultrasonic actuator 2 is arranged so that the lateral direction of the piezoelectric element unit 40 is perpendicular to the back surface of the stage 11, and the longitudinal direction of the piezoelectric element unit 40 is parallel to the back surface of the stage 11 and the guides 12. In other words, the ultrasonic actuator 2 is arranged so that the direction of the bending vibration of the piezoelectric element unit 40 is perpendicular to the back surface of the stage 11, and the direction of the longitudinal vibration of the piezoelectric element unit 40 faces in a direction parallel to the guides 12.

In this case, the biasing rubber 62 is compressed and deformed, and the elastic force of the biasing rubber 62 biases the driver elements 8*a* and 8*b* toward the stage 11. The biasing force of the ultrasonic actuator 2 toward the stage 11 is determined by the elastic force of the biasing rubber 62.

The controller, when receiving an operation command from the outside, applies alternating currents having a frequency corresponding to the operation command and having a phase difference corresponding to the operation command, to the external electrodes 46 and 47.

As described above, the controller induces a longitudinal vibration and a bending vibration in the actuator body 4, i.e., the piezoelectric element unit 40 in a coordinated manner, to cause the driver elements 8*a* and 8*b* to perform an orbital motion as shown in FIG. 8, thereby moving the stage 11. Specifically, in order to prevent extraordinary heat generation of the piezoelectric element unit 40, alternating currents having a frequency slightly higher than a common resonance frequency of the longitudinal vibration and the bending vibration of the piezoelectric element unit 40, are applied to the external electrodes 46 and 47. In this case, these alternating currents applied to the external electrode 46 and 47 have phases shifted by 90° from each other.

When the piezoelectric element unit 40 performs a composite vibration of a longitudinal vibration and a bending vibration, the driver elements 8a and 8b perform substantially an elliptical motion in a plane including the longitudinal direction and the lateral direction of the piezoelectric element unit 40. As a result, the driver elements 8a and 8b apply a driving force to the stage 11 in the longitudinal direction of the piezoelectric element unit 40 by means of a friction force between the driver elements 8a and 8b and the stage 11, while periodically increasing and decreasing the friction force, whereby the stage 11 is moved along the guides 12. The longitudinal direction (equal to the direction in which the guides 12 extend) of the piezoelectric element unit 40 corresponds to a direction along a driving direction in which the driver elements 8a and 8b output the driving force.

Figure 9:
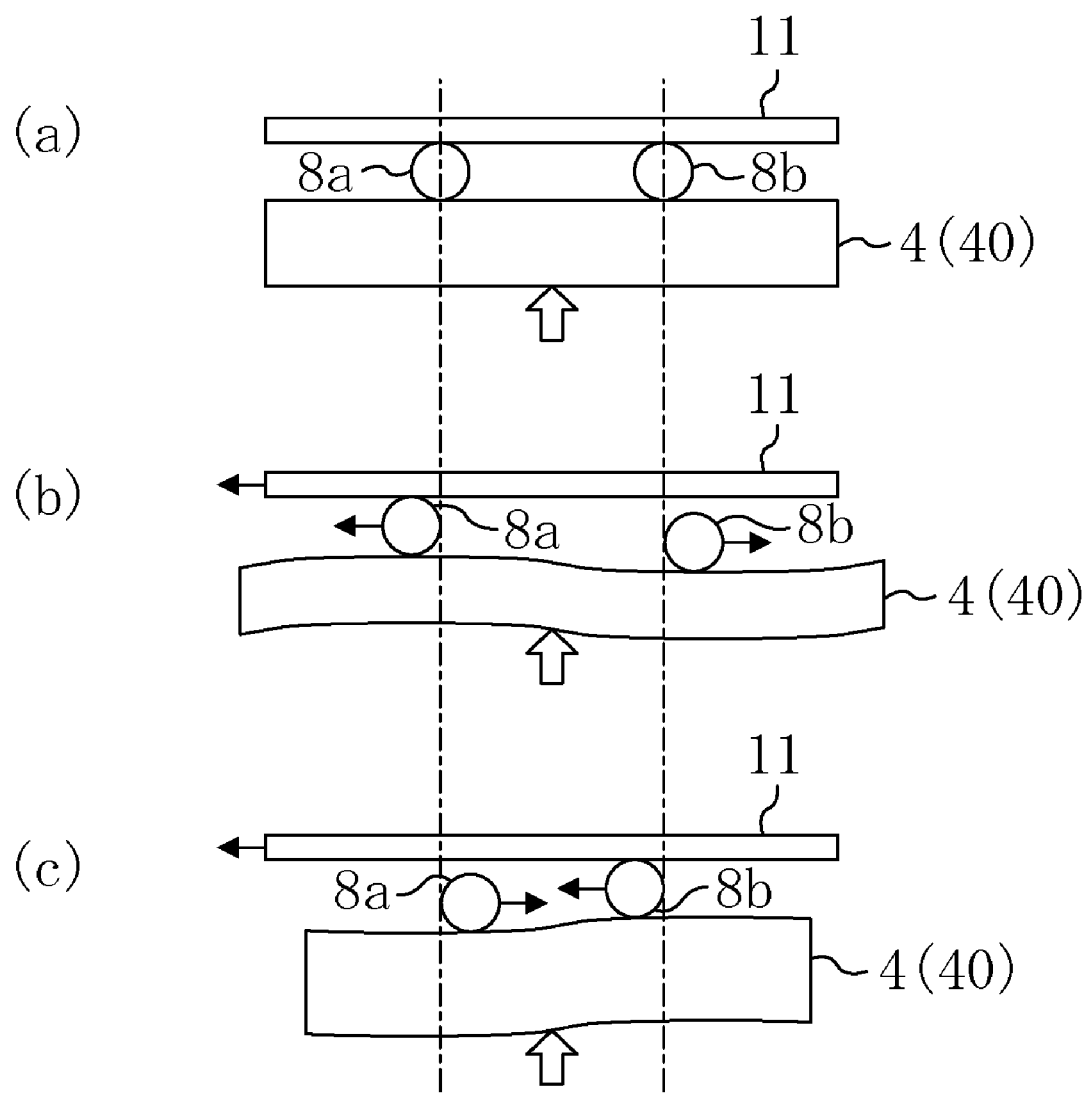
FIG. 9 is a conceptual diagram for describing driving of a stage by the ultrasonic actuator, where (a) indicates a state before the driving, (b) indicates a state in which the stage is driven by one of driver elements when the actuator body expands in a longitudinal direction, and (c) indicates a state in which the stage is driven by the other driver element when the actuator body contracts in the longitudinal direction.

The driving of the stage 11 by the ultrasonic actuator 2 will be described hereinafter in greater detail with reference to FIG. 9. When the piezoelectric element unit 40 expands in the longitudinal direction (the vibration direction of the longitudinal vibration), the first driver element 8a (e.g., the left side of FIG. 9) is displaced in a region closer to the stage 11 in the lateral direction (the vibration direction of the bending vibration), and therefore, the friction force between the driver element 8a and the stage 11 increases and therefore moves the stage 11 in the longitudinal direction in which the first driver element 8a is displaced (leftward in FIG. 9), as shown in FIG. 9(*b*). In this case, the second driver element 8b (the right side of FIG. 9) is displaced in the longitudinal direction which is opposite to the direction in which the first driver element 8a is displaced. However, since the second driver element 8b is displaced in a region less closer to the stage 11 in the lateral direction (where the second driver 8b moves away from the stage 11), the second driver element 8b moves away from the stage 11, and therefore, no friction force occurs therebetween. As a result, the second driver element 8b substantially does not affect the movement of the stage 11.

On the other hand, when the piezoelectric element unit 40 contracts in the longitudinal direction, the second driver element 8b is displaced in a region closer to the stage 11 in the lateral direction, and therefore, the friction force between the second driver element 8b and the stage 11 increases and therefore moves the stage 11 in the longitudinal direction in which the second driver element 8b is displaced (leftward in FIG. 9), as shown in FIG. 9(*c*). This moving direction is the same as that of the stage 11 which is moved by the first driver element 8a when the piezoelectric element unit 40 expands as described above. In this case, although the first driver element 8a is displaced in the longitudinal direction which is opposite to that in which the second driver element 8b is displaced, the first driver element 8a is displaced in a region less closer to the stage 11 in the lateral direction away from the stage 11, and therefore, no friction force occurs therebetween. As a result, the first driver element 8a substantially does not affect the movement of the stage 11.

Although the driver element 8b (8a) which does not affect the movement of the stage 11 is located apart from the stage 11 in FIG. 9, this is not necessarily so. Specifically, the driver element 8b (8a) may abut on the stage 11 with a friction force which is not enough to move the stage 11.

Thus, the first driver elements 8a and the second driver elements 8b alternately move the stage 11 in a predetermined direction with their phases being shifted by 180°. Note that, by applying alternating currents having phases shifted by −90° to the respective external electrodes 46 and 47, the first driver elements 8a and the second driver elements 8b can be caused to output a driving force in a reverse direction, whereby the stage 11 can be moved in a direction opposite to the aforementioned predetermined direction.

Note that the distance, speed and acceleration of movement of the stage 11 can be adjusted by adjusting at least one of the voltage value, frequency and power supply time of the alternating currents supplied to the external electrode 46 and 47, or changing the phase difference between the alternating currents supplied to the external electrode 46 and 47, or the like.

As described above, the ultrasonic actuator 2 drives the stage 11 by causing the driver elements 8a and 8b to perform an orbital motion in a plane including the vibration direction (longitudinal direction) of a longitudinal vibration and the vibration direction (lateral direction) of a bending vibration, while periodically increasing and decreasing the friction forces between the driver elements 8a and 8b and the stage 11. Thus, the stage 11 is driven by means of the friction force between the driver elements 8a and 8b and the stage 11. Therefore, when the ultrasonic actuator 2 continues to be used, the driver elements 8a and 8b and the stage 11 gradually wear. As a result, grooves are formed in portions of the stage 11 on which the driver elements 8a and 8b abut, along tracks of the driver elements 8a and 8b, i.e., along the longitudinal direction of the actuator body 4.

Here, in this embodiment, as described above, the first driver elements 8a and the second driver elements 8b are offset in the thickness direction perpendicular to the direction in which the grooves are formed (the longitudinal direction of the actuator body 4) in the mounting surface 40a. Therefore, the grooves formed on the stage 11 by the first driver elements 8a and the grooves formed on the stage 11 by the second driver elements 8b are offset in the thickness direction, i.e., a total of six grooves corresponding to the number of the driver elements 8a and 8b are formed. In other words, the grooves formed on the stage 11 by the first driver elements 8a and the grooves formed on the stage 11 by the second driver elements 8b do not merge, and therefore, it is possible to prevent a groove from being scraped by both the first and second driver elements 8a and 8b. As a result, there is not a portion which has a depth significantly different from that of another portion in a single groove, and therefore, it is possible to prevent the friction force between the driver element 8a (8b) and the stage 11 from significantly varying. In addition, there is not a portion at which the depth suddenly changes, and therefore, it is possible to prevent the friction force between the driver element 8a (8b) and the stage 11 from suddenly changing.

Therefore, according to Embodiment 1, the first driver elements 8a and the second driver elements 8b, which are arranged on the mounting surface 40a of the actuator body 4 at different positions in the longitudinal direction, are arranged at different positions in the thickness direction of the actuator body 4, i.e., are offset in the thickness direction. Therefore, the grooves formed on the stage 11 by the first driver elements 8a and the grooves formed on the stage 11 by the second driver elements 8b can be prevented from merging. As a result, it is possible to prevent formation of a single groove which is scraped by both the first driver element 8a and the second driver element 8b and in which there are portions having significantly different depths or a portion at which the depth suddenly changes, whereby the friction force between the first and second driver elements 8a and 8b and the stage 11 can be stabilized and therefore the stage 11 can be stably driven.

Moreover, because an offset between each first driver element 8a and each second driver element 8b in the thickness direction is larger than the width of a groove (i.e., a groove width which is assumed to allow the stage 11 or the driver elements 8a and 8b to continue to be used without replacement). As a result, the grooves formed on the stage 11 by the first driver elements 8a and the grooves formed on the stage 11 by the second driver elements 8b can be reliably prevented from merging.

The first driver elements 8a and the second driver elements 8b are alternately arranged in the perpendicular direction so that the middle position t in the perpendicular direction between an N-th (N=1, 2, ..., n) first driver element 8a and an N-th second driver element 8b which are numbered from one end in the perpendicular direction satisfies Expression (1). As a result, although the first driver elements 8a and the second driver elements 8b are offset in the thickness direction, the driver elements 8a and 8b can be uniformly arranged in the thickness direction, whereby the driving force based on the vibration of the actuator body 4 can be uniformly transmitted from the driver elements 8a and 8b to the stage 11.

Moreover, in recent years, the downsizing of electronic apparatuses requires a still smaller ultrasonic actuator 2. When the ultrasonic actuator 2 has a smaller size, the efficient is likely to decrease. In other words, the shapes of the driver elements 8a and 8b relatively increase, and therefore, if the driver elements 8a and 8b are provided at the respective antinodes of the bending vibration of the actuator body 4 as described above, the driver elements 8a and 8b are likely to damp the bending vibration of the actuator body 4, resulting in a reduction in efficiency.

In contrast to this, in this embodiment, the driver elements 8a and 8b are arranged in the respective straight lines L extending in the thickness direction while being located at the respective positions (positions of the driver element groups 8A and 8B) in the longitudinal direction of the actuator body 4. As a result, although the driver elements 8a and 8b are provided on the long side surface which undulates due to the bending vibration of the actuator body 4, it is possible to reduce the damping of the bending vibration of the actuator body 4 by the driver elements 8a and 8b. Moreover, the driver elements 8a and 8b are in the shape of a sphere, and therefore, an area where each of the driver elements 8a and 8b contacts the mounting surface 40a of the actuator body 4 can be reduced, whereby the damping of the bending vibration of the actuator body 4 by the driver elements 8a and 8b can be further reduced. As a result, the efficiency of the ultrasonic actuator 2 can be improved. Here, the term "spherical shape" is not limited to exactly a spherical shape, and encompasses substantially a spherical shape which allows the driver element 8a (8b) to have substantially a point contact with the piezoelectric element unit 40.

Moreover, the spherical driver element 8a (8b) can be easily produced as compared to a cylindrical driver element 208a (208b) described below, whereby the cost of the driver element 8a (8b) can be reduced.

<<Embodiment 2 of the Invention>>

Next, an ultrasonic actuator 202 according to Embodiment 2 of the present invention will be described.

The ultrasonic actuator 202 of Embodiment 2 is different from that of Embodiment 1 in that driver elements 208a (208b) having a cylindrical shape are used instead of the driver elements 8a (8b) having a spherical shape.

Figure 10:
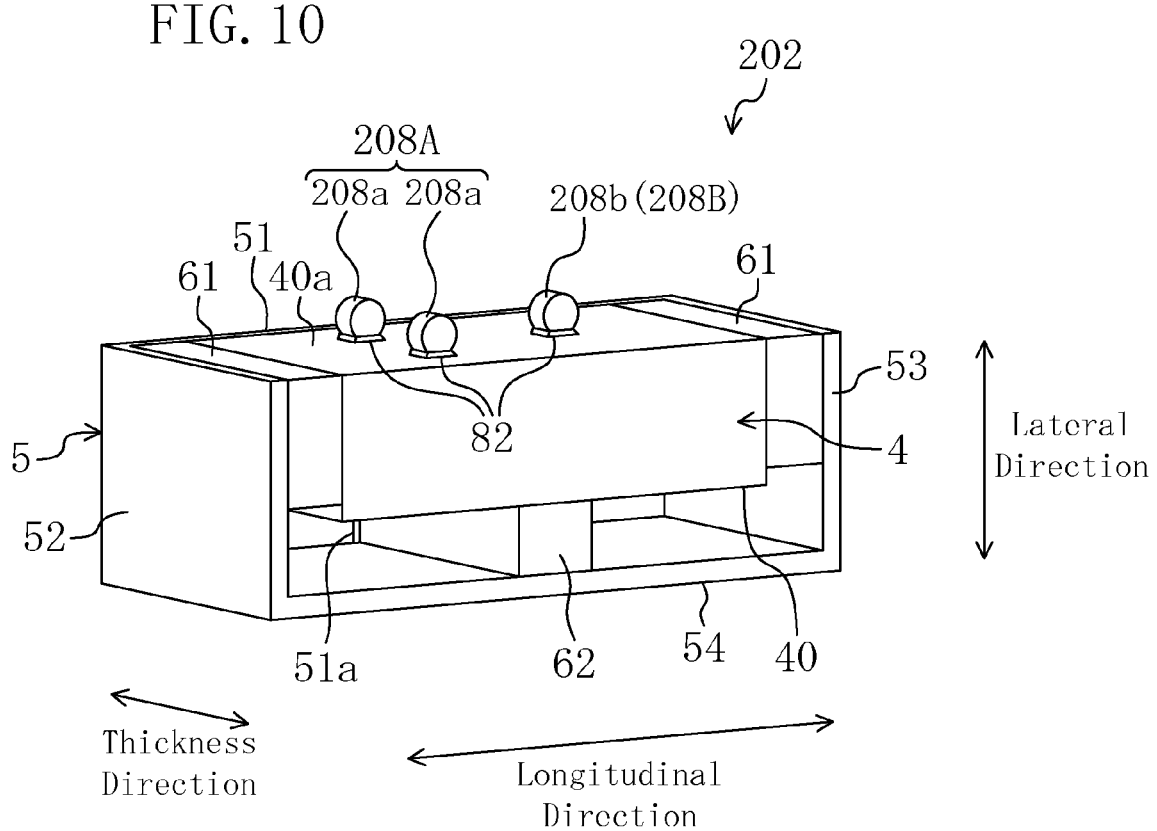
FIG. 10 is a perspective view of an ultrasonic actuator according to Embodiment 2.

Specifically, in the ultrasonic actuator 202, as shown in FIG. 10, first and second driver element groups 208A and 208B are provided on a mounting surface 40a of a piezoelectric element unit 40 at two respective antinodes of a bending vibration in the second-order mode. The first driver element group 208A includes two driver elements 208a, while the second driver element group 208B includes a single driver element 208b. The driver elements 208a and 208b have the same cylindrical shape.

Each driver element 208a (208b) is fixed to the piezoelectric element unit 40 using an adhesive 82 similar to that of Embodiment 1. Thus, each driver element 208a (208b) is attached by a line contact to the mounting surface 40a of the piezoelectric element unit 40. Here, the term "line contact" is not limited to a state in which the driver element 208a (208b) exactly contacts the mounting surface 40a, and also means a state in which the driver element 208a (208b) and the mounting surface 40a have substantially a line contact with each other with the adhesive 82 being interposed between the driver elements 208a (208b) and the mounting surface 40a. Also, the term "cylindrical shape" is not limited to exactly a cylindrical shape, and encompasses substantially a cylindrical shape which allows the driver element 208a (208b) to have substantially a line contact with the piezoelectric element unit 40.

Figure 11:
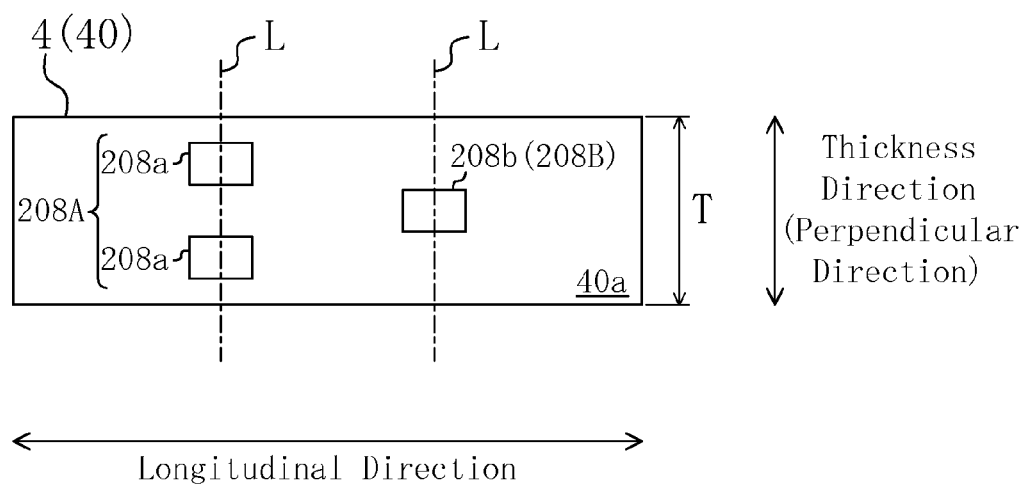
FIG. 11 is a plan view of an actuator body showing an arrangement of driver elements according to Embodiment 2.

In the first driver element group 208A, as shown in FIG. 11, the first driver elements 208a are aligned in a perpendicular direction of the piezoelectric element unit 40. Specifically, the first driver elements 208a are arranged in a straight line L extending in the perpendicular direction. In this case, the first driver elements 208a are provided with the axis of the cylinder extending in the perpendicular direction. In other words, the two first driver elements 208a are arranged so that the axes of the cylinders are arranged in a straight line and are parallel to the straight line L. In other words, the first driver elements 208a are arranged so that the axes of the cylinders are perpendicular to a plane in which the first driver elements 208a perform an orbital motion.

Also, the second driver element 208b is provided with the axis of the cylinder extending in the perpendicular direction.

Note that the first driver elements 208a of the first driver element group 208A and the second driver element 208b of the second driver element group 208B are offset from each other in the perpendicular direction, i.e., are located at different positions in the perpendicular direction. Specifically, the first driver elements 208a and the second driver element 208b are alternately located only in terms of positions in the perpendicular direction, i.e., in order of one first driver element 208a, the second driver element 208b, the other first driver element 208a, although the first driver elements 208a and the second driver element 208b are located at different positions in the longitudinal direction.

Moreover, an offset in the perpendicular direction between each first driver element 208a and the second driver element 208b is larger than a length in the perpendicular direction of an abutment area where each of the first and second driver elements 208a and 208b abuts on the stage 11, i.e., a length of the cylinder of the driver element. In other words, the first driver elements 208a and the second driver element 208b do not overlap as viewed from one side to the other side in the longitudinal direction of the actuator body 4.

Moreover, an offset in the perpendicular direction between the first first-driver element 208a and the second driver element 208b and an offset in the perpendicular direction between the second first-driver element 208a and the second driver element 208b are equal to each other (the first driver elements 208 are numbered from one end in the perpendicular direction).

Therefore, according to Embodiment 2, the first driver elements 208a and the second driver element 208b are arranged on the mounting surface 40a of the actuator body 4 at different positions in the longitudinal direction, and are also arranged at different positions in the thickness direction of the actuator body 4, i.e., are offset in the thickness direction. Therefore, grooves formed on the stage 11 by the first driver elements 208a and a groove formed on the stage 11 by the second driver element 8b can be prevented from merging. As a result, it is possible to prevent formation of a single groove in which there are portions having significantly different depths or a portion at which the depth suddenly changes, whereby friction forces between the first and second driver elements 208a and 208b and the stage 11 can be stabilized and therefore the stage 11 can be stably driven.

Moreover, the offset in the thickness direction between each of the first driver elements 208a and the second driver element 208b is larger than the length in the thickness direction of each of the first and second driver elements 208a and 208b, i.e., the length of the cylinder. As a result, the grooves formed on the stage 11 by the first driver elements 208a and the groove formed on the stage 11 by the second driver element 208b can be prevented from overlapping in the thickness direction.

Moreover, the driver elements 208a (208b) are in the shape of a cylinder, and therefore, an area where each driver element 208a (208b) contacts the mounting surface 40a can be reduced, whereby the damping of the bending vibration of the actuator body 4 by the driver elements 208a (208b) can be reduced. In addition, each driver element 208a (208b) is arranged and attached to the mounting surface 40a so that the axis of the cylinder extends in a direction perpendicular to the vibration direction of the bending vibration and the vibration direction of the longitudinal vibration of the actuator body 4, i.e., in a direction perpendicular to a plane in which the actuator body 4 performs the bending vibration, whereby the damping of the bending vibration of the actuator body 4 by the driver element 208a (208b) can be further reduced.

In addition, Embodiment 2 provides functions and advantages similar to those of Embodiment 1.

<<Embodiment 3 of the Invention>>

A drive device 1 according to Embodiment 3 of the present invention has a configuration basically similar to that of the drive device 1 of Embodiment 1. Specifically, as shown in FIG. 2, the drive device 1 of Embodiment 3 includes a stage 11, an ultrasonic actuator 302, and a controller (not shown) which controls the ultrasonic actuator 302.

The stage 11 is slidably attached to guides 12 which are arranged in parallel with each other and are fixed to a base (not shown) which is a stationary body. In other words, the stage 11 is configured to be movable in a direction in which the guides 12 extend. The stage 11 constitutes a movable body. The direction in which the guides 12 extend is a direction in which the stage 11 can be moved. The stage 11 is a plate-like member having substantially a rectangular shape as viewed from the top and is formed of alumina. Note that the material for the stage 11 is not limited to alumina and may be any material. The ultrasonic actuator 302 is provided on a back surface (a side on which the guides 12 are provided) so that driver elements 308a and 308b described later abut on the stage 11.

Figure 12:
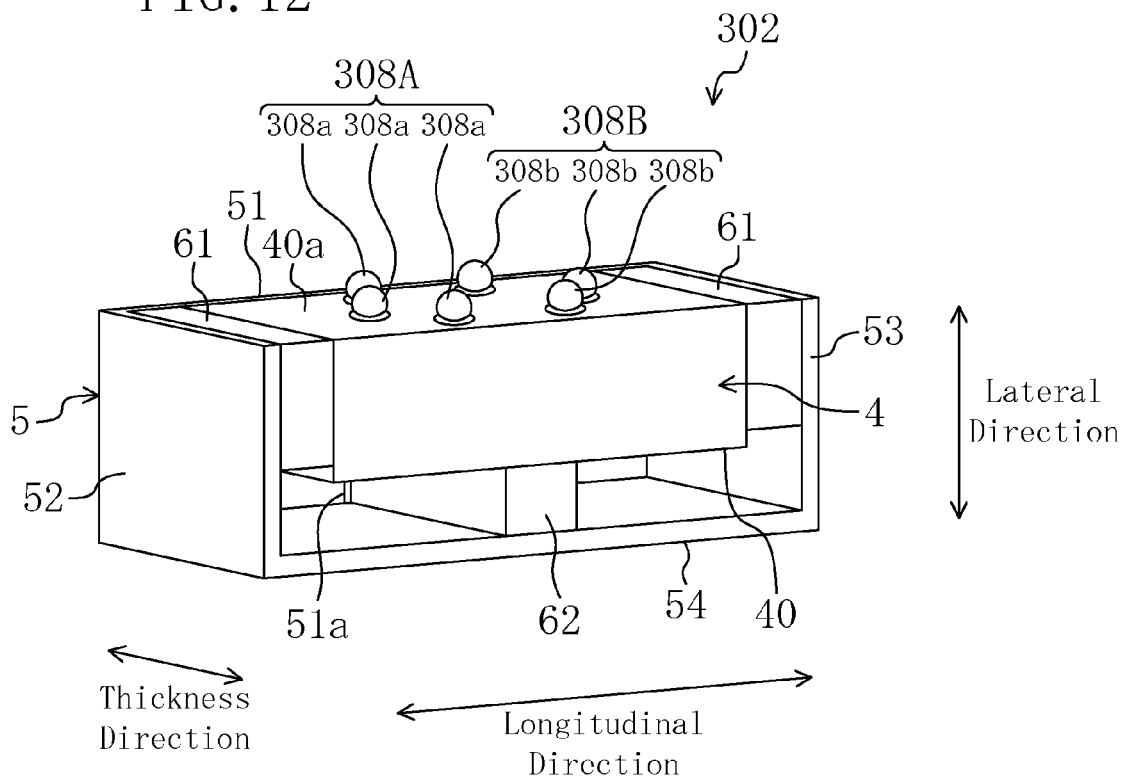
FIG. 12 is a perspective view of an ultrasonic actuator according to Embodiment 3.

As shown in FIG. 12, the ultrasonic actuator 302 includes an actuator body 4 which generates vibrations, the driver elements 308a and 308b which transfer a driving force of the actuator body 4 to the stage 11, a case 5 which accommodates the actuator body 4, support rubbers 61 which are interposed between the actuator body 4 and the case 5 and elastically support the actuator body 4, and a biasing rubber 62 which biases the stage 11 toward the actuator body 4. The ultrasonic actuator 302 constitutes a vibratory actuator (the same applies to each embodiment described below).

The actuator body 4 is formed of a piezoelectric element unit 40.

The piezoelectric element unit 40 has substantially a rectangular parallelepiped shape having a pair of substantially rectangular principal surfaces facing each other, a pair of long side surfaces facing each other, perpendicular to the principal surface and extending in a longitudinal direction of the principal surface, and a pair of short side surfaces facing each other, perpendicular to both the principal surface and the long side surface, and extending in a lateral direction of the principal surface.

As shown in FIG. 3, the piezoelectric element unit 40 includes five piezoelectric layers (piezoelectric elements) 41 and four internal electrode layers 42, 44, 43 and 44, which are alternately stacked. The internal electrode layers 42, 44, 43 and 44 are a first power supply electrode layer 42, a common electrode layer 44, a second power supply electrode layer 43, and another common electrode layer 44, with the piezoelectric layer 41 being interposed between any two of the internal electrode layers that are adjacent in the stacking direction. The first power supply electrode layer 42, the second power supply electrode layer 43 and the common electrode layers 44 are printed on the principal surfaces of the respective corresponding piezoelectric layers 41.

The piezoelectric layers 41 are each an insulating layer formed of a ceramic material, such as lead zirconate titanate or the like, which has substantially a rectangular parallelepiped shape including a pair of principal surfaces, a pair of long side surfaces and a pair of short side surfaces as with the piezoelectric element unit 40. Moreover, in each piezoelectric layer 41, an external electrode 45a is formed at a middle portion in the longitudinal direction of one of the long side surfaces, an external electrode 46a is formed at a middle portion in the lateral direction of one of the short side surfaces, and an external electrode 47a is formed at a middle portion in the lateral direction of the other short side surface.

The common electrode layers 44 are provided over substantially the entire principal surfaces of the respective corresponding piezoelectric layers 41 and have substantially a rectangular shape. Moreover, a lead electrode 44a is formed at one of long side portions of each common electrode layer 44, extending from a middle portion in the longitudinal direction of the common electrode layer 44 to the external electrode 45a of the corresponding piezoelectric layer 41.

Suppose that the principal surface of each piezoelectric layer 41 is divided into two in the longitudinal direction and in the lateral direction, i.e., four areas. As shown in FIG. 4, the first power supply electrode layer 42 has a pair of first electrodes 42a and 42b formed in one of two pairs of diagonally opposite areas of the principal surface, respectively, and a conductive electrode 42c conductively coupling the first electrodes 42a and 42b. Each first electrode 42a (42b) has substantially a rectangular shape, which overlaps the common electrode layer 44 as viewed in the stacking direction. In other words, each first electrode 42a (42b) faces the common electrode layer 44 with the corresponding piezoelectric layer 41 being interposed therebetween. Moreover, one (first electrode 42a) of the first electrodes 42a and 42b is provided with a lead electrode 42d extending to the external electrode 46a of the corresponding piezoelectric layer 41.

The second power supply electrode layer 43 has a pair of second electrodes 43a and 43b formed in the other of the two pairs of diagonally opposite areas of the principal surface of the corresponding piezoelectric layer 41, respectively, and a conductive electrode 43c conductively coupling the second electrodes 43a and 43b. The second electrode 43a is located in one of the other pair of areas which is adjacent to the first electrode 42a in the lateral direction and the first electrode 42b in the longitudinal direction as viewed in the stacking direction. The second electrode 43b is located in the other area which is adjacent to the first electrode 42a in the longitudinal direction and the first electrode 42b in the lateral direction as viewed in the stacking direction. Each second electrode 43a (43b) has substantially a rectangular shape, which overlaps the common electrode layer 44 as viewed in the stacking direction. In other words, each second electrode 43a (43b) faces the common electrode layer 44 with the corresponding piezoelectric layer 41 being interposed therebetween. Moreover, one (second electrode 43b) of the second electrodes 43a and 43b is provided with a lead electrode 43d extending to the external electrode 47a of the corresponding piezoelectric layer 41.

In the piezoelectric element unit 40 which is configured by alternately stacking the piezoelectric layers 41 and the internal electrode layers 42, 44, 43 and 44, the external electrodes 45a of the piezoelectric layers 41 align in the stacking direction at the middle portions in the longitudinal direction of the one long side surface of the piezoelectric element unit 40, thereby forming an integrated external electrode 45. The lead electrodes 44a formed in the common electrode layers 44 are electrically connected to the external electrode 45. Likewise, the external electrodes 46a of the piezoelectric layers 41 align in the stacking direction at the middle portions in the lateral direction of the one short side surface of the piezoelectric element unit 40, thereby forming an integrated external electrode 46. The lead electrode 42d of the first power supply electrode layer 42 is electrically connected to the external electrode 46. Moreover, the external electrodes 47a of the piezoelectric layers 41 align in the stacking direction at the middle portions in the lateral direction of the other short side surface of the piezoelectric element unit 40, thereby forming an integrated external electrode 47. The lead electrode 43d of the second power supply electrode layer 43 is electrically connected to the external electrode 47.

Figure 13:
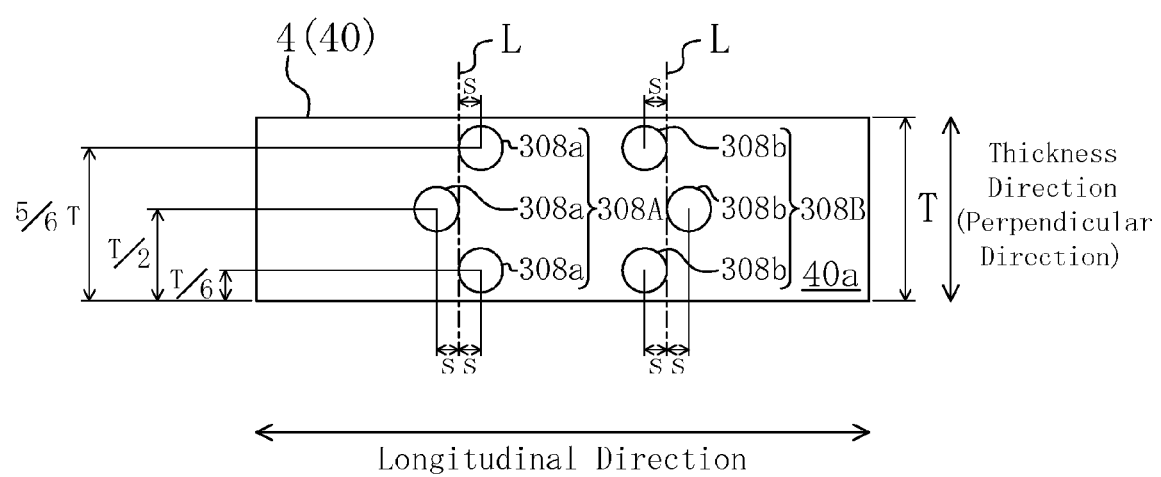
FIG. 13 is a plan view of an actuator body showing an arrangement of driver elements according to Embodiment 3.

On the other long side surface 40a of the piezoelectric element unit 40 at which the external electrode 45a is not provided (i.e., one of a pair of surfaces facing in a vibration direction of a bending vibration described later, also referred to hereinafter as a mounting surface), six driver elements 308a and 308b are provided as shown in FIGS. 12 and 13.

The driver elements 308a and 308b have a spherical shape and are formed of zirconia, alumina, silicon nitride, silicon carbide, tungsten carbide or the like. Moreover, the driver elements 308a and 308b are attached by a point contact to the mounting surface 40a of the piezoelectric element unit 40 via an adhesive 82 (see FIG. 4). Here, the term "point contact" is not limited to a state in which the driver elements 308a and 308b exactly contact the mounting surface 40a, and also means a state in which the driver elements 308a and 308b and the mounting surface 40a have substantially a point contact with each other with the adhesive 82 being interposed between the driver elements 308a and 308b and the mounting surface 40a.

It is desirable that the adhesive 82 be made of a material which is softer than materials for the piezoelectric element unit 40 and the driver elements 308a and 308b. Specifically, examples of the material for the adhesive 82 include synthetic resins, such as, particularly, epoxy resins and silicone resins. The use of such a material allows the driver elements 308a and 308b to be fixed to the mounting surface 40a while avoiding the damping of vibrations described later of the piezoelectric element unit 40 to the extent possible.

Moreover, the driver elements 308a and 308b are located on the mounting surface 40a at a distance corresponding to 30 to 35% of the full length of the mounting surface 40a from both end portions in the longitudinal direction of the piezoelectric element unit 40. In other words, the positions correspond to respective antinodes of the second-order mode of a bending vibration described later of the piezoelectric element unit 40, where the vibration is maximum. The driver elements 308a and 308b are divided into a first driver element group 308A including the first driver elements 308a located at one in the longitudinal direction of the two positions corresponding to the respective antinodes of the second-order mode of a bending vibration, and a second driver element group 308B including the second driver elements 308b located at the other position in the longitudinal direction.

As shown in FIG. 13, in each driver element group 308A, the driver elements 308a are arranged in a thickness direction (also referred to hereinafter as a perpendicular direction) of the piezoelectric element unit 40. The perpendicular direction is also the stacking direction of the piezoelectric element unit 40, a direction perpendicular to a plane in which the first driver elements 308a perform an orbital motion described later, and a direction perpendicular to both a vibration direction of a bending vibration and a vibration direction of a longitudinal vibration described later of the piezoelectric element unit 40. Thus, not all the first driver elements 308a arranged in the perpendicular direction are located at the same position in the longitudinal direction and are located at different positions in the longitudinal direction, i.e., are offset in the longitudinal direction. Specifically, the first and third first-driver elements 308a which are numbered from one end in the perpendicular direction are located at positions farther inside in the longitudinal direction than a straight line L extending in the perpendicular direction and at a predetermined distance of s from the straight line L. The second first-driver element 308a from the one end in the perpendicular direction is located at a position farther outside in the longitudinal direction than the straight line L extending in the perpendicular direction and at the predetermined distance of s from the straight line L. The straight line L indicates an antinode of the bending vibration. In other words, the first and third first-driver elements 308a and the second first-driver element 308a are offset in opposite longitudinal directions from the antinode of the bending vibration by the same offset amount of s.

Moreover, the first driver elements 308a are arranged at positions axisymmetric with respect to a straight line which passes through a center portion in the perpendicular direction of the mounting surface 40a and is perpendicular to the perpendicular direction (i.e., extends in the longitudinal direction). Moreover, the first driver elements 308a are equally spaced in the perpendicular direction, and more specifically, are located at positions t which satisfy the following:

$$t = \{(2N-1)/(2n)\} \times T \quad (1)$$

where t: a position in the perpendicular direction on the mounting surface 40a with reference to the one end in the perpendicular direction n: the total number of driver elements arranged in the perpendicular direction (three in this embodiment)

T: a dimension in the perpendicular direction of the mounting surface 40a (a thickness of the actuator body 4)

Specifically, in this embodiment, a first driver element 308a which is located closest to the one end in the perpendicular direction (the lower side of FIG. 13) is located at a distance of T/6 from an edge of the one end in the perpendicular direction of the mounting surface 40a. A first driver element 308a which is located second closest to the one end in the perpendicular direction is located at a middle in the perpendicular direction of the mounting surface 40a. A first driver element 308a which is located third closet to the one end in the perpendicular direction (located at the upper side of FIG. 13) is located at a distance of 5 T/6 from the edge of the one end in the perpendicular direction of the mounting surface 40a. In other words, an offset in the perpendicular direction between the position of the first first-driver element 308a and the position of the second first-driver element 308a and an offset in the perpendicular direction between the position of the second first-driver element 308a and the position of the third first-driver element 308a are each T/3.

On the other hand, also in the second driver element group 308B, the second driver elements 308b are arranged in the perpendicular direction of the piezoelectric element unit 40 and are also offset in the longitudinal direction as in the first driver element group 308A. More specifically, the first and third second-driver elements 308b which are numbered from the one end in the perpendicular direction are located at positions farther inside in the longitudinal direction than a straight line L extending in the perpendicular direction and at the predetermined distance of s from the straight line L. The second second-driver element 308b from the one end in the perpendicular direction is located at a position farther outside in the longitudinal direction than the straight line L extending in the perpendicular direction and at the predetermined distance of s from the straight line L. Also in the second driver element group 308B, the straight line L indicates an antinode of the bending vibration.

Moreover, the second driver elements 308b are located at positions in the perpendicular direction which satisfy Expression (1) as with the first driver element group 308A.

Thus, the first driver elements 308a and the second driver elements 308b are arranged at positions axisymmetric in the longitudinal direction with respect to a center portion in the longitudinal direction of the mounting surface 40a, i.e., axisymmetric with respect to a straight line which passes through the center portion in the longitudinal direction of the mounting surface 40a and extends in the perpendicular direction.

In the actuator body 4 thus configured, when the external electrode 45 is grounded, and a first alternating current having a predetermined frequency is applied to the external electrode 46 while a second alternating current having a phase shifted by 90° from the first alternating current is applied to the external electrode 47, the alternating currents having the phases shifted by 90° from each other are applied to a pair of the diagonally opposite first electrodes 42a and 42b and another pair of the diagonally opposite second electrodes 43a and 43b provided on the principal surface of the piezoelectric layer 41. As a result, a longitudinal vibration (so-called an expanding/contracting vibration) and a bending vibration (so-called a lateral vibration) are induced in the longitudinal direction and in the lateral direction, respectively.

The resonance frequency of the longitudinal vibration and the resonance frequency of the bending vibration are each determined based on a material, a shape and the like of the actuator body 4, i.e., the piezoelectric element unit 40. Moreover, both the resonance frequencies are affected by a force supporting the actuator body 4 and a portion supporting the actuator body 4. In view of these facts, both the resonance frequencies are caused to be substantially equal to each other, and alternating currents having a frequency in the vicinity thereof and having phases shifted by 90° from each other are applied to the respective external electrodes 46 and 47. For example, the shape and the like of the piezoelectric element unit 40 are designed so that the resonance frequency in the first-order mode (see FIG. 6) of the longitudinal vibration and the resonance frequency in the second-order mode (see FIG. 7) of the bending vibration are equal to each other, and moreover, alternating currents in the vicinity of the resonance frequency and having phases shifted by 90° from each other are applied as described above, whereby the first-order mode of the longitudinal vibration and the second-order mode of the bending vibration are induced in a coordinated manner in the piezoelectric element unit 40. As a result, changes in shape sequentially occur as shown in FIGS. 8(a), 8(b), 8(c) and 8(d).

As a result, each driver element 308a (308b) provided on the piezoelectric element unit 40 performs substantially an elliptical motion, i.e., an orbital motion in a plane parallel to the principal surface of the piezoelectric element unit 40, i.e., a plane including the longitudinal direction and the lateral direction (a plane parallel to the drawing sheet in FIG. 8).

The case 5 is formed of a resin and is in the shape of substantially a box having substantially a rectangular parallelepiped shape corresponding to the piezoelectric element unit 40. The case 5 has a principal wall portion 51 which is parallel to the principal surface of the piezoelectric element unit 40 and has substantially a rectangular shape, a first short side wall portion 52 which is provided at a short side portion located on one side (the left side of FIG. 12) in the longitudinal direction of the principal wall portion 51, a second short side wall portion 53 which is provided at a short side portion located on the other side (the right side of FIG. 12) in the longitudinal direction of the principal wall portion 51, and a long side wall portion 54 which is provided at a long side portion located on one side (the lower side of FIG. 12) in the lateral direction of the principal wall portion 51. In other words, the case 5 has the following shape. No wall portion is provided at a side facing the principal wall portion 51 and at a long side portion (corresponding to the long side surface of the piezoelectric element unit 40 on which the driver elements 308a and 308b are provided) located on the other side (the upper side of FIG. 12) in the lateral direction of the principal wall portion 51. As a result, the case 5 is open at the one side in the stacking direction (the normal direction of the principal wall portion 51) of the piezoelectric element unit 40 and at the other side in the lateral direction.

The case 5 thus configured accommodates the actuator body 4. The actuator body 4 is accommodated in the case 5 so that one of the principal surfaces of the piezoelectric element unit 40 faces the principal wall portion 51, and one (a long side surface on which the external electrode 45 is provided) of the long side surfaces of the piezoelectric element unit 40 to face the long side wall portion 54. In this case, the driver elements 308a and 308b protrude from the case 5 toward the other side in the lateral direction. Moreover, the support rubbers 61 are interposed between one of the short side surfaces of the piezoelectric element unit 40 and the first short side wall portion 52 of the case 5 and between the other short side surface of the piezoelectric element unit 40 and the second short side wall portion 53 of the case 5, respectively. Both the short side surfaces of the piezoelectric element unit 40 each correspond to an antinode of a longitudinal vibration. However, as the support rubbers 61 are formed of an elastic material, the support rubbers 61 can support the piezoelectric element unit 40 without damping the longitudinal vibration of the piezoelectric element unit 40. The support rubbers 61 abut not only on the actuator body 4 and the first and second short side wall portions 52 and 53, but also on an inner surface of the principal wall portion 51. Moreover, the biasing rubber 62 is interposed between the one long side surface of the piezoelectric element unit 40 and the long side wall portion 54 of the case 5. The biasing rubber 62 abuts not only on the actuator body 4 and the long side wall portion 54, but also on the inner surface of the principal wall portion 51.

Electrodes 51a are provided at portions of the inner surface of the principal wall portion 51 on which the support rubbers 61 and the biasing rubber 62 abut (only an electrode abutting on the biasing rubber 62 is shown). These electrodes are conductively coupled to respective terminal electrodes (not shown) provided on an outer surface of the principal wall portion 51.

Each support rubber 61 is formed of conductive rubber obtained by mixing metal particles into silicone rubber and has substantially a rectangular parallelepiped shape. The support rubbers 61 elastically support the actuator body 4 while biasing the actuator body 4 in the longitudinal direction. Also, the support rubbers 61 conductively couple the external electrodes 46 and 47 of the piezoelectric element unit 40 to electrodes which are provided at portions of the inner surface of the principal wall portion 51 corresponding to positions where the support rubbers 61 are located, and are conductively coupled to the terminal electrodes.

The biasing rubber 62 is also formed of conductive rubber obtained by mixing metal particles into silicone rubber and has substantially a rectangular parallelepiped shape as with the support rubbers 61. The biasing rubber 62 is used to bias the actuator body 4 in the lateral direction thereof (i.e., the lateral direction corresponds to a biasing direction). The biasing rubber 62 also conductively couples the external electrode 45 of the piezoelectric element unit 40 to the electrodes 51a on the inner surface of the principal wall portion 51. The biasing rubber 62 constitutes a biasing member.

Note that an elastic member, such as a leaf spring or the like, may be used instead of each of the support rubbers 61 and the biasing rubber 62.

Specifically, power can be supplied to the piezoelectric element unit 40 by supplying power to the terminal electrodes provided on the outer surface of the case 5.

As shown in FIG. 2, the ultrasonic actuator 302 thus configured is provided so that the driver elements 308a and 308b abut on the back surface of the stage 11, while the case 5 is fixed to the base (not shown). Specifically, the ultrasonic actuator 302 is arranged so that the lateral direction of the piezoelectric element unit 40 is perpendicular to the back surface of the stage 11, and the longitudinal direction of the piezoelectric element unit 40 is parallel to the back surface of the stage 11 and the guides 12. In other words, the ultrasonic actuator 302 is arranged so that the direction of the bending vibration of the piezoelectric element unit 40 is perpendicular to the back surface of the stage 11, and the direction of the longitudinal vibration of the piezoelectric element unit 40 faces in a direction parallel to the guides 12.

In this case, the biasing rubber 62 is compressed and deformed, and the elastic force of the biasing rubber 62 biases the driver elements 308a and 308b toward the stage 11. The biasing force of the ultrasonic actuator 302 toward the stage 11 is determined by the elastic force of the biasing rubber 62.

The controller, when receiving an operation command from the outside, applies alternating currents having a frequency corresponding to the operation command and having a phase difference corresponding to the operation command, to the external electrodes 46 and 47.

As described above, the controller induces a longitudinal vibration and a bending vibration in the actuator body 4, i.e., the piezoelectric element unit 40 in a coordinated manner, to cause the driver elements 308a and 308b to perform an orbital motion as shown in FIG. 8, thereby moving the stage 11. Specifically, in order to prevent extraordinary heat generation of the piezoelectric element unit 40, alternating currents having a frequency slightly higher than a common resonance frequency of the longitudinal vibration and the bending vibration of the piezoelectric element unit 40, are applied to the external electrodes 46 and 47. In this case, these alternating currents applied to the external electrode 46 and 47 have phases shifted by 90° from each other.

When the piezoelectric element unit 40 performs a composite vibration of a longitudinal vibration and a bending vibration, the driver elements 308a and 308b perform substantially an elliptical motion in a plane including the longitudinal direction and the lateral direction of the piezoelectric element unit 40. As a result, the driver elements 308a and 308b apply a driving force to the stage 11 in the longitudinal direction of the piezoelectric element unit 40 by means of a friction force between the driver elements 308a and 308b and the stage 11, while periodically increasing and decreasing the friction force, whereby the stage 11 is moved along the guides 12. The longitudinal direction (equal to the direction in which the guides 12 extend) of the piezoelectric element unit 40 corresponds to a driving direction in which the driver elements 308a and 308b output the driving force.

The driving of the stage 11 by the ultrasonic actuator 302 will be described hereinafter in greater detail with reference to FIG. 9. When the piezoelectric element unit 40 expands in the longitudinal direction (the vibration direction of the longitudinal vibration), the first driver element 308a (e.g., the left side of FIG. 9) is displaced in a region closer to the stage 11 in the lateral direction (the vibration direction of the bending vibration), and therefore, the friction force between the driver element 308a and the stage 11 increases and therefore moves the stage 11 in the longitudinal direction in which the first driver element 308a is displaced (leftward in FIG. 9), as shown in FIG. 9(b). In this case, the second driver element 308b (the right side of FIG. 9) is displaced in the longitudinal direction which is opposite to the direction in which the first driver element 308a is displaced. However, since the second driver element 308b is displaced in a region less closer to the stage 11 in the lateral direction (the second driver element 308b moves away from the stage 11), the second driver element 308b moves away from the stage 11, and therefore, no friction force occurs therebetween. As a result, the second driver element 308b substantially does not affect the movement of the stage 11.

On the other hand, when the piezoelectric element unit 40 contracts in the longitudinal direction, the second driver element 308b (the right side of FIG. 9) is displaced in a region closer to the stage 11 in the lateral direction, and therefore, the friction force between the second driver element 308b and the stage 11 increases and therefore moves the stage 11 in the longitudinal direction in which the second driver element 308b is displaced (leftward in FIG. 9), as shown in FIG. 9(c). This moving direction is the same as that of the stage 11 which is moved by the first driver element 308a when the piezoelectric element unit 40 expands as described above. In this case, although the first driver element 308a is displaced in the longitudinal direction which is opposite to that in which the second driver element 308b is displaced, the first driver element 308a is displaced in a region less closer to the stage 11 in the lateral direction away from the stage 11, and therefore, no friction force occurs therebetween. As a result, the first driver element 308a substantially does not affect the movement of the stage 11.

Although the driver element 308b (308a) which does not affect the movement of the stage 11 is located apart from the stage 11 in FIG. 9, this is not necessarily so. Specifically, the driver element 308b (308a) may abut on the stage 11 with a friction force which is not enough to move the stage 11.

Thus, the first driver elements 308a and the second driver elements 308b alternately move the stage 11 in a predetermined direction with their phases being shifted by 180°. Note that, by applying alternating currents having phases shifted by −90° to the respective external electrodes 46 and 47, the first driver elements 308a and the second driver elements 308b can be caused to output a driving force in a reverse direction, whereby the stage 11 can be moved in a direction opposite to the aforementioned predetermined direction.

Note that the distance, speed and acceleration of movement of the stage 11 can be adjusted by adjusting at least one of the voltage value, frequency and power supply time of the alternating currents supplied to the external electrode 46 and 47, or changing the phase difference between the alternating currents supplied to the external electrode 46 and 47, or the like.

As described above, the ultrasonic actuator 302 drives the stage 11 by causing the driver elements 308a and 308b to perform an orbital motion in a plane including the vibration direction (longitudinal direction) of a longitudinal vibration and the vibration direction (lateral direction) of a bending vibration, while periodically increasing and decreasing the friction forces between the driver elements 308a and 308b and the stage 11. In this case, the friction forces between the driver elements 308a and 308b and the stage 11 are enhanced by the biasing force of the biasing rubber 62.

In this case, as shown in FIG. 9, the biasing rubber 62 applies a biasing force to the actuator body 4 at the middle portion in the longitudinal direction of the one long side surface, while a reaction force is applied to the actuator body 4 from the stage 11 via the driver elements 308a and 308b located on the other long side surface at positions closer to an end portion than to the middle portion in the longitudinal direction. As a result, the biasing force of the biasing rubber 62 and the reaction force from the stage 11 act as a moment which rotates the actuator body 4 in a plane including the vibration direction of the bending vibration and the vibration direction of the longitudinal vibration (i.e., a plane in which the driver elements 308a and 308b perform an orbital motion). For example, in the case of FIG. 9(b), a moment occurs which rotates the actuator body 4 in an anticlockwise direction, and in the case of FIG. 9(c), a moment occurs which rotates the actuator body 4 in a clockwise direction.

Therefore, in this embodiment, as described above, in each driver element group 308A (308B), the driver elements 308a (308b) are arranged in the thickness direction and are also arranged and offset in the longitudinal direction. As a result, in each driver element group 308A (308B), the abutment area between the driver elements 308a (308b) and the stage 11 is expanded in the longitudinal direction. As a result, even if the aforementioned moment acts on the actuator body 4, the driver elements 308a (308b) receives the moment, whereby the attitude of the actuator body 4 can be prevented from changing.

Therefore, according to Embodiment 3, in the driver element group 308A (308B) including the driver elements 308a (308b) arranged in the thickness direction, the driver elements 308a (308b) are offset in the longitudinal direction. As a result, when the driver elements 308a and 308b perform an orbital motion to drive the stage 11, then even if the reaction force from the stage 11 and the biasing force from the biasing rubber 62 are applied to the actuator body 4 as a moment which rotates the actuator body 4, the rotation of the actuator body 4 is restrained, whereby the attitude of the actuator body 4 with respect to the stage 11 can be maintained. As a result, a desired abutment state can be maintained between the driver elements 308a and 308b and the stage 11, and therefore, the actuator body 4 can be allowed to output a desired driving force to the stage 11, whereby the operation of the ultrasonic actuator 302 can be stabilized.

In addition, a plurality of driver elements 308a and 308b are provided in the thickness direction of the actuator body 4, and therefore, the number of driver elements is increased, i.e., an area where the driver elements abut on the stage 11 is increased, whereby the driving force applied from the ultrasonic actuator 302 to the stage 11 can be increased.

Moreover, in each driver element group 308A (308B), the driver elements 308a (308b) are offset in the longitudinal direction to be arranged on opposite sides of an antinode of the bending vibration and at the same distance of s from the antinode. As a result, when the actuator body 4 performs a bending vibration and a longitudinal vibration, the driver elements 308a (308b) offset in the longitudinal direction have substantially the same amplitude of the bending vibration, and therefore, substantially simultaneously abut on the stage 11, whereby the driving force can be stably applied to the stage 11.

Moreover, in each driver element group 308A (308B), the driver elements 308a (308b) offset in the longitudinal direction are alternately arranged in the perpendicular direction on opposite sides of the antinode of the bending vibration. In this case, although the driver elements 308a (308b) are offset in the longitudinal direction, the driver elements 308a (308b) can be uniformly arranged, whereby the driver elements 308a (308b) are allowed to abut on the stage 11 in a balanced manner.

Moreover, the driver elements 308a and 308b are arranged at positions axisymmetric with respect to a straight line which passes through a center portion in the longitudinal direction of the mounting surface 40a and is perpendicular to the longitudinal direction (extends in the thickness direction). Therefore, the first driver element group 308A and the second driver element group 308B can apply equal driving forces to the stage 11, whereby the stage 11 can be stably driven.

Moreover, the driver elements 308a and 308b are arranged so that Expression (1) is satisfied, whereby the driver elements 308a and 308b are respectively equally spaced in the perpendicular direction, and therefore, the pressing forces of the driver elements 308a (308b) can be uniformly transmitted to the stage 11.

Moreover, in recent years, the downsizing of electronic apparatuses requires a still smaller ultrasonic actuator 302. When the ultrasonic actuator 302 has a smaller size, the efficient is likely to decrease. In other words, the shapes of the driver elements 308a and 308b relatively increase, and therefore, if the driver elements 308a and 308b are provided at the respective antinodes of the bending vibration of the actuator body 4 as described above, the driver elements 308a and 308b are likely to damp the bending vibration of the actuator body 4, resulting in a reduction in efficiency.

In contrast to this, in this embodiment, the driver elements 308a and 308b are in the shape of a sphere, and therefore, an area where each of the driver elements 308a and 308b contacts the mounting surface 40a of the actuator body 4 can be reduced, whereby the damping of the bending vibration of the actuator body 4 can be further reduced. As a result, the efficiency of the ultrasonic actuator 302 can be improved. Here, the term "spherical shape" is not limited to exactly a spherical shape, and encompasses substantially a spherical shape which allows the driver element 308a (308b) to have substantially a point contact with the piezoelectric element unit 40.

Moreover, the spherical driver element 308a (308b) can be easily produced as compared to the cylindrical driver element 208a (208b), whereby the cost of the driver element 308a (308b) can be reduced.

<<Embodiment 4 of the Invention>>

Next, an ultrasonic actuator according to Embodiment 4 of the present invention will be described.

Embodiment 4 is different from Embodiment 3 in the arrangement of driver elements. Therefore, components similar to those of Embodiment 3 are indicated by similar reference characters and will not be described. The difference will be mainly described.

Figure 14:
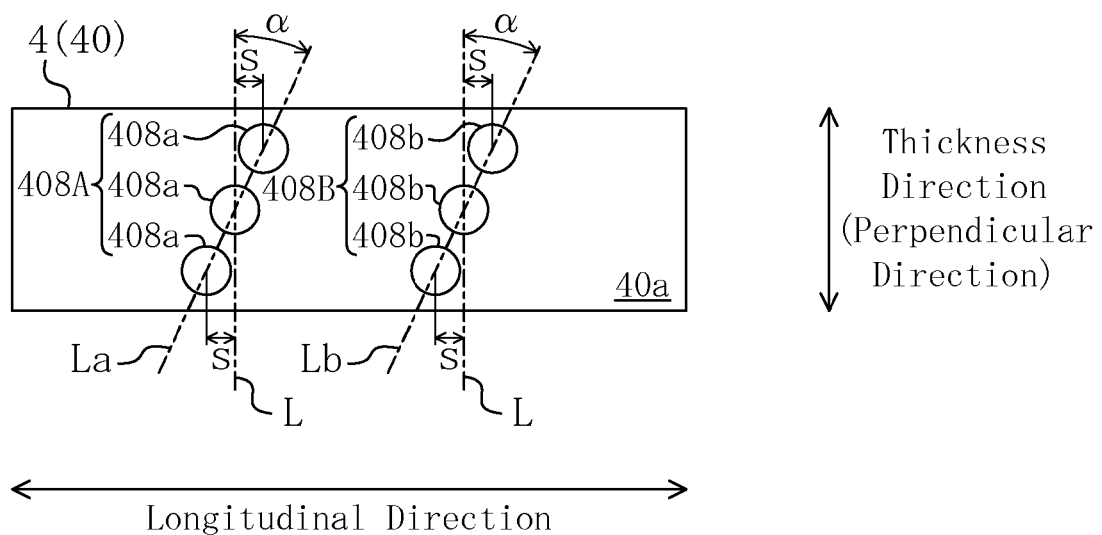
FIG. 14 is a plan view of an actuator body showing an arrangement of driver elements according to Embodiment 4.

Specifically, in a first driver element group 408A, as shown in FIG. 14, first driver elements 408a are arranged in an oblique straight line La oblique with respect to a straight line L extending in the perpendicular direction. The oblique straight line La is oblique with respect to the straight line L so that one end thereof in the perpendicular direction (the lower side of FIG. 14) is located farther outside in the longitudinal direction than the straight line L and the other end thereof in the perpendicular direction (the upper side of FIG. 14) is located farther inside in the longitudinal direction than the straight line L. Note that the straight line L indicates an antinode of a bending vibration as in Embodiment 3.

Moreover, a first first-driver element 408a which is numbered from the one end in the perpendicular direction is offset outward in the longitudinal direction with respect to the straight line L extending in the perpendicular direction by a predetermined amount of s. A second first-driver element 408a is located on the straight line L. A third first-driver element 408a is offset inward in the longitudinal direction with respect to the straight line L extending in the perpendicular direction by the predetermined amount of s.

In a second driver element group 408B, second driver elements 408b are arranged in an oblique straight line Lb oblique with respect to a straight line L extending in the perpendicular direction. The oblique straight line Lb is oblique with respect to the straight line L so that one end thereof in the perpendicular direction (the lower side of FIG. 14) is located farther inside in the longitudinal direction than the straight line L and the other end thereof in the perpendicular direction (the upper side of FIG. 14) is located farther outside in the longitudinal direction than the straight line L. In other words, the oblique straight line Lb has the same rotational direction with respect to the straight line L as that of the oblique straight line La. Moreover, the oblique straight line La and the oblique straight line Lb have the same angle of inclination with respect to the respective corresponding straight line L, whose magnitude is α°, i.e., are parallel to each other.

Moreover, a first second-driver element 408b which is numbered from the one end in the perpendicular direction is offset inward in the longitudinal direction with respect to the straight line L extending in the perpendicular direction by the predetermined amount of s. A second second-driver element 408b is located on the straight line L. A third second-driver element 408b is offset outward in the longitudinal direction with respect to the straight line L extending in the perpendicular direction by the predetermined amount of s.

The first driver elements 408a and the second driver elements 408b thus arranged are located at positions in the perpendicular direction which satisfy Expression (1) as in Embodiment 3.

In other words, the first driver elements 408a and the second driver elements 408b are arranged at positions point-symmetric with respect to a center portion in the longitudinal direction and in the perpendicular direction of the mounting surface 40a, i.e., if the first driver elements 408a are rotated by an angle of 180° about the center portion, the first driver elements 408a matches the second driver elements 408b.

Therefore, according to Embodiment 4, as in Embodiment 3, in the driver element group 408A (408B) including the driver elements 408a (408b) arranged in the thickness direction, the driver elements 408a (408b) are offset in the longitudinal direction. As a result, when the driver elements 408a and 408b perform an orbital motion to drive the stage 11, then even if the reaction force from the stage 11 and the biasing force from the biasing rubber 62 are applied to the actuator body 4 as a moment which rotates the actuator body 4, the rotation of the actuator body 4 is restrained, whereby the attitude of the actuator body 4 with respect to the stage 11 can be maintained. As a result, the actuator body 4 can be allowed to output a desired driving force to the stage 11, whereby the operation of the ultrasonic actuator can be stabilized.

Moreover, displacement of the longitudinal vibration in the first-order mode of the actuator body 4 decreases toward a center in the longitudinal direction of the actuator body 4, i.e., increases toward end portions thereof in the longitudinal direction. Therefore, when the driver elements 408a (408b) are arranged in an oblique line with respect to the thickness direction, the driver elements 408a (408b) have different positions in the longitudinal direction, i.e., have longitudinal vibrations having different magnitudes. However, the direction (oblique straight line La) of arrangement of the first driver elements 408a in the first driver element group 408A is parallel to the direction (oblique straight line Lb) of arrangement of the second driver elements 408b in the second driver element group 408B. Therefore, on the mounting surface 40a of the actuator body 4, a first driver element 408a which is located farther outside in the longitudinal direction than the corresponding straight line L and has a relatively large longitudinal vibration and a second driver element 408b which is located farther inside in the longitudinal direction than the corresponding straight line L and has a relatively small longitudinal vibration, are located closest to the one end in the thickness direction, while a first driver element 408a which is located farther inside in the longitudinal direction than the corresponding straight line L and has a relatively small longitudinal vibration and a second driver element 408b which is located farther outside in the longitudinal direction than the corresponding straight line L and has a relatively large longitudinal vibration, are located closest to the other end in the thickness direction. Therefore, the magnitudes of vibrations of the driver elements 408a and the magnitudes of vibrations of the driver elements 480b are axisymmetric in the thickness direction with respect to the center portion in the thickness direction. As a result, a driving force can be output in the vibration direction (i.e., the longitudinal direction) of the longitudinal vibration of the actuator body 4, whereby the stage 11 can be stably driven.

In addition, Embodiment 4 provides functions and advantages similar to those of Embodiment 3.

Although the driver elements 408a (408b) in each driver element group 408A (408B) are arranged in a straight line in Embodiment 4, the present invention is not limited to this. The driver elements 408a (408b) in each driver element group 408A (408B) may be arranged in a curve.

<<Embodiment 5 of the Invention>>

Next, an ultrasonic actuator according to Embodiment 5 of the present invention will be described.

Embodiment 5 is different from Embodiment 4 in the rotational direction of the arrangement of driver elements.

Figure 15:
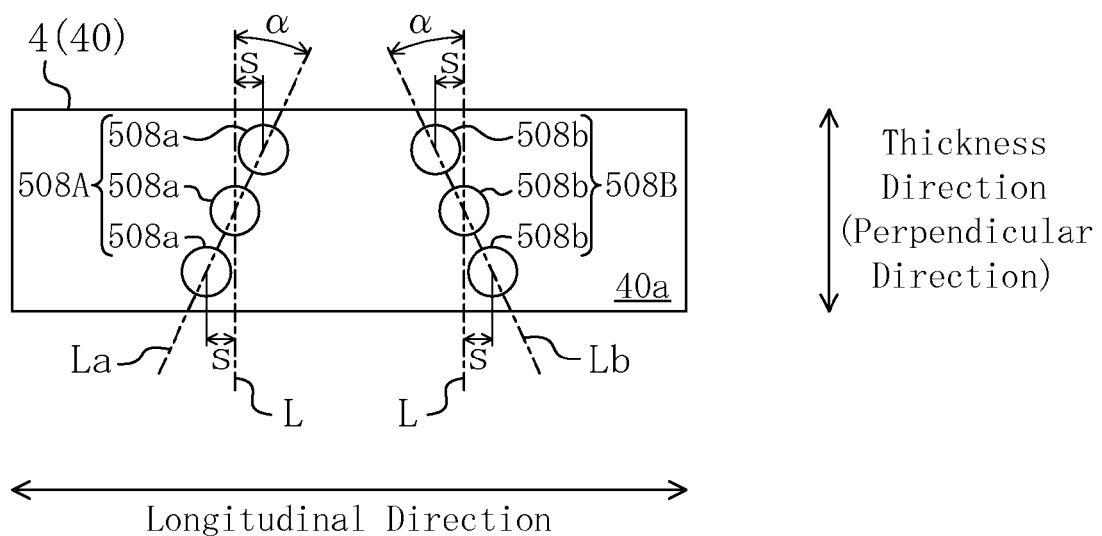
FIG. 15 is a plan view of an actuator body showing an arrangement of driver elements according to Embodiment 5.

Specifically, in a first driver element group 508A, as shown in FIG. 15, first driver elements 508a are arranged in an oblique straight line La oblique with respect to a straight line L. The oblique straight line La is oblique with respect to the straight line L so that one end thereof in the perpendicular direction (the lower side of FIG. 15) is located farther outside in the longitudinal direction than the straight line L and the other end thereof in the perpendicular direction (the upper side of FIG. 15) is located farther inside in the longitudinal direction than the straight line L.

Moreover, a first first-driver element 508a which is numbered from one end in the perpendicular direction is offset outward in the longitudinal direction with respect to the straight line L by a predetermined amount of s. A second first-driver element 508a is located on the straight line L. A third first-driver element 508a is offset inward in the longitudinal direction with respect to the straight line L by the predetermined amount of s.

In a second driver element group 508B, second driver elements 508b are arranged in an oblique straight line Lb oblique with respect to a straight line L. The oblique straight line Lb is oblique with respect to the straight line L so that one end thereof in the perpendicular direction (the lower side of FIG. 15) is located farther outside in the longitudinal direction than the straight line L and the other end thereof in the perpendicular direction (the upper side of FIG. 15) is located farther inside in the longitudinal direction than the straight line L. In other words, the oblique straight line Lb has the rotational direction with respect to the straight line L which is opposite to that of the oblique straight line La. Therefore, the oblique lines La and Lb taper in the perpendicular direction toward the other end. Note that the oblique straight line La and the oblique straight line Lb have the same angle of inclination with respect to the respective corresponding straight lines L, whose magnitude is $\alpha°$, although they have the different rotational directions.

Moreover, a first second-driver element 508b which is numbered from the one end in the perpendicular direction is offset outward in the longitudinal direction with respect to the straight line L by the predetermined amount of s. A second second-driver element 508b is located on the straight line L. A third second-driver element 508b is offset inward in the longitudinal direction with respect to the straight line L by the predetermined amount of s.

The first driver elements 508a and the second driver elements 508b are located at positions in the perpendicular direction which satisfy Expression (1) as in Embodiment 3.

Thus, the first driver elements 508a and the second driver elements 508b are arranged at positions axisymmetric in the longitudinal direction with respect to a center portion in the longitudinal direction of the mounting surface 40a, i.e., with respect to a straight line passing through the center portion in the longitudinal direction of the mounting surface 40a and extending in the perpendicular direction.

Therefore, according to Embodiment 5, as in Embodiment 4, in the driver element group 508A (508B) including the driver elements 508a (508b) arranged in the thickness direction, the driver elements 508a (508b) are offset in the longitudinal direction. As a result, when the driver elements 508a and 508b perform an orbital motion to drive the stage 11, then even if the reaction force from the stage 11 and the biasing force from the biasing rubber 62 are applied to the actuator body 4 as a moment which rotates the actuator body 4, the rotation of the actuator body 4 is restrained, whereby the attitude of the actuator body 4 with respect to the stage 11 can be maintained. As a result, the actuator body 4 can be allowed to output a desired driving force to the stage 11, whereby the operation of the ultrasonic actuator can be stabilized.

Moreover, in each driver element group 508A (508B), the direction of arrangement of the driver elements 508a (508b) is oblique with respect to the thickness direction, and therefore, driving forces output from the driver elements 508a (508b) are likely to incline in a direction perpendicular to the direction of arrangement. As a result, the actuator body 4 tends to incline. However, the direction of arrangement of the first driver elements 508a in the first driver element group 508A and the direction of arrangement of the second driver elements 508b in the second driver element group 508B are oblique with respect to the thickness direction in opposite directions, whereby the inclination of the actuator body 4 can be reduced.

In addition, Embodiment 5 provides functions and advantages similar to those of Embodiment 4.

<<Embodiment 6 of the Invention>>

Next, an ultrasonic actuator 602 according to Embodiment 6 of the present invention will be described.

The ultrasonic actuator 602 of Embodiment 6 is different from those of Embodiments 3 to 5 in driver elements 608a (608b) having a cylindrical shape are used instead of the driver elements having a spherical shape. Therefore, components similar to those of Embodiment 3 are indicated by similar reference characters and will not be described. The difference will be mainly described.

Figure 16:
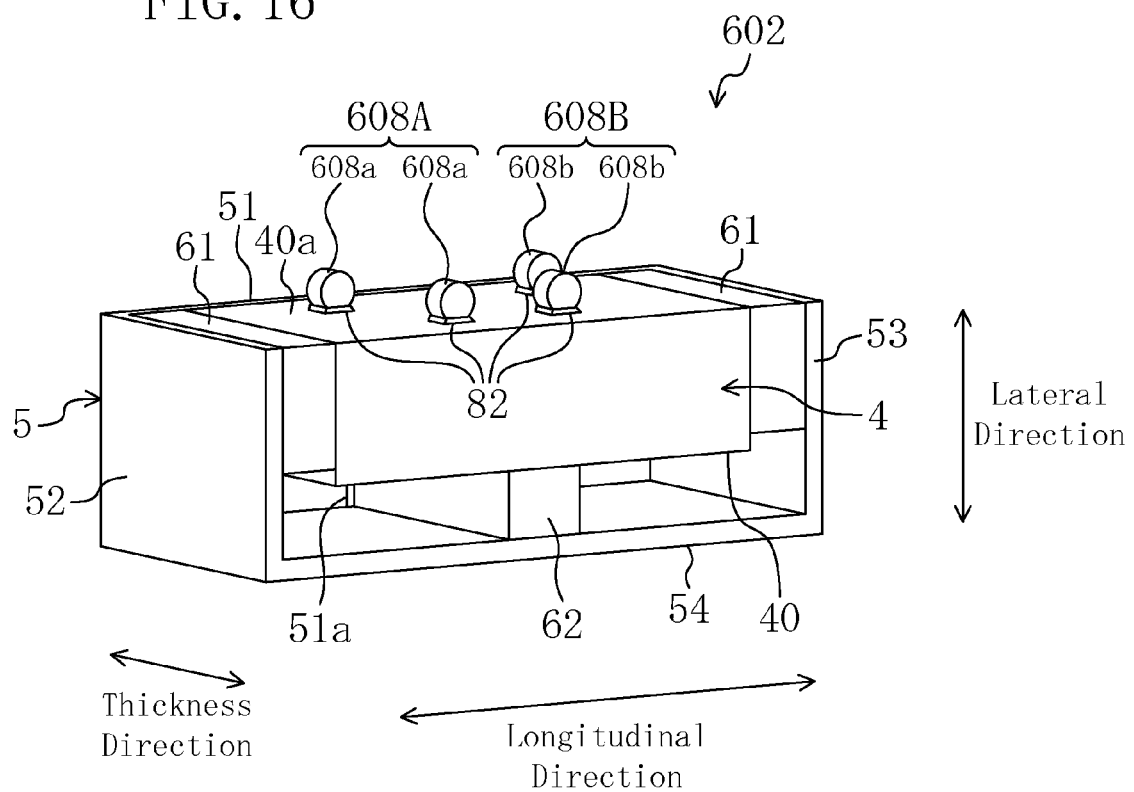
FIG. 16 is a perspective view of an ultrasonic actuator according to Embodiment 6.
Figure 17:
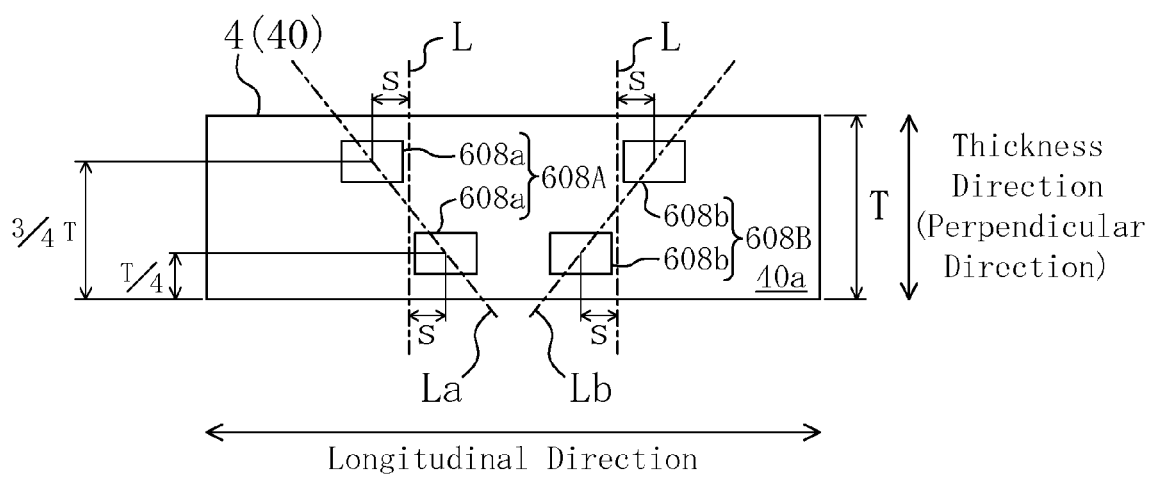
FIG. 17 is a plan view of an actuator body showing an arrangement of driver elements according to Embodiment 6.

Specifically, in the ultrasonic actuator 602, as shown in FIGS. 16 and 17, driver element groups 608A and 608B are provided on a mounting surface 40a of a piezoelectric element unit 40 at two respective antinodes of a bending vibration in the second-order mode. The driver element groups 608A and 608B include two driver elements 608a and two driver elements 608b, respectively. The driver elements 608a and 608b have the same cylindrical shape.

Each driver element 608a (608b) is fixed to the piezoelectric element unit 40 using an adhesive 82 similar to that of Embodiment 3. Thus, each driver element 608a (608b) is attached by a line contact to the mounting surface 40a of the piezoelectric element unit 40. Here, the term "line contact" is not limited to a state in which the driver elements 608a (608b) exactly contact the mounting surface 40a, and also means a state in which the driver elements 608a (608b) and the mounting surface 40a have substantially a line contact with each other with the adhesive 82 being interposed between the driver elements 608a (608b) and the mounting surface 40a. Also, the term "cylindrical shape" is not limited to exactly a cylindrical shape, and encompasses substantially a cylindrical shape which allows the driver elements 608a (608b) to have substantially a line contact with the piezoelectric element unit 40.

In the first driver element group 608A, the first driver elements 608a are arranged in the oblique straight line La oblique with respect to the corresponding straight line L. Likewise, in the second driver element group 608B, the second driver elements 608b are arranged in the oblique straight line Lb oblique with respect to the corresponding straight line L. The oblique straight line La and the oblique straight line Lb having the opposite rotational directions with respect to the respective straight lines L, i.e., taper in the perpendicular direction.

Moreover, each driver element 608a (608b) is provided with the axis of the cylinder extending in the thickness direction. In other words, each driver element 608a (608b) is arranged so that the axis of the cylinder extends perpendicularly to a plane in which the driver element 608a (608b) performs an orbital motion. Note that each driver element 608a (608b) may be arranged to face in a direction along the oblique straight line La (Lb).

Moreover, in each driver element group 608A (608B), the driver elements 608a (608b) are offset in the longitudinal direction by the same distance of s and are alternately arranged on opposite sides in the longitudinal direction of the corresponding antinode of the bending vibration.

Moreover, the driver elements 608a and 608b are located at positions in the thickness direction which satisfy Expression (1). Specifically, in this embodiment, a first driver element 608a located closest to one end in the thickness direction (the lower side of FIG. 17) is located at a distance of T/4 from the edge of the one end in the thickness direction of the mounting surface 40a, and a first driver element 608a located farthest from the one end in the thickness direction (the upper side of FIG. 17) is located at a distance of 3 T/4 from the edge of the one end in the thickness direction of the mounting surface 40a.

Therefore, according to Embodiment 6, although each driver element 608a (608b) has a cylindrical shape rather than a spherical shape, the driver elements 608a (608b) are offset in the longitudinal direction in the driver element group 608A (608B) including the driver elements 608a (608b) arranged in the thickness direction, thereby obtaining the following advantage. When the driver elements 608a and 608b perform an orbital motion to drive the stage 11, then even if the reaction force from the stage 11 and the biasing force from the biasing rubber 62 are applied to the actuator body 4 as a moment which rotates the actuator body 4, the rotation of the actuator body 4 is restrained, whereby the attitude of the actuator body 4 with respect to the stage 11 can be maintained. As a result, the actuator body 4 can be allowed to output a desired driving force to the stage 11, whereby the operation of the ultrasonic actuator 602 can be stabilized.

Moreover, the driver elements 608a (608b) are in the shape of a cylinder, and therefore, an area where each of the driver elements 608a (608b) contacts the mounting surface 40a can be reduced, whereby the damping of the bending vibration of the actuator body 4 by the driver element 608a (608b) can be reduced. In addition, each driver element 608a (608b) is arranged and attached to the mounting surface 40a so that the axis of the cylinder extends in a direction perpendicular to the vibration direction of the bending vibration and the vibration direction of the longitudinal vibration of the actuator body 4, i.e., a direction perpendicular to a plane in which the actuator body 4 performs the bending vibration, whereby the damping of the bending vibration of the actuator body 4 can be further reduced.

In addition, Embodiment 6 provides functions and advantages similar to those of Embodiments 3 and 5.

Although it is assumed in this embodiment that the number of the driver elements 608a (608b) included in the driver element group 608A (608B) is two, the present invention is not limited to this. The number of the driver elements 608a (608b) may be three or more.

Also, although the direction of arrangement of the first driver elements 608a in the first driver element group 608A and the direction of arrangement of the second driver elements 608b in the second driver element group 608B are oblique in the opposite rotational directions with respect to the thickness direction, i.e., taper in the thickness direction, the present invention is not limited to this. Alternatively, both the directions of arrangement may be oblique in the same rotational direction with respect to the thickness direction as in Embodiment 4. In this case, Embodiment 6 provides functions and advantages similar to those of Embodiment 4.

<<Embodiment 7 of the Invention>>

Next, an ultrasonic actuator according to Embodiment 7 of the present invention will be described.

The ultrasonic actuator of Embodiment 7 is different from those of Embodiments 3 to 6 in that a driver element group including a plurality of driver elements arranged in the thickness direction, such as those shown in Embodiments 3 to 6, is not provided, and a column-like driver element 708a (708b) is provided instead of the driver element group. Therefore, components similar to those of Embodiment 3 are indicated by similar reference characters and will not be described. The difference will be mainly described.

Figure 18:
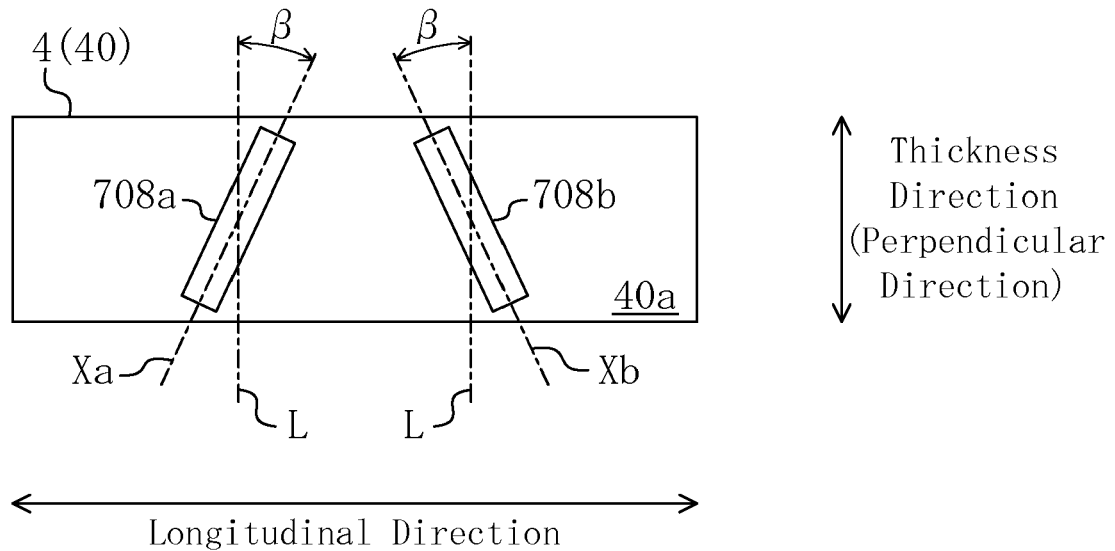
FIG. 18 is a plan view of an actuator body showing an arrangement of driver elements according to Embodiment 7.

In the ultrasonic actuator of Embodiment 7, as shown in FIG. 18, two driver elements (first and second driver elements) 708a and 708b are provided on a mounting surface 40a of an actuator body 4 at different positions in the longitudinal direction, specifically, at two positions on the inside in the longitudinal direction of respective antinodes of a bending vibration.

Each driver element 708a (708b) has a cylindrical shape with the axis Xa (Xb) of the cylinder being oblique with respect to the thickness direction of the actuator body 4. Specifically, the first driver element 708a is arranged so that an end portion thereof in an axial direction thereof (the lower side of FIG. 18) is located farther outside in the longitudinal direction of the actuator body 4 than a corresponding straight line L, and the other end portion thereof in the axial direction (the upper side of FIG. 18) is located farther inside in the longitudinal direction of the actuator body 4 than the straight line L. Also, the second driver element 708b is arranged so that an end portion thereof in an axial direction thereof (the lower side of FIG. 18) is located farther outside in the longitudinal direction of the actuator body 4 than a corresponding straight line L, and the other end portion thereof in the axial direction (the upper side of FIG. 18) is located farther inside in the longitudinal direction of the actuator body 4 than the straight line L. In other words, the first driver element 708a and the second driver element 708b taper in the thickness direction on the mounting surface 40a.

Moreover, the first driver element 708a and the second driver element 708b are oblique with respect to the respective straight lines L in opposite rotational directions at the same oblique angle whose magnitude is β°.

Thus, the first driver element 708a and the second driver element 708b are arranged at positions axisymmetric in the longitudinal direction with respect to a center portion in the longitudinal direction of the mounting surface 40a, i.e., with respect to a straight line passing through the center portion in the longitudinal direction of the mounting surface 40a and extending in the perpendicular direction.

Therefore, according to Embodiment 7, the column-like driver elements are arranged and oblique with respect to the thickness direction, whereby an abutment area where each driver element abuts on the stage 11 can be increased in the longitudinal direction. Therefore, when the driver elements 708a and 708b perform an orbital motion to drive the stage 11, then even if the reaction force from the stage 11 and the biasing force from the biasing rubber 62 are applied to the actuator body 4 as a moment which rotates the actuator body 4, the rotation of the actuator body 4 is restrained, whereby the attitude of the actuator body 4 with respect to the stage 11 can be maintained. As a result, the actuator body 4 can be allowed to output a desired driving force to the stage 11, whereby the operation of the ultrasonic actuator can be stabilized.

Moreover, the driver elements 708a and 708b have a cylindrical shape, and therefore, each of the driver elements 708a and 708b contacts the mounting surface 40a by a line contact. As a result, even when the driver elements 708a and 708b are provided on a surface facing in the vibration direction of the bending vibration of the actuator body 4, an area where each of the driver elements 708a and 708b contacts the mounting surface 40a is reduced, whereby the damping of the bending vibration of the actuator body 4 can be reduced.

Moreover, the stable operation of an ultrasonic actuator can be achieved using the single column-like driver element 708a (708b) rather than a driver element group including a plurality of driver elements, such as those of Embodiments 3 to 6, whereby the cost can be reduced. In addition, as the number of parts can be reduced, the assemblability can be increased.

Figure 19:
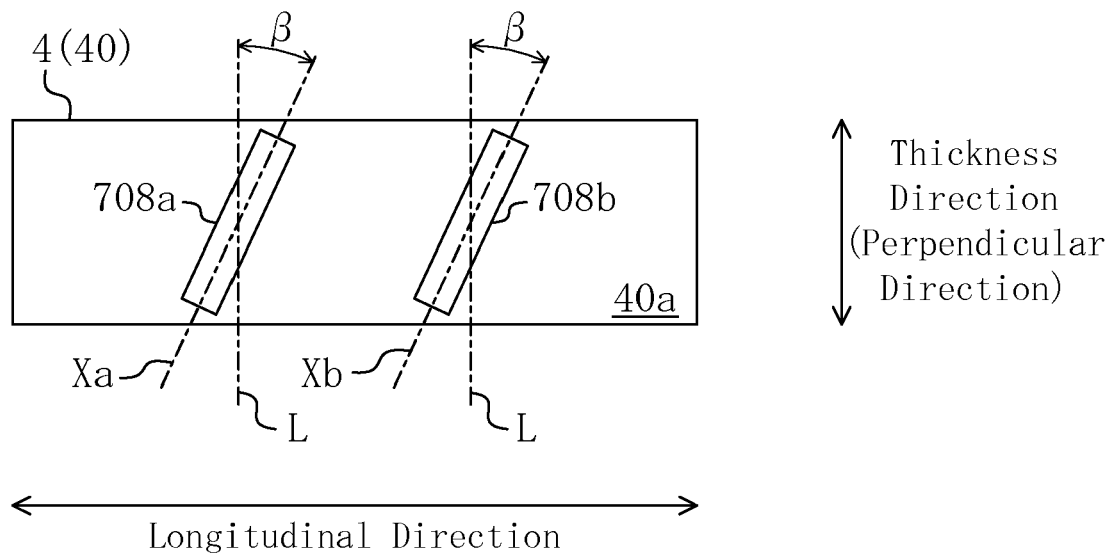
FIG. 19 is a plan view of an actuator body showing an arrangement of driver elements according to a variation of Embodiment 7.

Although the driver elements 708a and 708b are arranged so that the respective directions of arrangement are oblique in opposite rotational directions with respect to the respective straight lines L, i.e., the driver elements 708a and 708b taper in the thickness direction, the present invention is not limited to this. Specifically, the driver elements 708a and 708b may only be arranged so that the axes Xa and Xb of the respective cylinders are oblique with respect to the respective corresponding straight lines L. For example, the driver elements 708a and 708b may be arranged so that the axes Xa and Xb of the respective cylinders are oblique in the same rotational direction with respect to the respective corresponding straight lines L. Moreover, as shown in FIG. 19, the driver elements 708a and 708b may be arranged so that the axes Xa and Xb are parallel to each other.

<<Embodiment 8 of the Invention>>

A drive device 1 according to Embodiment 8 of the present invention has a configuration basically similar to that of the drive device 1 of Embodiment 1. Specifically, as shown in FIG. 2, the drive device 1 of Embodiment 8 includes a stage 11, an ultrasonic actuator 802, and a controller (not shown) which controls the ultrasonic actuator 802.

The stage 11 is slidably attached to guides 12 which are arranged in parallel with each other and are fixed to a base (not shown) which is a stationary body. In other words, the stage 11 is configured to be movable in a direction in which the guides 12 extend. The stage 11 constitutes a movable body. The direction in which the guides 12 extend is a direction in which the stage 11 can be moved. The stage 11 is a plate-like member having substantially a rectangular shape as viewed from the top and is formed of alumina. Note that the material for the stage 11 is not limited to alumina and may be any material. The ultrasonic actuator 802 is provided on a back surface (a side on which the guides 12 are provided) so that driver elements 808a and 808b described later abut on the stage 11.

Figure 20:
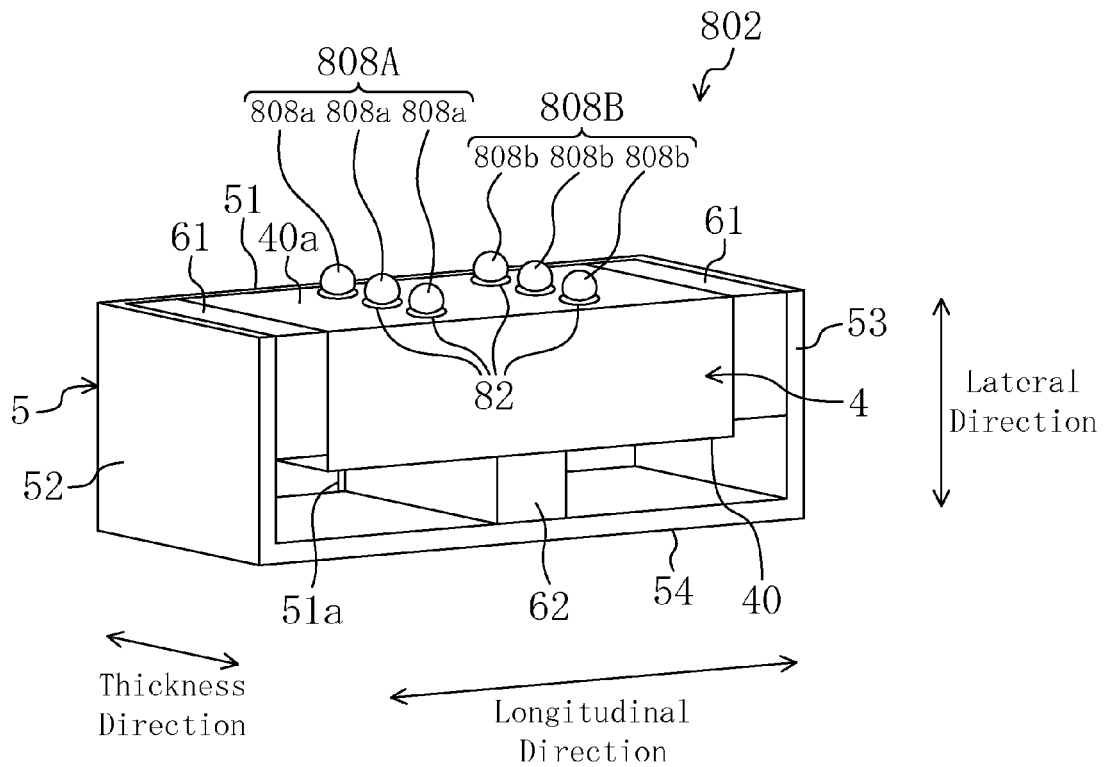
FIG. 20 is a perspective view of an ultrasonic actuator according to Embodiment 8.

As shown in FIG. 20, the ultrasonic actuator 802 includes an actuator body 4 which generates vibrations, the driver elements 808a and 808b which transfer a driving force of the actuator body 4 to the stage 11, a case 5 which accommodates the actuator body 4, support rubbers 61 which are interposed between the actuator body 4 and the case 5 and elastically support the actuator body 4, and a biasing rubber 62 which biases the stage 11 toward the actuator body 4. The ultrasonic actuator 802 constitutes a vibratory actuator (the same applies to each embodiment described below).

The actuator body 4 is formed of a piezoelectric element unit 40.

The piezoelectric element unit 40 has substantially a rectangular parallelepiped shape having a pair of substantially rectangular principal surfaces facing each other, a pair of long side surfaces facing each other, perpendicular to the principal surface and extending in a longitudinal direction of the principal surface, and a pair of short side surfaces facing each other, perpendicular to both the principal surface and the long side surface, and extending in a lateral direction of the principal surface.

As shown in FIG. 3, the piezoelectric element unit 40 includes five piezoelectric layers (piezoelectric elements) 41 and four internal electrode layers 42, 44, 43 and 44, which are alternately stacked. The internal electrode layers 42, 44, 43 and 44 are a first power supply electrode layer 42, a common electrode layer 44, a second power supply electrode layer 43, and another common electrode layer 44, with the piezoelectric layer 41 being interposed between any two of the internal electrode layers that are adjacent in the stacking direction. The first power supply electrode layer 42, the second power supply electrode layer 43 and the common electrode layers 44 are printed on the principal surfaces of the respective corresponding piezoelectric layers 41.

The piezoelectric layers 41 are each an insulating layer formed of a ceramic material, such as lead zirconate titanate or the like, which has substantially a rectangular parallelepiped shape including a pair of principal surfaces, a pair of long side surfaces and a pair of short side surfaces as with the piezoelectric element unit 40. Moreover, in each piezoelectric layer 41, an external electrode 45a is formed at a middle portion in the longitudinal direction of one of the long side surfaces, an external electrode 46a is formed at a middle portion in the lateral direction of one of the short side surfaces, and an external electrode 47a is formed at a middle portion in the lateral direction of the other short side surface.

The common electrode layers 44 are provided over substantially the entire principal surfaces of the respective corresponding piezoelectric layers 41 and have substantially a rectangular shape. Moreover, a lead electrode 44a is formed at one of long side portions of each common electrode layer 44, extending from a middle portion in the longitudinal direction of the common electrode layer 44 to the external electrode 45a of the corresponding piezoelectric layer 41.

Suppose that the principal surface of each piezoelectric layer 41 is divided into two in the longitudinal direction and in the lateral direction, i.e., four areas. As shown in FIG. 4, the first power supply electrode layer 42 has a pair of first electrodes 42a and 42b formed in one of two pairs of diagonally opposite areas of the principal surface, respectively, and a conductive electrode 42c conductively coupling the first electrodes 42a and 42b. Each first electrode 42a (42b) has substantially a rectangular shape, which overlaps the common electrode layer 44 as viewed in the stacking direction. In other words, each first electrode 42a (42b) faces the common electrode layer 44 with the corresponding piezoelectric layer 41 being interposed therebetween. Moreover, one (first electrode 42a) of the first electrodes 42a and 42b is provided with a lead electrode 42d extending to the external electrode 46a of the corresponding piezoelectric layer 41.

The second power supply electrode layer 43 has a pair of second electrodes 43a and 43b formed in the other of the two pairs of diagonally opposite areas of the principal surface of the corresponding piezoelectric layer 41, respectively, and a conductive electrode 43c conductively coupling the second electrodes 43a and 43b. The second electrode 43a is located in one of the other pair of areas which is adjacent to the first electrode 42a in the lateral direction and the first electrode 42b in the longitudinal direction as viewed in the stacking direction. The second electrode 43b is located in the other area which is adjacent to the first electrode 42a in the longitudinal direction and the first electrode 42b in the lateral direction as viewed in the stacking direction. Each second electrode 43a (43b) has substantially a rectangular shape, which overlaps the common electrode layer 44 as viewed in the stacking direction. In other words, each second electrode 43a (43b) faces the common electrode layer 44 with the corresponding piezoelectric layer 41 being interposed therebetween. Moreover, one (second electrode 43b) of the second electrodes 43a and 43b is provided with a lead electrode 43d extending to the external electrode 47a of the corresponding piezoelectric layer 41.

In the piezoelectric element unit 40 which is configured by alternately stacking the piezoelectric layers 41 and the internal electrode layers 42, 44, 43 and 44, the external electrodes 45a of the piezoelectric layers 41 align in the stacking direction at the middle portions in the longitudinal direction of the one long side surface of the piezoelectric element unit 40, thereby forming an integrated external electrode 45. The lead electrodes 44a formed in the common electrode layers 44 are electrically connected to the external electrode 45. Likewise, the external electrodes 46a of the piezoelectric layers 41 align in the stacking direction at the middle portions in the lateral direction of the one short side surface of the piezoelectric element unit 40, thereby forming an integrated external electrode 46. The lead electrode 42d of the first power supply electrode layer 42 is electrically connected to the external electrode 46. Moreover, the external electrodes 47a of the piezoelectric layers 41 align in the stacking direction at the middle portions in the lateral direction of the other short side surface of the piezoelectric element unit 40, thereby forming an integrated external electrode 47. The lead electrode 43d of the second power supply electrode layer 43 is electrically connected to the external electrode 47.

Figure 21:
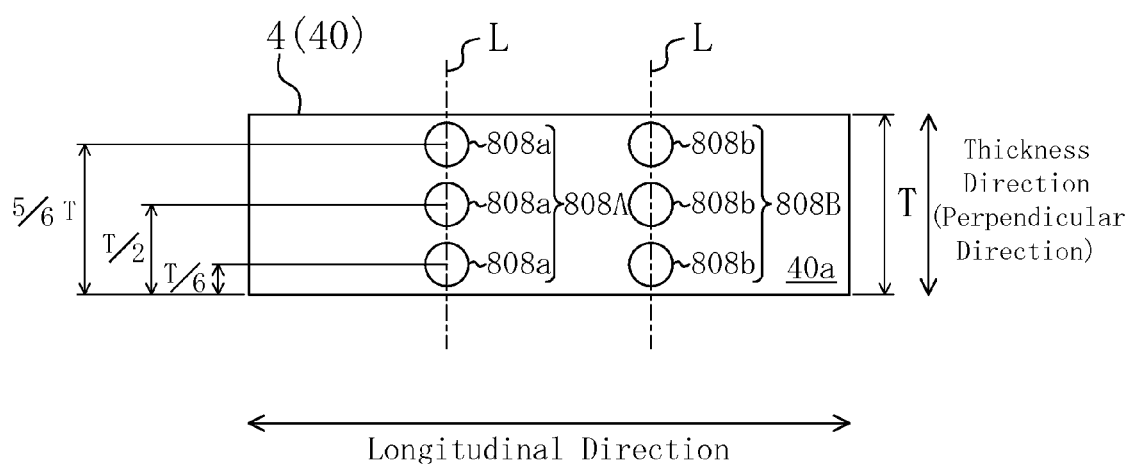
FIG. 21 is a plan view of an actuator body showing an arrangement of driver elements according to Embodiment 8.

On the other long side surface 40a of the piezoelectric element unit 40 at which the external electrode 45a is not provided (i.e., one of a pair of surfaces facing in a vibration direction of a bending vibration described later, also referred to hereinafter as a mounting surface), six driver elements 808a and 808b are provided as shown in FIGS. 20 and 21.

The driver elements 808a and 808b have a spherical shape and are formed of zirconia, alumina, silicon nitride, silicon carbide, tungsten carbide or the like. Moreover, the driver elements 808a and 808b are attached by a point contact to the mounting surface 40a of the piezoelectric element unit 40 via an adhesive 82 (see FIG. 4). Here, the term "point contact" is not limited to a state in which the driver elements 808a and 808b exactly contact the mounting surface 40a, and also means a state in which the driver elements 808a and 808b and the mounting surface 40a have substantially a point contact with each other with the adhesive 82 being interposed between the driver elements 808a and 808b and the mounting surface 40a.

It is desirable that the adhesive 82 be made of a material which is softer than materials for the piezoelectric element unit 40 and the driver elements 808a and 808b. Specifically, examples of the material for the adhesive 82 include synthetic resins, such as, particularly, epoxy resins and silicone resins. The use of such a material allows the driver elements 808a and 808b to be fixed to the mounting surface 40a while avoiding the damping of vibrations described later of the piezoelectric element unit 40 to the extent possible.

Moreover, the driver elements 808a and 808b are located at positions (indicated by respective straight lines L in FIG. 21) on the mounting surface 40a at a distance corresponding to 30 to 35% of the full length of the mounting surface 40a from both end portions in the longitudinal direction of the piezoelectric element unit 40. In other words, the positions correspond to respective antinodes of the second-order mode of a bending vibration described later of the piezoelectric element unit 40, where the vibration is maximum. The driver elements 808a and 808b are divided into a driver element group 808A including the driver elements 808a located at one in the longitudinal direction of the two positions corresponding to the respective antinodes of the second-order mode of a bending vibration, and a driver element group 808B including the driver elements 808b located at the other position in the longitudinal direction.

Here, the arrangement of the driver elements 808a and 808b in the driver element groups 808A and 808B will be described. Note that the driver element group 808A and the driver element group 808B have the same arrangement, except that the driver element group 808A and the driver element group 808B are located at different positions in the longitudinal direction on the mounting surface 40a. Therefore, only the driver element group 808A will be described hereinafter, i.e., the driver element group 808B will not be described.

As shown in FIG. 21, in the driver element group 808A, the driver elements 808a are arranged at different positions in a thickness direction (also referred to hereinafter as a perpendicular direction) of the piezoelectric element unit 40. The perpendicular direction is also the stacking direction of the piezoelectric element unit 40, a direction perpendicular to a plane in which the driver elements 808a perform an orbital motion described later, and a direction perpendicular to both a vibration direction of a bending vibration and a vibration direction of a longitudinal vibration described later of the piezoelectric element unit 40. Thus, the driver elements 808a arranged at different positions in the perpendicular direction are arranged in a straight line L extending in the perpendicular direction.

Moreover, the driver elements 808a are arranged at positions axisymmetric with respect to a straight line which passes through a center portion in the perpendicular direction of the mounting surface 40a and is perpendicular to the perpendicular direction (i.e., extends in the longitudinal direction). Moreover, the driver elements 808a are equally spaced in the perpendicular direction, and more specifically, are located at positions t which satisfy the following:

$$t=\{(2N-1)/(2n)\} \times T \quad (1)$$

where t: a position in the perpendicular direction on the mounting surface 40a with reference to one end in the perpendicular direction n: the total number of driver elements arranged in the perpendicular direction (three in this embodiment)

T: a dimension in the perpendicular direction of the mounting surface 40a (a thickness of the actuator body 4)

Specifically, in this embodiment, a driver element 808a which is located closest to the one end in the perpendicular direction (the lower side of FIG. 21) is located at a distance of T/6 from an edge of the one end in the perpendicular direction of the mounting surface 40a. A driver element 808a which is located second closest to the one end in the perpendicular direction is located at a middle in the perpendicular direction of the mounting surface 40a. A driver element 808a which is located third closet to the one end in the perpendicular direction (located at the upper side of FIG. 21) is located at a distance of 5 T/6 from the edge of the one end in the perpendicular direction of the mounting surface 40a. In other words, an offset in the perpendicular direction between the position of the first driver element 808a and the position of the second driver element 808a and an offset in the perpendicular direction between the position of the second driver element 808a and the position of the third driver element 808a are each T/3.

In the actuator body 4 thus configured, when the external electrode 45 is grounded, and a first alternating current having a predetermined frequency is applied to the external electrode 46 while a second alternating current having a phase shifted by 90° from the first alternating current is applied to the external electrode 47, the alternating currents having the phases shifted by 90° from each other are applied to a pair of the diagonally opposite first electrodes 42*a* and 42*b* and another pair of the diagonally opposite second electrodes 43*a* and 43*b* provided on the principal surface of the piezoelectric layer 41. As a result, a longitudinal vibration (so-called an expanding/contracting vibration) and a bending vibration (so-called a lateral vibration) are induced in the longitudinal direction and in the lateral direction, respectively.

The resonance frequency of the longitudinal vibration and the resonance frequency of the bending vibration are each determined based on a material, a shape and the like of the actuator body 4, i.e., the piezoelectric element unit 40. Moreover, both the resonance frequencies are affected by a force supporting the actuator body 4 and a portion supporting the actuator body 4. In view of these facts, both the resonance frequencies are caused to be substantially equal to each other, and alternating currents having a frequency in the vicinity thereof and having phases shifted by 90° from each other are applied to the respective external electrodes 46 and 47. For example, the shape and the like of the piezoelectric element unit 40 are designed so that the resonance frequency in the first-order mode (see FIG. 6) of the longitudinal vibration and the resonance frequency in the second-order mode (see FIG. 7) of the bending vibration are equal to each other, and moreover, alternating currents in the vicinity of the resonance frequency and having phases shifted by 90° from each other are applied as described above, whereby the first-order mode of the longitudinal vibration and the second-order mode of the bending vibration are induced in a coordinated manner in the piezoelectric element unit 40. As a result, changes in shape sequentially occur as shown in FIGS. 8(*a*), 8(*b*), 8(*c*) and 8(*d*).

As a result, each driver element 808*a* (808*b*) provided on the piezoelectric element unit 40 performs substantially an elliptical motion, i.e., an orbital motion in a plane parallel to the principal surface of the piezoelectric element unit 40, i.e., a plane including the longitudinal direction and the lateral direction (a plane parallel to the drawing sheet in FIG. 8).

The case 5 is formed of a resin and is in the shape of substantially a box having substantially a rectangular parallelepiped shape corresponding to the piezoelectric element unit 40. The case 5 has a principal wall portion 51 which is parallel to the principal surface of the piezoelectric element unit 40 and has substantially a rectangular shape, a first short side wall portion 52 which is provided at a short side portion located on one side (the left side of FIG. 20) in the longitudinal direction of the principal wall portion 51, a second short side wall portion 53 which is provided at a short side portion located on the other side (the right side of FIG. 20) in the longitudinal direction of the principal wall portion 51, and a long side wall portion 54 which is provided at a long side portion located on one side (the lower side of FIG. 20) in the lateral direction of the principal wall portion 51. In other words, the case 5 has the following shape. No wall portion is provided at a side facing the principal wall portion 51 and at a long side portion (corresponding to the long side surface of the piezoelectric element unit 40 on which the driver elements 808*a* and 808*b* are provided) located on the other side (the upper side of FIG. 20) in the lateral direction of the principal wall portion 51. As a result, the case 5 is open at the one side in the stacking direction (the normal direction of the principal wall portion 51) of the piezoelectric element unit 40 and at the other side in the lateral direction.

The case 5 thus configured accommodates the actuator body 4. The actuator body 4 is accommodated in the case 5 so that one of the principal surfaces of the piezoelectric element unit 40 faces the principal wall portion 51, and one (a long side surface on which the external electrode 45 is provided) of the long side surfaces of the piezoelectric element unit 40 to face the long side wall portion 54. In this case, the driver elements 808*a* and 808*b* protrude from the case 5 toward the other side in the lateral direction. Moreover, the support rubbers 61 are interposed between one of the short side surfaces of the piezoelectric element unit 40 and the first short side wall portion 52 of the case 5 and between the other short side surface of the piezoelectric element unit 40 and the second short side wall portion 53 of the case 5, respectively. Both the short side surfaces of the piezoelectric element unit 40 each correspond to an antinode of a longitudinal vibration. However, as the support rubbers 61 are formed of an elastic material, the support rubbers 61 can support the piezoelectric element unit 40 without damping the longitudinal vibration of the piezoelectric element unit 40. The support rubbers 61 abut not only on the actuator body 4 and the first and second short side wall portions 52 and 53, but also on an inner surface of the principal wall portion 51. Moreover, the biasing rubber 62 is interposed between the one long side surface of the piezoelectric element unit 40 and the long side wall portion 54 of the case 5. The biasing rubber 62 abuts not only on the actuator body 4 and the long side wall portion 54, but also on the inner surface of the principal wall portion 51.

Electrodes 51*a* are provided at portions of the inner surface of the principal wall portion 51 on which the support rubbers 61 and the biasing rubber 62 abut (only an electrode abutting on the biasing rubber 62 is shown). These electrodes are conductively coupled to respective terminal electrodes (not shown) provided on an outer surface of the principal wall portion 51.

Each support rubber 61 is formed of conductive rubber obtained by mixing metal particles into silicone rubber and has substantially a rectangular parallelepiped shape. The support rubbers 61 elastically support the actuator body 4 while biasing the actuator body 4 in the longitudinal direction. Also, the support rubbers 61 conductively couple the external electrodes 46 and 47 of the piezoelectric element unit 40 to electrodes which are provided at portions of the inner surface of the principal wall portion 51 corresponding to positions where the support rubbers 61 are located, and are conductively coupled to the terminal electrodes.

The biasing rubber 62 is also formed of conductive rubber obtained by mixing metal particles into silicone rubber and has substantially a rectangular parallelepiped shape as with the support rubbers 61. The biasing rubber 62 is used to bias the actuator body 4 in the lateral direction thereof (i.e., the lateral direction corresponds to a biasing direction). The biasing rubber 62 also conductively couples the external electrode 45 of the piezoelectric element unit 40 to the electrodes 51*a* on the inner surface of the principal wall portion 51.

Note that an elastic member, such as a leaf spring or the like, may be used instead of each of the support rubbers 61 and the biasing rubber 62.

Specifically, power can be supplied to the piezoelectric element unit 40 by supplying power to the terminal electrodes provided on the outer surface of the case 5.

As shown in FIG. 2, the ultrasonic actuator 802 thus configured is provided so that the driver elements 808*a* and 808*b* abut on the back surface of the stage 11, while the case 5 is fixed to the base (not shown). Specifically, the ultrasonic actuator 802 is arranged so that the lateral direction of the piezoelectric element unit 40 is perpendicular to the back surface of the stage 11, and the longitudinal direction of the piezoelectric element unit 40 is parallel to the back surface of the stage 11 and the guides 12. In other words, the ultrasonic actuator 802 is arranged so that the direction of the bending vibration of the piezoelectric element unit 40 is perpendicular to the back surface of the stage 11, and the direction of the longitudinal vibration of the piezoelectric element unit 40 faces in a direction parallel to the guides 12.

In this case, the biasing rubber 62 is compressed and deformed, and the elastic force of the biasing rubber 62 biases the driver elements 808*a* and 808*b* toward the stage 11. The biasing force of the ultrasonic actuator 802 toward the stage 11 is determined by the elastic force of the biasing rubber 62.

The controller, when receiving an operation command from the outside, applies alternating currents having a frequency corresponding to the operation command and having a phase difference corresponding to the operation command, to the external electrodes 46 and 47.

As described above, the controller induces a longitudinal vibration and a bending vibration in the actuator body 4, i.e., the piezoelectric element unit 40 in a coordinated manner, to cause the driver elements 808*a* and 808*b* to perform an orbital motion as shown in FIG. 8, thereby moving the stage 11. Specifically, in order to prevent extraordinary heat generation of the piezoelectric element unit 40, alternating currents having a frequency slightly higher than a common resonance frequency of the longitudinal vibration and the bending vibration of the piezoelectric element unit 40, are applied to the external electrodes 46 and 47. In this case, these alternating currents applied to the external electrode 46 and 47 have phases shifted by 90° from each other.

When the piezoelectric element unit 40 performs a composite vibration of a longitudinal vibration and a bending vibration, the driver elements 808*a* and 808*b* perform substantially an elliptical motion in a plane including the longitudinal direction and the lateral direction of the piezoelectric element unit 40. As a result, the driver elements 808*a* and 808*b* apply a driving force to the stage 11 in the longitudinal direction of the piezoelectric element unit 40 by means of a friction force between the driver elements 808*a* and 808*b* and the stage 11, while periodically increasing and decreasing the friction force, whereby the stage 11 is moved along the guides 12. The longitudinal direction (equal to the direction in which the guides 12 extend) of the piezoelectric element unit 40 corresponds to a driving direction in which the driver elements 808*a* and 808*b* output the driving force.

The driving of the stage 11 by the ultrasonic actuator 802 will be described hereinafter in greater detail with reference to FIG. 9. When the piezoelectric element unit 40 expands in the longitudinal direction (the vibration direction of the longitudinal vibration), the driver element 808*a* (e.g., the left side of FIG. 9) is displaced in a region closer to the stage 11 in the lateral direction (the vibration direction of the bending vibration), and therefore, the friction force between the driver element 808*a* and the stage 11 increases and therefore moves the stage 11 in the longitudinal direction in which the driver element 808*a* is displaced (leftward in FIG. 9), as shown in FIG. 9(*b*). In this case, the driver element 808*b* (the right side of FIG. 9) is displaced in the longitudinal direction which is opposite to the direction in which the driver element 808*a* is displaced. However, since the driver element 808*b* is displaced in a region less closer to the stage 11 in the lateral direction (the driver element 808*b* moves away from the stage 11), the driver element 808*b* moves away from the stage 11, and therefore, no friction force occurs therebetween. As a result, the driver element 808*b* substantially does not affect the movement of the stage 11.

On the other hand, when the piezoelectric element unit 40 contracts in the longitudinal direction, the driver element 808*b* (the right side of FIG. 9) is displaced in a region closer to the stage 11 in the lateral direction, and therefore, the friction force between the driver element 808*b* and the stage 11 increases and therefore moves the stage 11 in the longitudinal direction in which the driver element 808*b* is displaced (leftward in FIG. 9), as shown in FIG. 9(*c*). This moving direction is the same as that of the stage 11 which is moved by the driver element 808*a* when the piezoelectric element unit 40 expands as described above. In this case, although the driver element 808*a* is displaced in the longitudinal direction which is opposite to that in which the driver element 808*b* is displaced, the driver element 808*a* is displaced in a region less closer to the stage 11 in the lateral direction away from the stage 11, and therefore, no friction force occurs therebetween. As a result, the driver element 808*a* substantially does not affect the movement of the stage 11.

Although the driver element 808*b* (808*a*) which does not affect the movement of the stage 11 is located apart from the stage 11 in FIG. 9, this is not necessarily so. Specifically, the driver element 808*b* (808*a*) may abut on the stage 11 with a friction force which is not enough to move the stage 11.

Thus, the driver elements 808*a* and the driver elements 808*b* alternately move the stage 11 in a predetermined direction with their phases being shifted by 180°. Note that, by applying alternating currents having phases shifted by −90° to the respective external electrodes 46 and 47, the driver elements 808*a* and 808*b* can be caused to output a driving force in a reverse direction, whereby the stage 11 can be moved in a direction opposite to the aforementioned predetermined direction.

Note that the distance, speed and acceleration of movement of the stage 11 can be adjusted by adjusting at least one of the voltage value, frequency and power supply time of the alternating currents supplied to the external electrode 46 and 47, or changing the phase difference between the alternating currents supplied to the external electrode 46 and 47, or the like.

As described above, the ultrasonic actuator 802 drives the stage 11 by causing the driver elements 808*a* and 808*b* to perform an orbital motion in a plane including the vibration direction (longitudinal direction) of a longitudinal vibration and the vibration direction (lateral direction) of a bending vibration, while periodically increasing and decreasing the friction forces between the driver elements 808*a* and 808*b* and the stage 11. In this case, the friction forces between the driver elements 808*a* and 808*b* and the stage 11 are enhanced by the biasing force of the biasing rubber 62.

Here, it is assumed that a plurality of driver elements are not provided in the thickness direction of the actuator body 4, i.e., the total number of driver elements is one or that all of a plurality of driver elements are provided at the same position in the thickness direction. When an error in assembly of the biasing rubber 62 or the driver element(s) may lead to a misalignment between the direction of the biasing force of the biasing rubber 62 and the direction of the pressing force of the driver element(s) to the stage (i.e., the direction of the bending vibration), i.e., the directions are offset from each other in the thickness direction, since the actuator body 4 abuts on the stage 11 at the driver element(s), i.e., a single portion, in the thickness direction, the actuator body 4 is likely to be inclined in the thickness direction. Therefore, the driver element(s) may perform an orbital motion in a plane inclined in the thickness direction rather than a plane in which the orbital motion is normally performed (i.e., a plane including the vibration direction of the longitudinal vibration and the vibration direction of the bending vibration in the actuator body 4). In this case, although the biasing rubber 62 biases the driver element(s) toward the stage 11, a component of the biasing force which acts in the vibration direction of the bending vibration to contribute to the pressing force of the driver element(s) to the stage 11 is reduced, so that the friction force between the driver element(s) and the stage 11 cannot be enhanced effectively.

Therefore, in this embodiment, a plurality of driver elements 808a and 808b are provided on the mounting surface 40a of the actuator body 4 at different positions in the thickness direction as described above. As a result, the number of abutment areas between the driver elements 808a and 808b and the stage 11 in the thickness direction can be increased. Therefore, even if the biasing force of the biasing rubber 62 is deviated in the thickness direction from the vibration direction of the bending vibration of the actuator body 4, the biasing force of the biasing rubber 62 can be distributed on a wide range in the thickness direction, whereby the plane in which the driver elements 808a and 808b perform an orbital motion can be prevented from being inclined in the thickness direction.

Therefore, according to Embodiment 8, a plurality of driver elements 808a and 808b are provided in the thickness direction of the actuator body 4, whereby the number of abutment points between the driver elements 808a and 808b and the stage 11 in the thickness direction can be increased, and therefore, the inclination of the actuator body 4 in the thickness direction can be reduced. As a result, the attitude of the actuator body 4 can be stabilized, whereby the driving force can be efficiently transmitted from the driver elements 808a and 808b to the stage 11.

In addition, by providing a plurality of driver elements 808a and 808b in the thickness direction of the actuator body 4, the number of driver elements is increased, i.e., an area where the driver elements abut on the stage 11 is increased. As a result, the driving force of the ultrasonic actuator 802 applied to the stage 11 can be increased.

Moreover, since the driver elements 808a and 808b are arranged at positions axisymmetric with respect to a straight line which passes through a center portion in the thickness direction of the mounting surface 40a and is perpendicular to the thickness direction, the pressing forces of the driver elements 808a and 808b can be transmitted to the stage 11 uniformly in the thickness direction.

Moreover, since the driver elements 808a and 808b are arranged at positions which satisfy Expression (1), the driver elements 808a and 808b can be respectively equally spaced, and therefore, the pressing forces of the driver elements 808a (808b) can be uniformly transmitted to the stage 11.

Moreover, in recent years, the downsizing of electronic apparatuses requires a still smaller ultrasonic actuator 802. When the ultrasonic actuator 802 has a smaller size, the efficient is likely to decrease. In other words, the shapes of the driver elements 808a and 808b relatively increase, and therefore, if the driver elements 808a and 808b are provided at the respective antinodes of the bending vibration of the actuator body 4 as described above, the driver elements 808a and 808b are likely to damp the bending vibration of the actuator body 4, resulting in a reduction in efficiency.

In contrast to this, in this embodiment, the driver elements 808a and 808b are arranged in the respective straight lines L extending in the thickness direction while being located at the respective positions (positions of the driver element groups 808A and 808B) in the longitudinal direction of the actuator body 4. As a result, although the driver elements 808a and 808b are provided on the long side surface which undulates due to the bending vibration of the actuator body 4, it is possible to reduce the damping of the bending vibration of the actuator body 4 by the driver elements 808a and 808b. Moreover, the driver elements 808a and 808b are in the shape of a sphere, and therefore, an area where each of the driver elements 808a and 808b contacts the mounting surface 40a of the actuator body 4 can be reduced, whereby the damping of the bending vibration of the actuator body 4 by the driver elements 808a and 808b can be further reduced. As a result, the efficiency of the ultrasonic actuator 802 can be improved. Here, the term "spherical shape" is not limited to exactly a spherical shape, and encompasses substantially a spherical shape which allows the driver elements 808a (808b) to have substantially a point contact with the piezoelectric element unit 40.

Moreover, the spherical driver element 808a (808b) can be easily produced as compared to the cylindrical driver element 208a (208b), whereby the cost of the driver element 808a (808b) can be reduced.

<<Embodiment 9 of the Invention>>

Next, an ultrasonic actuator 902 according to Embodiment 9 of the present invention will be described.

The ultrasonic actuator 902 of Embodiment 9 is different from that of Embodiment 8 in that driver elements 908a (908b) having a cylindrical shape are used instead of the driver elements 808a (808b) having a spherical shape.

Figure 22:
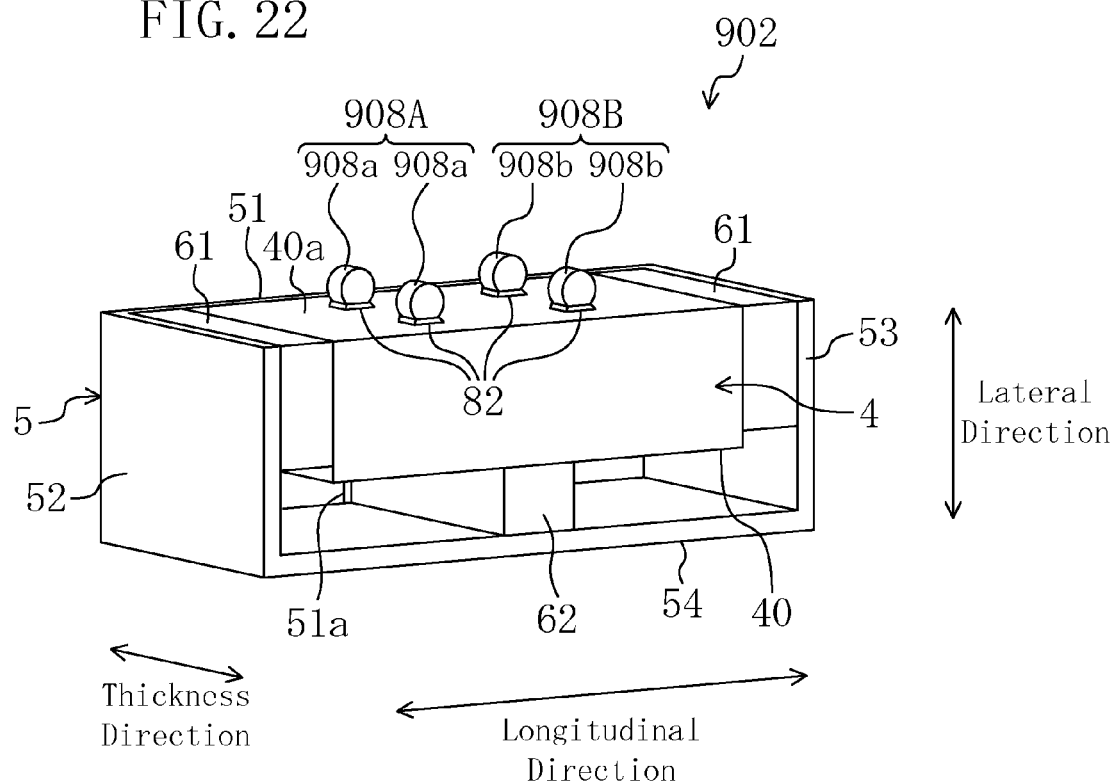
FIG. 22 is a perspective view of an ultrasonic actuator according to Embodiment 9.

Specifically, in the ultrasonic actuator 902, as shown in FIG. 22, driver element groups 908A and 908B are provided on a mounting surface 40a of a piezoelectric element unit 40 at two respective antinodes of a bending vibration in the second-order mode. The driver element groups 908A and 908B include two driver elements 908a and two driver elements 908b, respectively. The driver elements 908a and 908b have the same cylindrical shape.

Each driver element 908a (908b) is fixed to the piezoelectric element unit 40 using an adhesive 82 similar to that of Embodiment 8. Thus, each driver element 908a (908b) is attached by a line contact to the mounting surface 40a of the piezoelectric element unit 40. Here, the term "line contact" is not limited to a state in which the driver elements 908a (908b) exactly contact the mounting surface 40a, and also means a state in which the driver elements 908a (908b) and the mounting surface 40a have substantially a line contact with each other with the adhesive 82 being interposed between the driver elements 908a (908b) and the mounting surface 40a. Also, the term "cylindrical shape" is not limited to exactly a cylindrical shape, and encompasses substantially a cylindrical shape which allows the driver elements 908a (908b) to have substantially a line contact with the piezoelectric element unit 40.

Here, the arrangement of the driver elements 908a and 908b in the driver element groups 908A and 908B will be described. Note that the driver element group 908A and the driver element group 908B have the same arrangement, except that the driver element group 908A and the driver element group 908B are located at different positions in the longitudinal direction on the mounting surface 40a. Therefore, only the driver element group 908A will be described hereinafter, i.e., the driver element group 908B will not be described.

Figure 23:
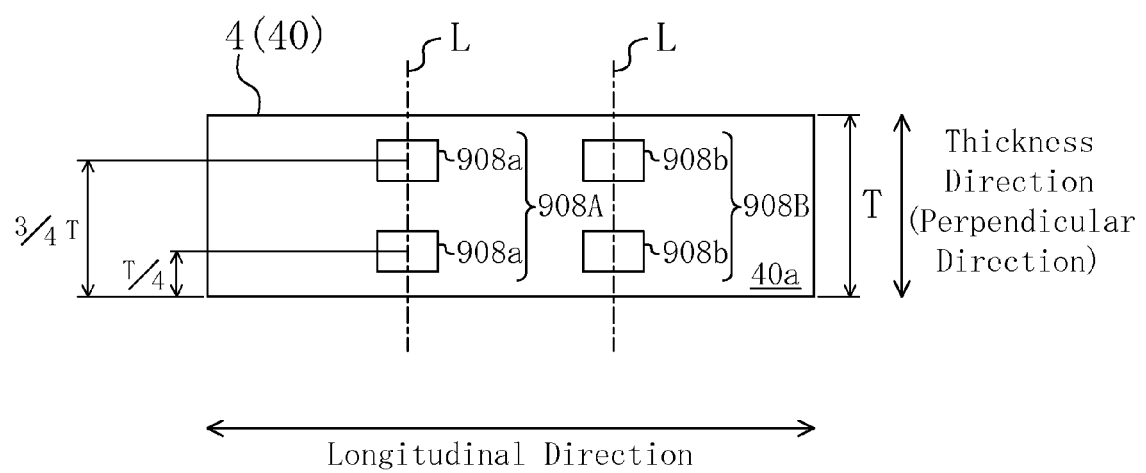
FIG. 23 is a plan view of an actuator body showing an arrangement of driver elements according to Embodiment 9.

In the first driver element group 908A, as shown in FIG. 23, the driver elements 908a are arranged in a straight line L extending in a thickness direction, i.e., a perpendicular direction of the piezoelectric element unit 40 at different positions in the perpendicular direction. In this case, each driver element 908a is provided with the axis of the cylinder extending in the perpendicular direction. In other words, the two driver elements 908a are arranged so that the axes of the cylinders are arranged in a straight line and are parallel to the straight line L. In other words, the driver elements 908a are arranged so that the axes of the cylinders are perpendicular to a plane in which the driver elements 908a perform an orbital motion.

Moreover, the driver elements 908a are arranged at positions axisymmetric with respect to a straight line which passes through a center portion in the perpendicular direction of the mounting surface 40a and is perpendicular to the perpendicular direction (i.e., extends in the longitudinal direction). Moreover, the driver elements 908a are equally spaced in the perpendicular direction, and more specifically, are located at positions t which satisfy Expression (1).

Specifically, in this embodiment, a driver element 908a located closest to one end in the perpendicular direction (the lower side of FIG. 23) is located at a distance of T/4 from the edge of the one end in the perpendicular direction of the mounting surface 40a, and a driver element 908a located farthest from the one end in the perpendicular direction (the upper side of FIG. 23) is located at a distance of 3 T/4 from the edge of the one end in the perpendicular direction of the mounting surface 40a.

Therefore, according to Embodiment 9, a plurality of driver elements 908a and 908b are provided in the thickness direction of the actuator body 4. As a result, the number of abutment points between the driver elements 908a and 908b and the stage 11 in the thickness direction can be increased. Therefore, the inclination of the actuator body 4 in the thickness direction can be reduced. As a result, the attitude of the actuator body 4 can be stabilized, whereby the driving force can be efficiently transmitted from the driver elements 908a and 908b to the stage 11.

Here, suppose that the driver elements 908a (908b) have a cylindrical shape. In this case, it may be contemplated that the length in the axial direction of the cylindrical shape is elongated so as to increase the abutment point of the driver element 908a (908b) and a stage (not shown) in the thickness direction of the actuator body 4. However, if the length in the axial direction of the driver element 908a (908b) is simply elongated, the weight of the driver element 908a (908b) increases, and therefore, a driving force caused by the longitudinal vibration and the bending vibration of the actuator body 4 is consumed to cause the driver element 908a (908b) itself to perform an orbital motion. Therefore, the driving force generated by the actuator body 4 cannot be efficiently used to drive the stage 11.

In contrast to this, according to this embodiment, a plurality of cylindrical driver elements 908a (908b) are provided in the thickness direction of the actuator body 4, i.e., a cylindrical driver element extending in the thickness direction of the actuator body 4 is divided in the thickness direction, whereby the weight of the driver element group 908A (908B) can be reduced, and the abutment points between the driver elements 908a (908b) and the stage 11 can be increased in the thickness direction of the actuator body 4. As a result, in addition to the aforementioned effect, the driving force generated by the actuator body 4 can be efficiently used to drive the stage 11.

Moreover, the driver elements 908a (908b) are in the shape of a cylinder, and therefore, an area where each of the driver elements 908a (908b) contacts the mounting surface 40a can be reduced, whereby the damping of the bending vibration of the actuator body 4 by the driver element 908a (908b) can be reduced. In addition, each driver element 908a (908b) is arranged and attached to the mounting surface 40a so that the axis of the cylinder extends in a direction perpendicular to the vibration direction of the bending vibration and the vibration direction of the longitudinal vibration of the actuator body 4, i.e., a direction perpendicular to a plane in which the actuator body 4 performs the bending vibration, whereby the damping of the bending vibration of the actuator body 4 can be further reduced.

In addition, Embodiment 9 provides functions and advantages similar to those of Embodiment 8.

<<Other Embodiments>>

The embodiments of the present invention may have the following configurations.

Figure 24:
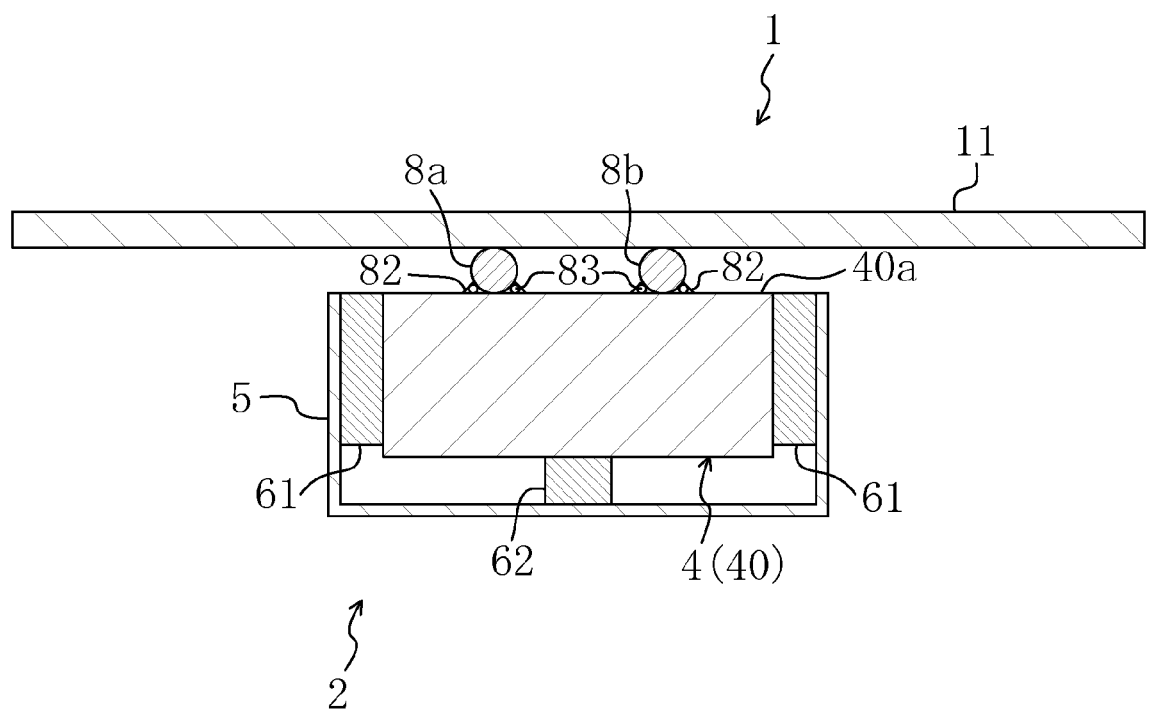
FIG. 24 is a cross-sectional view of an ultrasonic actuator according to another embodiment.

Specifically, although the driver elements are attached by a point contact to the actuator body 4 via the adhesive 82 in Embodiments 1, 3 to 5 and 8, an annular body 83 may be provided around each driver element 8a (8b) as shown in FIG. 24. Specifically, the annular body 83 is arranged around a contact portion between each driver element 8a (8b) and the mounting surface 40a of the piezoelectric element unit 40. Thus, each driver element 8a (8b) is attached to the mounting surface 40a not only by a point contact, but also via the annular body 83. The annular body 83 is attached by a line contact to each driver element 8a (8b) and the mounting surface 40a. Moreover, each driver element 8a (8b) and the annular body 83, and the annular body 83 and the mounting surface 40a, are respectively attached to each other via the adhesive 82. Note that each driver element 8a (8b) may not be attached by a point contact to the mounting surface 40a, and may be attached only by a line contact to the mounting surface 40a via the annular body 83. Here, the term "line contact" is not limited to a state in which the annular body 83 exactly contacts the driver element 8a (8b) or the mounting surface 40a, and also means a state in which the annular body 83 and the driver element 8a (8b) or the mounting surface 40a have substantially a line contact with each other with the adhesive 82 being interposed between the driver elements 8a (8b) and the mounting surface 40a.

Thus, by arranging the annular body 83 in the aforementioned manner, the contact portions between each driver element 8a (8b) and the annular body 83 and between the annular body 83 and the mounting surface 40a can be respectively increased, whereby the coupling strength between the driver element 8a (8b) and the mounting surface 40a can be improved. In order to allow the annular body 83 to improve the adhesion strength without preventing the vibrations, the annular body 83 is desirably formed of a material which is softer than that for the driver element 8a (8b) and is more rigid than the adhesive 82. Specifically, examples of such a material include metals, such as aluminum, iron and the like, and resins, such as epoxy resins, phenol resins and the like.

Therefore, according to this embodiment, the driver elements 8a (8b) have a spherical shape and each driver element 8a (8b) is attached by a point contact to the mounting surface 40a with the annular body 83 being interposed between each driver element 8a (8b) and the mounting surface 40a of the actuator body 4. Therefore, in addition to the advantages of the aforementioned embodiments, an area where each driver element 8a (8b) contacts the mounting surface 40a can be reduced, and therefore, the damping of the bending vibration of the actuator body 4 by the driver element 8a (8b) can be reduced. As a result, the efficiency of the ultrasonic actuator can be improved.

Moreover, although the driver elements of the aforementioned embodiments have a spherical shape or a cylindrical shape, the present invention is not limited to this. For example, as shown in FIG. 25, a driver element 118 having a cylindrical shape may be arranged so that an axis thereof extends in the vibration direction of the bending vibration of the actuator body 4, i.e., the lateral direction of the actuator body 4. As shown in FIG. 26, a driver element 128 having a cylindrical shape with a spherical tip portion may be arranged so that the tip portion abuts on the stage. As shown in FIG. 27, a driver element 138 having a cubic shape may be employed. As shown in FIG. 28, a column-like driver element 148 having a cross-section in the shape of a trapezoid may be employed. Note that an attachment surface of the driver element, which is attached to the mounting surface 40a, may be the only surface portion that is in the shape of a sphere or a curved surface of a cylinder, although it is not shown.

Note that, in Embodiments 3 to 6, when the abutment area of a driver element to the stage has a width in a direction along a driving direction in which the driver element outputs a driving force (e.g., the driver elements 118, 138 and 148), driver elements are preferably offset in the direction along the driving direction by an amount larger than the width of the abutment area in each driver element group. In this case, the abutment areas of the driver elements do not overlap each other in a direction perpendicular to a plane in which the driver elements perform an orbital motion. In other words, the width in the direction along the driving direction of the abutment area of the driver element to the stage can be caused to be large enough to stably maintain the attitude of the actuator body.

Moreover, although a plurality of driver elements provided at different positions in the thickness direction of the actuator body 4 are arranged in the straight line L extending in the thickness direction or the straight line La, or with reference to the straight line L, the present invention is not limited to this. Specifically, a plurality of driver elements may only be provided at different positions in the thickness direction of the actuator body 4. Note that, as described above, a plurality of driver elements may preferably be arranged in the straight line L so as to avoid the damping of the bending vibration of the actuator body 4.

Moreover, the number of driver elements is not limited to those described in the aforementioned embodiments. Moreover, although, in Embodiments 1, 3 to 6, 8 and 9, each of the driver element groups 8A and 8B which are provided on the mounting surface 40a of the actuator body 4 at different positions in the longitudinal direction, includes the same number of driver elements at a position in the longitudinal direction, the present invention is not limited to this. Specifically, the driver element groups include different numbers of driver elements.

Moreover, although the ultrasonic actuator is configured so that the first-order mode of the longitudinal vibration in the longitudinal direction and the second-order mode of the bending vibration are induced in a coordinated manner in the actuator body 4, the present invention is not limited to this. Other vibrations or other modes may be induced. A vibratory actuator may be employed which has any configuration which allows the actuator body 4 to vibrate so that a driving force is output by means of a friction force between the driver element and the stage 11.

Moreover, the ultrasonic actuator is not limited to the aforementioned configurations. For example, instead of the configuration in which power is supplied via the support rubbers 61 and the biasing rubber 62 to the piezoelectric element unit 40, a configuration in which power is supplied through a lead line connected to the piezoelectric element unit 40 may be employed. Moreover, a node portion of the vibration of the piezoelectric element unit 40 may be supported by a non-elastic member.

Moreover, the actuator body 4 is formed of the piezoelectric element unit 40, and specifically, a piezoelectric element may be attached to a substrate made of a metal or the like, or a piezoelectric element may be sandwiched between resonators made of a metal or the like. In this case, the resonator including the piezoelectric element constitutes an actuator body.

Figure 29:
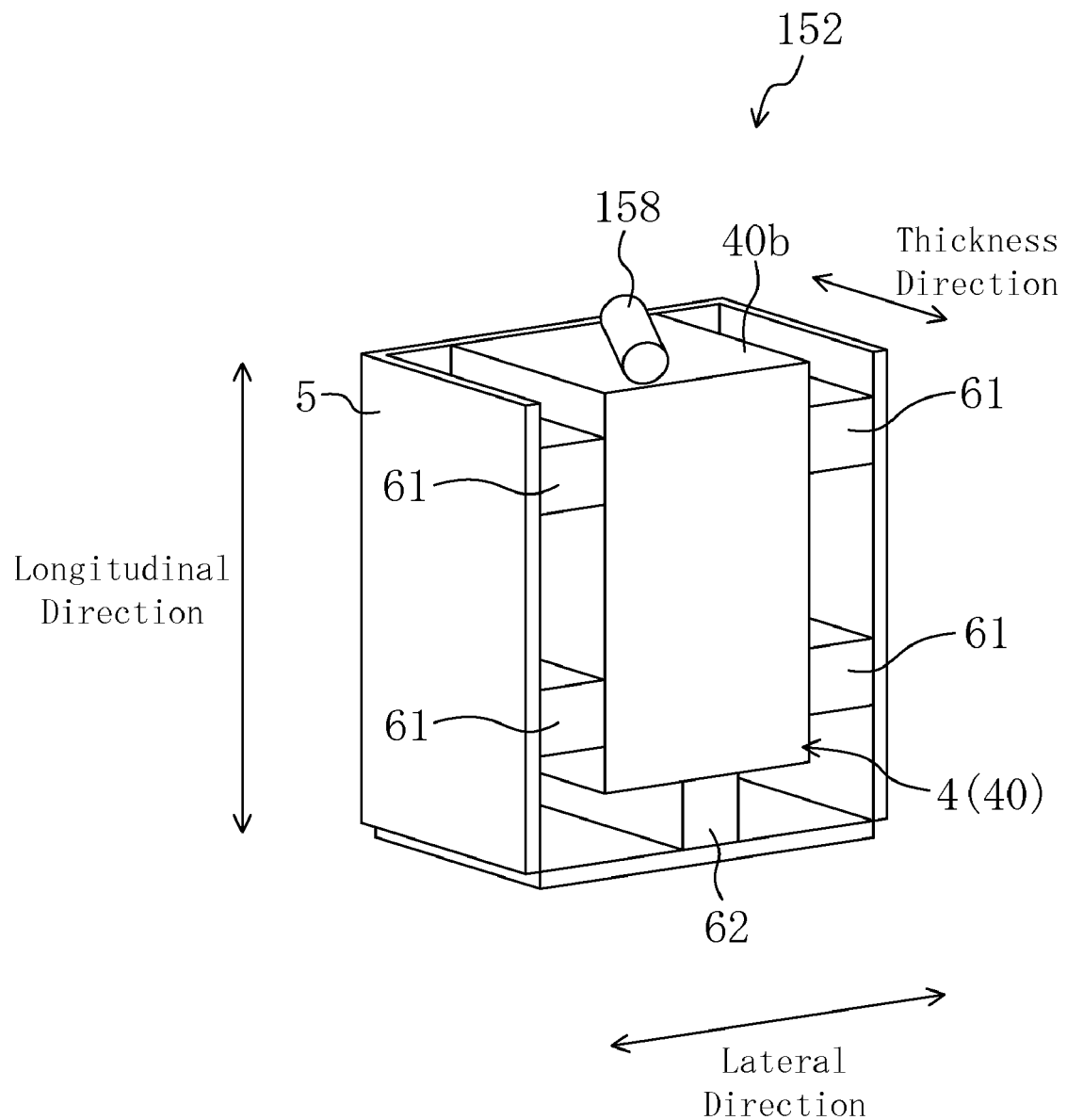
FIG. 29 is a perspective view of an ultrasonic actuator according to still another embodiment.

Moreover, in Embodiments 3 to 7, as shown in FIG. 29, an ultrasonic actuator 152 may be employed which includes a driver element 158 having a cylindrical shape may be provided on one short side surface 40b (corresponding to a mounting surface) of a piezoelectric element unit 40. The driver element 158 is arranged so that an axis thereof is oblique with respect to the thickness direction of the actuator body 4. With this configuration, when the actuator body 4 performs a composite vibration of the first-order mode of a longitudinal vibration in the longitudinal direction and the second-order mode of a bending vibration, the driver element 158 performs an orbital motion, whereby the stage can be moved in a predetermined moving direction (parallel to the lateral direction) by means of a friction force between the driver element 158 and the stage. In this case, although the driving direction is equal to the lateral direction of the actuator body 4, the inclination of the cylindrical driver element 158 with respect to the thickness direction expands an abutment area between the driver element 158 and the stage in the lateral direction, whereby the attitude of the actuator body 4 can be maintained, and therefore, a desired driving force can be transmitted from the driver element 158 to the stage.

Figure 30:
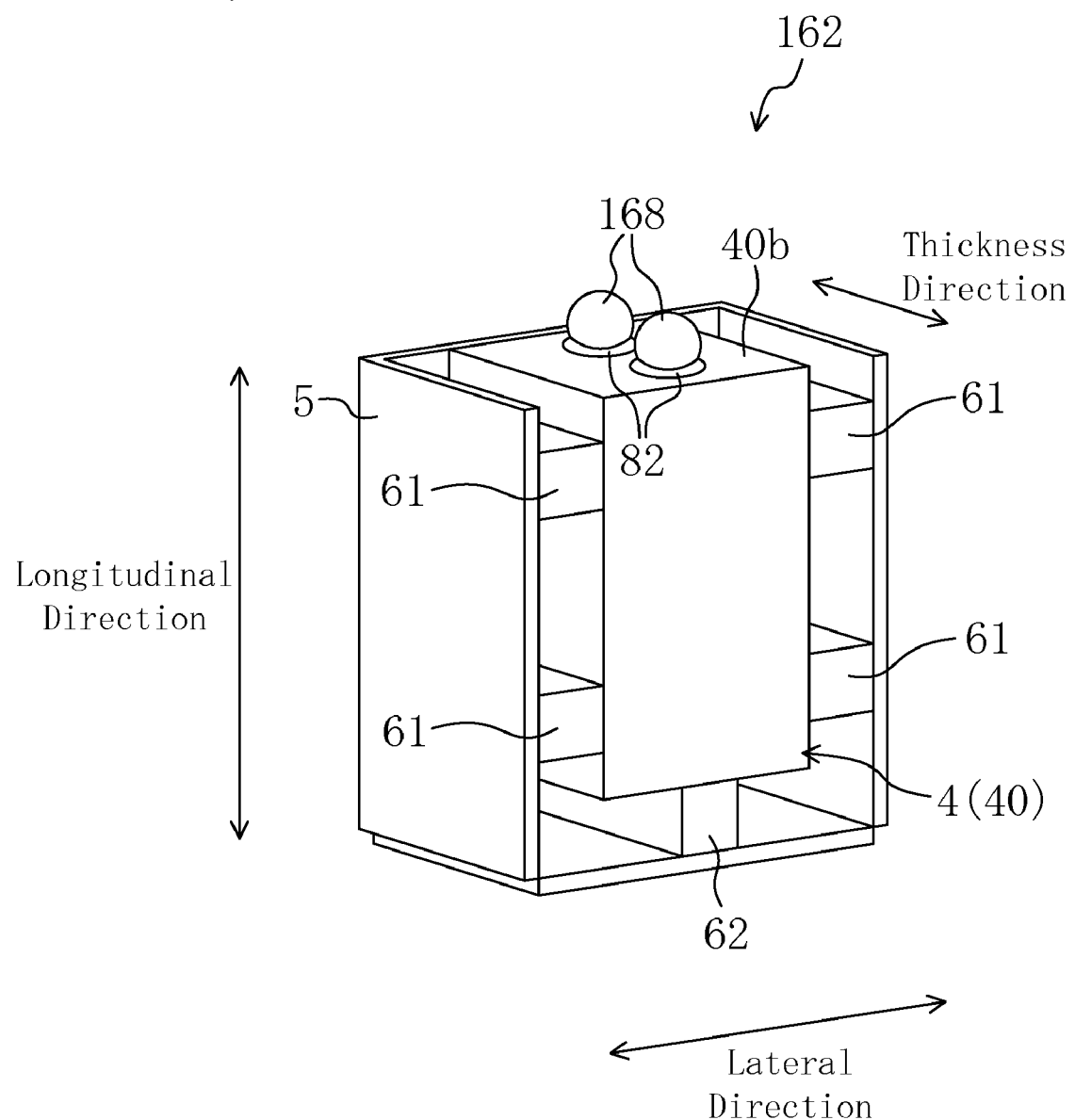
FIG. 30 is a perspective view of an ultrasonic actuator according to still another embodiment.

Moreover, in Embodiments 8 and 9, as shown in FIG. 30, an ultrasonic actuator 162 may be employed in which two driver elements 168 are provided on one short side surface 40b (corresponding to a mounting surface) of a piezoelectric element unit 40. The driver elements 168 are arranged in the thickness direction of the piezoelectric element unit 40. With this configuration, when the piezoelectric element unit 40 performs a composite vibration of the first-order mode of a longitudinal vibration in the longitudinal direction and the second-order mode of a bending vibration, the driver elements 168 performs an orbital motion, whereby the stage can be moved in a predetermined moving direction (parallel to the lateral direction) by means of a friction force between the driver elements 168 and the stage.

Figure 31:
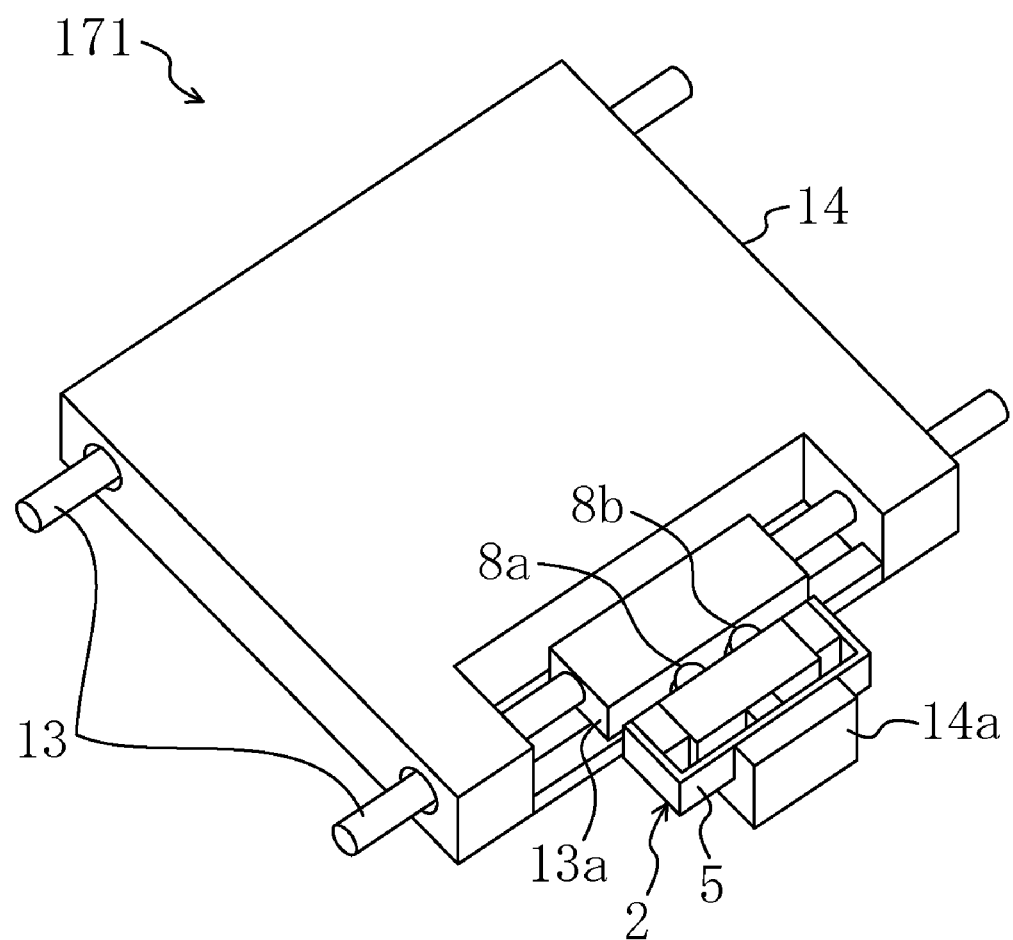
FIG. 31 is a perspective view of a drive device according to another embodiment.

Moreover, in the aforementioned embodiments, the ultrasonic actuator 2 (202, etc.) is fixed to the base and the driver elements 8a and 8b are caused to abut on the movable stage 11, and the stage 11 is driven by activating the ultrasonic actuator 2. Alternatively, as shown in FIG. 31, the ultrasonic actuator 2 may be fixed to the stage. Specifically, a drive device 171 includes guides 13 which are parallel to each other and are fixed to a base, a stage 14 which is slidably attached to the guides 13, and an ultrasonic actuator 2. One of the guides 13 is provided with an abutment member 13a fixed to the guide 13. On the other hand, the stage 14 is provided with an actuator attachment portion 14a. A case 5 of the ultrasonic actuator 2 is attached to the actuator attachment portion 14a of the stage 14 with the driver elements 8a and 8b abutting on the abutment member 13a of the guide 13. With this configuration, when the ultrasonic actuator 2 is activated, the driver elements 8a and 8b output driving forces to the abutment member 13a. However, as the abutment member 13a is fixed, the ultrasonic actuator 2 itself vibrates relative to the abutment member 13a in the longitudinal direction of the guides 13. As a result, the stage 14 coupled to the case 5 with the actuator attachment portion 14a being interposed therebetween is driven in the longitudinal direction of the guides 13.

Figure 32:
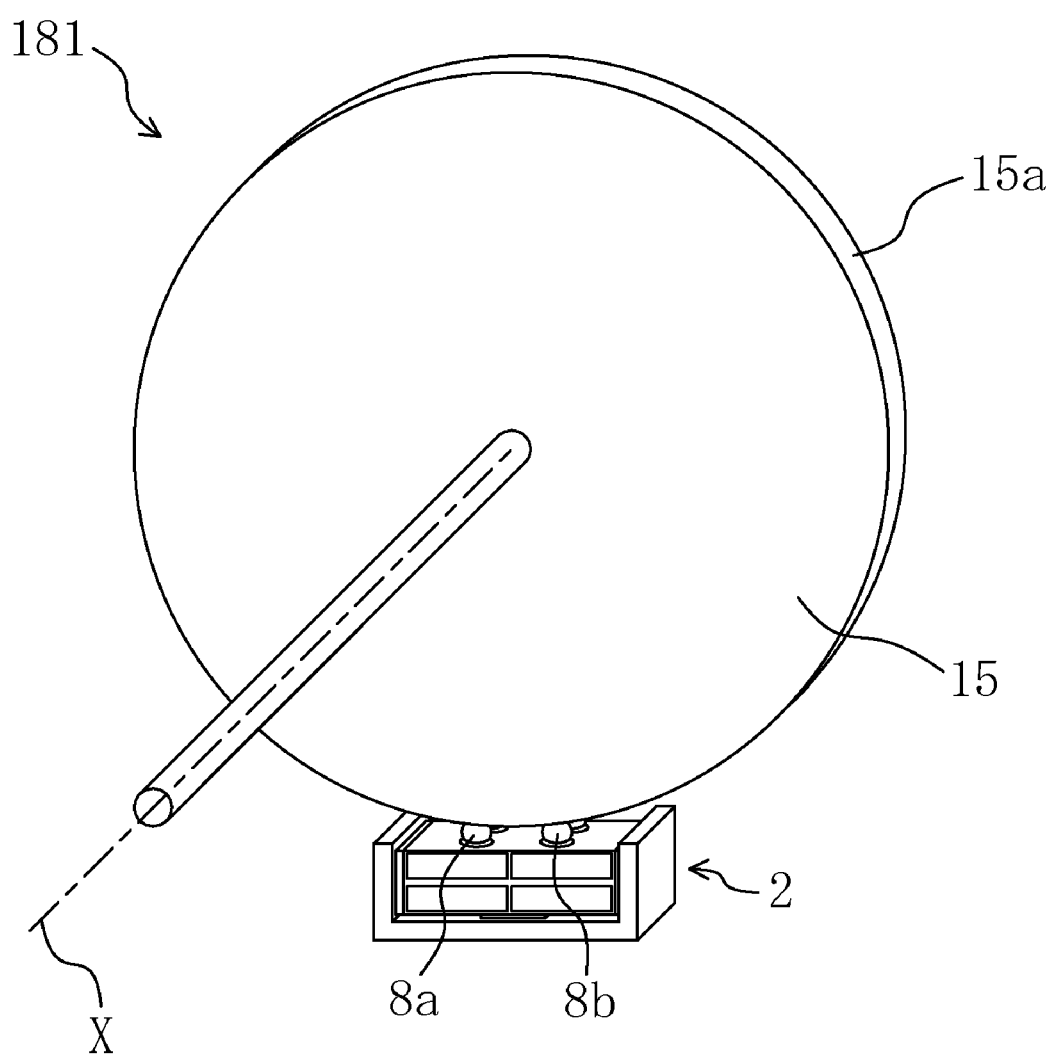
FIG. 32 is a perspective view of a drive device according to still another embodiment.
Figure 33:
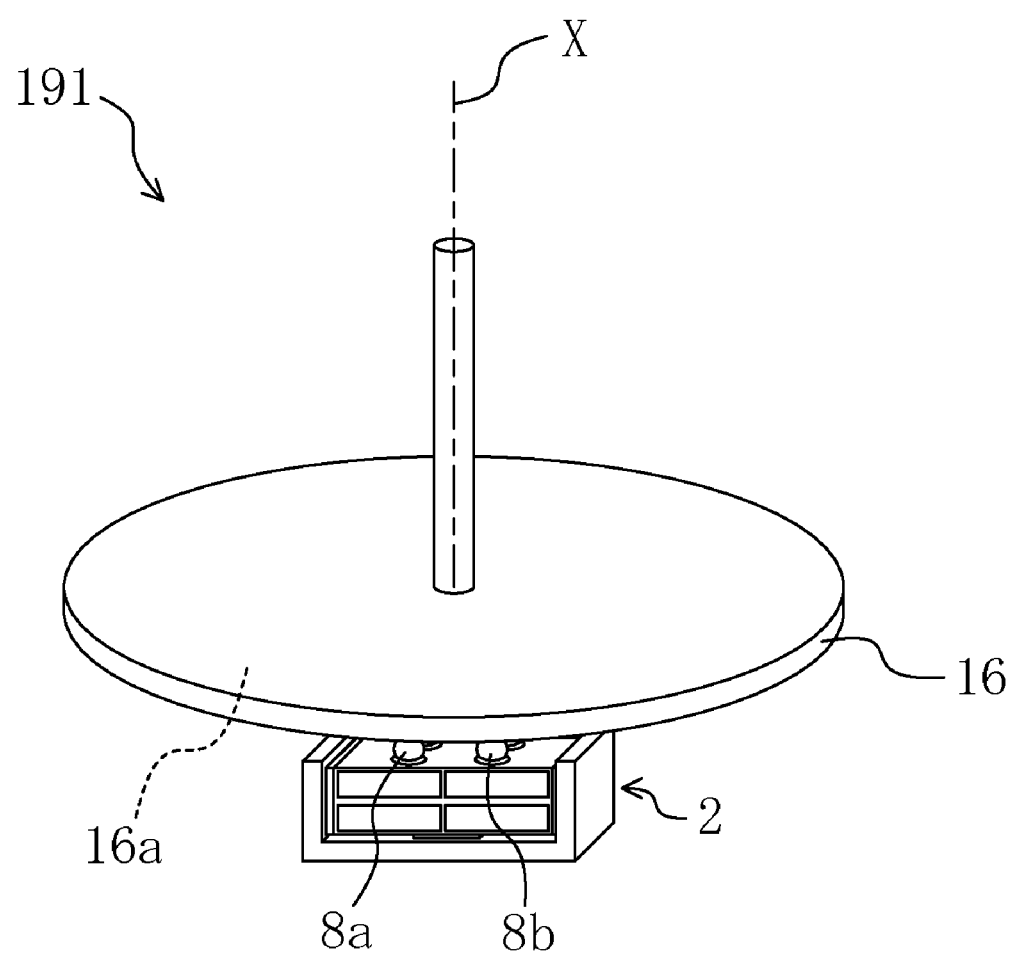
FIG. 33 is a perspective view of a drive device according to still another embodiment.

Moreover, although the stage 11 which is driven by applying the driving force of the ultrasonic actuator thereto is in the shape of a plate in the aforementioned embodiments, the present invention is not limited to this. A movable body having any configuration can be employed. For example, as shown in FIG. 32, a drive device 181 may be employed which includes the movable body comprised of a disk 15 which can be rotated about a predetermined axis X, where the driver elements 8a and 8b of the ultrasonic actuator abut on a curved circumferential surface 15a of the disk 15. With this configuration, when the ultrasonic actuator is driven, the disk 15 is rotated about the predetermined axis X by substantially an elliptical motion of each of the driver elements 8a and 8b. Moreover, as shown in FIG. 33, a drive device 191 may be employed which includes the movable body comprised of a disk 16 which can be rotated about a predetermined axis X, where the driver elements 8a and 8b of the ultrasonic actuator abut on a flat surface portion 16a of the disk 16. With this configuration, when the ultrasonic actuator is driven, the disk 16 is driven in a tangential direction thereof at an abutment area between the disk 16 and the driver elements 8a and 8b by substantially an elliptical motion of each of the driver elements 8a and 8b, and as a result, the disk 16 is rotated about the predetermined axis X.

Note that the aforementioned embodiments are essentially preferable examples and are not intended to limit the present invention, its applications, or the scope of its use.

Industrial Applicability

The vibratory actuator of the present invention has a feature that a plurality of driver elements are provided in a direction perpendicular to a plane in which the driver elements perform an orbital motion, and is useful for electronic apparatuses and the like requiring higher efficiency. Moreover, the vibratory actuator of the present invention has a feature that an abutment area where a driver element abuts on an abutment body can be expanded in a direction along a driving direction, whereby the attitude of an actuator body can be stabilized, and is useful for electronic apparatuses and the like which need to be stably driven.

| DESCRIPTION OF REFERENCE CHARACTERS | |
|---|---|
| 1, 171, 181, 191 | Drive Device |
| 11 | Stage (Movable Body) |
| 2, 202, 302, 602, 802, 902, 152, 162 | Ultrasonic Actuator |
| 4 | Actuator Body |
| 40a | Long Side Surface (Mounting Surface) |
| 40b | Short Side Surface (Mounting Surface) |
| 62 | Biasing Rubber (Biasing Member) |
| 8a, 208a, 308a, 408a, 508a, 608a, 808a, 908a | First Driver Element Group (Driver Element Group) |
| 8b, 208b, 308b, 408b, 508b, 608b, 808b, 908b | Second Driver Element Group (Driver Element Group) |
| 8a, 208a, 308a, 408a, 508a, 608a, 708a, 808a, 908a | First Driver Element (Driver Element) |
| 8b, 208b, 308b, 480b, 508b, 608b, 708b, 808b, 908b | Second Driver Element (Driver Element) |
| 118, 128, 138, 148 | Driver Element (First Driver Element, Second Driver Element) |
| 83 | Annular Body |

The invention claimed is:

1. A vibratory actuator comprising:
an actuator body formed of or formed to include a piezoelectric element, and configured to perform a plurality of vibrations having different vibration directions; and
a plurality of driver elements provided on a mounting surface which is one of side surfaces of the actuator body, and configured to perform an orbital motion in accordance with the vibrations of the actuator body to output a driving force in a predetermined driving direction, wherein
the plurality of driver elements include a first driver element and a second driver element on the mounting surface at different positions in a direction along the driving direction, and
the first driver element and the second driver element are located at different positions in a direction perpendicular to a plane in which the first and second driver elements perform the orbital motion,
wherein
the first driver element is included among n first driver elements in a first driver element group, and the second driver element is included among n second driver elements in a second driver element group located at a different position than the first driver element group along the driving direction (n: an integer of one or more), and
a middle position t in the perpendicular direction between an N-th (N=1, 2, . . . , n) first driver element and an N-th second driver element which are numbered from one end in the perpendicular direction, to satisfy the following:

$$t=\{(2N-1)/(2n)\} \times T \qquad (1)$$

where
t: a position in the perpendicular direction on the mounting surface with reference to the one end in the perpendicular direction
n: the total number of the driver elements arranged in the perpendicular direction
T: a thickness of the mounting surface in the perpendicular direction.

2. The vibratory actuator of claim 1, wherein
the first driver element and the second driver element are offset in the perpendicular direction, where an offset between the first driver element and the second driver element in the perpendicular direction is larger than or equal to width in the perpendicular direction of each of the first and second driver elements.

3. The vibratory actuator of claim 1, wherein
the first and second driver elements are each configured to abut on an abutment object via an abutment area, and
the first driver element and the second driver element are offset in the perpendicular direction, where an offset between the first driver element and the second driver element in the perpendicular direction is larger than or equal to width in the perpendicular direction of each of the abutment areas of the first and second driver elements.

4. The vibratory actuator of claim 1, wherein
the actuator body performs a bending vibration and a longitudinal vibration, and
the perpendicular direction is perpendicular to a vibration direction of the bending vibration and a vibration direction of the longitudinal vibration.

5. A drive device comprising:
a stationary body and a movable body which can be moved relative to each other; and
the vibratory actuator of claim 1 interposed between the stationary body and the movable body,
wherein
the vibratory actuator is provided on one of the stationary body and the movable body while the first and second driver elements abut on the other of the stationary body and the movable body, and
the drive device further comprises a biasing member configured to bias the actuator body so as to press the first and second driver elements against the other of the stationary body and the movable body.

6. A vibratory actuator comprising:
an actuator body formed of or formed to include a piezoelectric element, and configured to perform a plurality of vibrations having different vibration directions; and
a plurality of driver elements provided on a mounting surface which is one of side surfaces of the actuator body, and configured to perform an orbital motion in accordance with the vibrations of the actuator body to output a driving force in a predetermined driving direction, wherein
the plurality of driver elements include a first driver element and a second driver element on the mounting surface at different positions in a direction along the driving direction, and
the first driver element and the second driver element are located at different positions in a direction perpendicular to a plane in which the first and second driver elements perform the orbital motion, wherein
the actuator body performs a bending vibration and a longitudinal vibration, and
the perpendicular direction is perpendicular to a vibration direction of the bending vibration and a vibration direction of the longitudinal vibration, and
wherein
the mounting surface faces in the vibration direction of the bending vibration in the actuator body, and
the first and second driver elements are attached by a point contact to the mounting surface via an attachment area having a spherical shape.

7. The vibratory actuator of claim 6, further comprising:
an annular body provided on the mounting surface, surrounding a contact portion between the first and second driver elements and the mounting surface, wherein
the first and second driver elements are attached to the mounting surface of the actuator body via the annular body.

8. The vibratory actuator of claim 6, wherein
the first driver element and the second driver element are offset in the perpendicular direction, where an offset between the first driver element and the second driver element in the perpendicular direction is larger than or equal to width in the perpendicular direction of each of the first and second driver elements.

9. The vibratory actuator of claim 6, wherein
the first and second driver elements are each configured to abut on an abutment object via an abutment area, and
the first driver element and the second driver element are offset in the perpendicular direction, where an offset between the first driver element and the second driver element in the perpendicular direction is larger than or equal to width in the perpendicular direction of each of the abutment areas of the first and second driver elements.

10. A drive device comprising:
a stationary body and a movable body which can be moved relative to each other; and
the vibratory actuator of claim 6 interposed between the stationary body and the movable body,
wherein
the vibratory actuator is provided on one of the stationary body and the movable body while the first and second driver elements abut on the other of the stationary body and the movable body, and
the drive device further comprises a biasing member configured to bias the actuator body so as to press the first and second driver elements against the other of the stationary body and the movable body.

11. A vibratory actuator comprising:
an actuator body formed of or formed to include a piezoelectric element, and configured to perform a plurality of vibrations having different vibration directions; and
a plurality of driver elements provided on a mounting surface which is one of side surfaces of the actuator body, and configured to perform an orbital motion in accordance with the vibrations of the actuator body to output a driving force in a predetermined driving direction, wherein
the plurality of driver elements include a first driver element and a second driver element on the mounting surface at different positions in a direction along the driving direction, and
the first driver element and the second driver element are located at different positions in a direction perpendicular to a plane in which the first and second driver elements perform the orbital motion, wherein
the actuator body performs a bending vibration and a longitudinal vibration, and
the perpendicular direction is perpendicular to a vibration direction of the bending vibration and a vibration direction of the longitudinal vibration, and
wherein
the mounting surface faces in the vibration direction of the bending vibration in the actuator body, and
the first and second driver elements are attached by a line contact to the mounting surface via an attachment area having a curved surface of a cylinder, and an axial direction of the cylinder corresponding to the perpendicular direction.

12. The vibratory actuator of claim 11, wherein
the first driver element and the second driver element are offset in the perpendicular direction, where an offset between the first driver element and the second driver element in the perpendicular direction is larger than or equal to width in the perpendicular direction of each of the first and second driver elements.

13. The vibratory actuator of claim 11, wherein
the first and second driver elements are each configured to abut on an abutment object via an abutment area, and
the first driver element and the second driver element are offset in the perpendicular direction, where an offset between the first driver element and the second driver element in the perpendicular direction is larger than or equal to width in the perpendicular direction of each of the abutment areas of the first and second driver elements.

14. A drive device comprising:
a stationary body and a movable body which can be moved relative to each other; and
the vibratory actuator of claim 11 interposed between the stationary body and the movable body,
wherein
the vibratory actuator is provided on one of the stationary body and the movable body while the first and second driver elements abut on the other of the stationary body and the movable body, and
the drive device further comprises a biasing member configured to bias the actuator body so as to press the first and second driver elements against the other of the stationary body and the movable body.

15. A vibratory actuator comprising:
an actuator body formed of or formed to include a piezoelectric element, and configured to perform a plurality of vibrations having different vibration directions; and
a driver element group provided on a mounting surface which is one of side surfaces of the actuator body, and configured to perform an orbital motion in accordance with the vibrations of the actuator body to output a driving force in a predetermined driving direction,
wherein
the driver element group includes a plurality of driver elements provided in a direction perpendicular to a plane in which the driver element group performs the orbital motion, and
the driver elements in the driver element group are arranged at positions offset from each other in a direction along the driving direction, and
wherein
in the driver element group, an N-th (N=1, 2, ..., n) one of the driver elements which is numbered from one end in the perpendicular direction is located at a position t which satisfies the following:

$$t=\{(2N-1)/(2n)\}\times T \quad (1)$$

where
t: a position in the perpendicular direction on the mounting surface with reference to the one end in the perpendicular direction
n: the total number of the driver elements arranged in the perpendicular direction
T: a thickness of the mounting surface in the perpendicular direction.

16. The vibratory actuator of claim 15, wherein
the number of the driver element groups is two or more, and
the driver element groups are arranged on the mounting surface at different positions in the direction along the driving direction,
the driver elements in each of the driver element groups are arranged on the mounting surface in a predetermined arrangement direction which is oblique with respect to the perpendicular direction, and
the arrangement directions of the driver element groups are parallel to each other.

17. The vibratory actuator of claim 15, wherein
the number of the driver element groups is two or more, and
the driver element groups are arranged on the mounting surface at different positions in the direction along the driving direction,
the driver elements in each of the driver element groups are arranged on the mounting surface in a predetermined arrangement direction which is oblique with respect to the perpendicular direction, and
the arrangement direction of at least one of the driver element groups has an oblique direction with respect to the perpendicular direction which is opposite to that of the arrangement direction of another one of the driver element groups.

18. The vibratory actuator of claim 15, wherein
the actuator body performs a bending vibration and a longitudinal vibration,
the mounting surface faces in a vibration direction of the bending vibration of the actuator body,
the direction along the driving direction is a vibration direction of the longitudinal vibration,
in each of the driver element groups, the driver elements are provided on opposite sides in the vibration direction of the longitudinal vibration of an antinode of the bending vibration, and
in each of the driver element groups, the driver elements located on one of the opposite sides in the vibration direction of the longitudinal vibration and the driver elements located on the other of the opposite sides in the vibration direction of the longitudinal vibration, are located at the same distance from the antinode of the bending vibration.

19. The vibratory actuator of claim 15, wherein
the driver elements are each configured to abut on an abutment object via an abutment area, and
an offset of the driver elements in the driver element group is larger than a width in the direction along the driving direction of the abutment area of each of the driver elements.

20. A drive device comprising:
a stationary body and a movable body which can be moved relative to each other; and
the vibratory actuator of claim 15 interposed between the stationary body and the movable body,
wherein
the vibratory actuator is provided on one of the stationary body and the movable body while the driver element abuts on the other of the stationary body and the movable body, and
the drive device further comprises a biasing member configured to bias the actuator body so as to press the driver element against the other of the stationary body and the movable body.

21. A vibratory actuator comprising:
an actuator body formed of or formed to include a piezoelectric element, and configured to perform a plurality of vibrations having different vibration directions; and
a driver element group provided on a mounting surface which is one of side surfaces of the actuator body, and configured to perform an orbital motion in accordance with the vibrations of the actuator body to output a driving force in a predetermined driving direction,
wherein
the driver element group includes a plurality of driver elements provided in a direction perpendicular to a plane in which the driver element group performs the orbital motion, and
the driver elements in the driver element group are arranged at positions offset from each other in a direction along the driving direction, and
wherein
the actuator body performs a bending vibration and a longitudinal vibration,
the mounting surface faces in a vibration direction of the bending vibration of the actuator body, and
the first and second driver elements have a surface on which the driver element is attached to the mounting surface, the surface being in the shape of a sphere, and the driver element is attached by a point contact to the mounting surface.

22. The vibratory actuator of claim 21, further comprising:
an annular body provided on the mounting surface, surrounding a contact portion between the first and second driver elements and the mounting surface,
wherein
the first and second driver elements are attached to the mounting surface of the actuator body via the annular body.

23. The vibratory actuator of claim 21, wherein
the number of the driver element groups is two or more, and
the driver element groups are arranged on the mounting surface at different positions in the direction along the driving direction,
the driver elements in each of the driver element groups are arranged on the mounting surface in a predetermined arrangement direction which is oblique with respect to the perpendicular direction, and
the arrangement directions of the driver element groups are parallel to each other.

24. The vibratory actuator of claim 21, wherein
the number of the driver element groups is two or more, and
the driver element groups are arranged on the mounting surface at different positions in the direction along the driving direction,
the driver elements in each of the driver element groups are arranged on the mounting surface in a predetermined arrangement direction which is oblique with respect to the perpendicular direction, and
the arrangement direction of at least one of the driver element groups has an oblique direction with respect to the perpendicular direction which is opposite to that of the arrangement direction of another one of the driver element groups.

25. The vibratory actuator of claim 21, wherein
the actuator body performs a bending vibration and a longitudinal vibration,
the mounting surface faces in a vibration direction of the bending vibration of the actuator body,
the direction along the driving direction is a vibration direction of the longitudinal vibration,
in each of the driver element groups, the driver elements are provided on opposite sides in the vibration direction of the longitudinal vibration of an antinode of the bending vibration, and
in each of the driver element groups, the driver elements located on one of the opposite sides in the vibration direction of the longitudinal vibration and the driver elements located on the other of the opposite sides in the vibration direction of the longitudinal vibration, are located at the same distance from the antinode of the bending vibration.

26. A drive device comprising:
a stationary body and a movable body which can be moved relative to each other; and
the vibratory actuator of claim 21 interposed between the stationary body and the movable body,
wherein
the vibratory actuator is provided on one of the stationary body and the movable body while the driver element abuts on the other of the stationary body and the movable body, and
the drive device further comprises a biasing member configured to bias the actuator body so as to press the driver element against the other of the stationary body and the movable body.

27. The vibratory actuator of claim 21, wherein
the driver elements are each configured to abut on an abutment object via an abutment area, and
an offset of the driver elements in the driver element group is larger than a width in the direction along the driving direction of the abutment area of each of the driver elements.

28. A vibratory actuator comprising:
an actuator body formed of or formed to include a piezoelectric element, and configured to perform a plurality of vibrations having different vibration directions; and
a driver element group provided on a mounting surface which is one of side surfaces of the actuator body, and configured to perform an orbital motion in accordance with the vibrations of the actuator body to output a driving force in a predetermined driving direction,
wherein
the driver element group includes a plurality of driver elements provided in a direction perpendicular to a plane in which the driver element group performs the orbital motion, and
the driver elements in the driver element group are arranged at positions offset from each other in a direction along the driving direction, and
wherein
the actuator body performs a bending vibration and a longitudinal vibration,
the mounting surface faces in a vibration direction of the bending vibration of the actuator body, and
the first and second driver elements have an attachment surface which is attached to the mounting surface, the attachment surface being in the shape of a curved surface of a cylinder, the first and second driver elements being attached by a line contact to the mounting surface, and an axial direction of the cylinder corresponding to the perpendicular direction.

29. The vibratory actuator of claim 28, wherein
the number of the driver element groups is two or more, and
the driver element groups are arranged on the mounting surface at different positions in the direction along the driving direction,
the driver elements in each of the driver element groups are arranged on the mounting surface in a predetermined arrangement direction which is oblique with respect to the perpendicular direction, and
the arrangement directions of the driver element groups are parallel to each other.

30. The vibratory actuator of claim 28, wherein
the number of the driver element groups is two or more, and
the driver element groups are arranged on the mounting surface at different positions in the direction along the driving direction,
the driver elements in each of the driver element groups are arranged on the mounting surface in a predetermined arrangement direction which is oblique with respect to the perpendicular direction, and
the arrangement direction of at least one of the driver element groups has an oblique direction with respect to the perpendicular direction which is opposite to that of the arrangement direction of another one of the driver element groups.

31. The vibratory actuator of claim 28, wherein
the actuator body performs a bending vibration and a longitudinal vibration,
the mounting surface faces in a vibration direction of the bending vibration of the actuator body,
the direction along the driving direction is a vibration direction of the longitudinal vibration,
in each of the driver element groups, the driver elements are provided on opposite sides in the vibration direction of the longitudinal vibration of an antinode of the bending vibration, and
in each of the driver element groups, the driver elements located on one of the opposite sides in the vibration direction of the longitudinal vibration and the driver elements located on the other of the opposite sides in the vibration direction of the longitudinal vibration, are located at the same distance from the antinode of the bending vibration.

32. A drive device comprising:
a stationary body and a movable body which can be moved relative to each other; and
the vibratory actuator of claim 28 interposed between the stationary body and the movable body,
wherein
the vibratory actuator is provided on one of the stationary body and the movable body while the driver element abuts on the other of the stationary body and the movable body, and
the drive device further comprises a biasing member configured to bias the actuator body so as to press the driver element against the other of the stationary body and the movable body.

33. The vibratory actuator of claim 28, wherein
the driver elements are each configured to abut on an abutment object via an abutment area, and
an offset of the driver elements in the driver element group is larger than a width in the direction along the driving direction of the abutment area of each of the driver elements.

34. A vibratory actuator comprising:
an actuator body formed of or formed to include a piezoelectric element, and configured to perform a plurality of vibrations having different vibration directions; and
a driver element provided on a mounting surface which is one of side surfaces of the actuator body, and configured to perform an orbital motion in accordance with the vibrations of the actuator body to output a driving force in a predetermined driving direction,
wherein
the driver element is formed in the shape of a column and is arranged so that an axial direction of the driver element is oblique with respect to a direction perpendicular to a plane in which the driver element performs an orbital motion.

35. The vibratory actuator of claim 34, wherein
the number of the driver elements is two or more, and the driver elements are arranged on the mounting surface at different positions in a direction along the driving direction, and
the axial directions of the driver elements are parallel to each other.

36. The vibratory actuator of claim 34, wherein
the number of the driver elements is two or more, and the driver elements are arranged on the mounting surface at different positions in a direction along the driving direction, and
the axial direction of at least one of the driver elements has an oblique direction with respect to the perpendicular direction which is opposite to that of the axial direction of another one of the driver elements.

37. The vibratory actuator of claim 34, wherein
the actuator body performs a bending vibration and a longitudinal vibration,
the mounting surface faces in a vibration direction of the bending vibration of the actuator body, and
the driver element has a surface on which the driver element is attached to the mounting surface, the surface being in the shape of a curved surface of a cylinder, and the driver element is attached by a line contact to the mounting surface.

38. A drive device comprising:
a stationary body and a movable body which can be moved relative to each other; and
the vibratory actuator of claim 34 interposed between the stationary body and the movable body,
wherein
the vibratory actuator is provided on one of the stationary body and the movable body while the driver element abuts on the other of the stationary body and the movable body, and
the drive device further comprises a biasing member configured to bias the actuator body so as to press the driver element against the other of the stationary body and the movable body.

39. A vibratory actuator comprising:
an actuator body formed of or formed to include a piezoelectric element, and configured to perform a plurality of vibrations having different vibration directions; and
a plurality of driver elements provided on a mounting surface which is one of side surfaces of the actuator body, and configured to perform an orbital motion in accordance with the vibrations of the actuator body to output a driving force,
wherein
the driver elements are provided at different positions in a direction perpendicular to a plane in which the driver elements perform an orbital motion, and
wherein
an N-th (N=1, 2, ..., n) one of the driver elements which is numbered from one end in the perpendicular direction is located at a position t which satisfies the following:

$$t=\{(2N-1)/(2n)\}\times T \qquad (1)$$

where
t: a position in the perpendicular direction on the mounting surface with reference to the one end in the perpendicular direction
n: the total number of the driver elements arranged in the perpendicular direction
T: a thickness of the mounting surface in the perpendicular direction.

40. The vibratory actuator of claim 39, wherein
the actuator body performs a bending vibration and a longitudinal vibration, and
the perpendicular direction is perpendicular to a vibration direction of the bending vibration and a vibration direction of the longitudinal vibration.

41. The vibratory actuator of claim 40, wherein
the mounting surface faces in the vibration direction of the bending vibration of the actuator body, and
the driver elements are provided on a straight line extending in the perpendicular direction.

42. The vibratory actuator of claim 39, wherein
the driver elements are arranged on the mounting surface at positions axisymmetric with respect to a straight line which is perpendicular to the perpendicular direction and passes through a center in the perpendicular direction of the mounting surface.

43. The vibratory actuator of claim 39, wherein
the mounting surface faces in the vibration direction of the bending vibration of the actuator body, and
the driver elements are attached to an antinode of the bending vibration of the mounting surface.

44. A drive device comprising:
a stationary body and a movable body which can be moved relative to each other; and the vibratory actuator of claim 39 interposed between the stationary body and the movable body, wherein
the vibratory actuator is provided on one of the stationary body and the movable body while the driver elements abut on the other of the stationary body and the movable body, and
the drive device further comprises a biasing member configured to bias the actuator body so as to press the driver elements against the other of the stationary body and the movable body.

45. A vibratory actuator comprising:
an actuator body formed of or formed to include a piezoelectric element, and configured to perform a plurality of vibrations having different vibration directions; and
a plurality of driver elements provided on a mounting surface which is one of side surfaces of the actuator body, and configured to perform an orbital motion in accordance with the vibrations of the actuator body to output a driving force, wherein
the driver elements are provided at different positions in a direction perpendicular to a plane in which the driver elements perform an orbital motion, and wherein
the actuator body performs a bending vibration and a longitudinal vibration, and
the perpendicular direction is perpendicular to a vibration direction of the bending vibration and a vibration direction of the longitudinal vibration, and wherein
the mounting surface faces in the vibration direction of the bending vibration in the actuator body, and
the driver elements have a surface on which the driver element is attached to the mounting surface, the surface being in the shape of a sphere, and the driver element is attached by a point contact to the mounting surface.

46. The vibratory actuator of claim 45, further comprising:
an annular body provided on the mounting surface, surrounding a contact portion between the driver elements and the mounting surface, wherein
the driver elements are is attached to the mounting surface of the actuator body via the annular body.

47. The vibratory actuator of claim 45, wherein
the mounting surface faces in the vibration direction of the bending vibration of the actuator body, and
the driver elements are provided on a straight line extending in the perpendicular direction.

48. The vibratory actuator of claim 45, wherein
the driver elements are arranged on the mounting surface at positions axisymmetric with respect to a straight line which is perpendicular to the perpendicular direction and passes through a center in the perpendicular direction of the mounting surface.

49. The vibratory actuator of claim 45, wherein
the mounting surface faces in the vibration direction of the bending vibration of the actuator body, and
the driver elements are attached to an antinode of the bending vibration of the mounting surface.

50. A drive device comprising:
a stationary body and a movable body which can be moved relative to each other; and
the vibratory actuator of claim 45 interposed between the stationary body and the movable body, wherein
the vibratory actuator is provided on one of the stationary body and the movable body while the driver elements abut on the other of the stationary body and the movable body, and
the drive device further comprises a biasing member configured to bias the actuator body so as to press the driver elements against the other of the stationary body and the movable body.

51. A vibratory actuator comprising:
an actuator body formed of or formed to include a piezoelectric element, and configured to perform a plurality of vibrations having different vibration directions; and
a plurality of driver elements provided on a mounting surface which is one of side surfaces of the actuator body, and configured to perform an orbital motion in accordance with the vibrations of the actuator body to output a driving force, wherein
the driver elements are provided at different positions in a direction perpendicular to a plane in which the driver elements perform an orbital motion, and wherein
the actuator body performs a bending vibration and a longitudinal vibration, and
the perpendicular direction is perpendicular to a vibration direction of the bending vibration and a vibration direction of the longitudinal vibration, and wherein
the mounting surface faces in the vibration direction of the bending vibration of the actuator body, and
the driver elements have a surface on which the driver element is attached to the mounting surface, the surface being in the shape of a curved surface of a cylinder, and the driver element is attached by a line contact to the mounting surface.

52. The vibratory actuator of claim 51, wherein
the mounting surface faces in the vibration direction of the bending vibration of the actuator body, and
the driver elements are provided on a straight line extending in the perpendicular direction.

53. The vibratory actuator of claim 51, wherein
the driver elements are arranged on the mounting surface at positions axisymmetric with respect to a straight line which is perpendicular to the perpendicular direction and passes through a center in the perpendicular direction of the mounting surface.

54. The vibratory actuator of claim 51, wherein
the mounting surface faces in the vibration direction of the bending vibration of the actuator body, and
the driver elements are attached to an antinode of the bending vibration of the mounting surface.

55. A drive device comprising:
a stationary body and a movable body which can be moved relative to each other; and
the vibratory actuator of claim 51 interposed between the stationary body and the movable body, wherein
the vibratory actuator is provided on one of the stationary body and the movable body while the driver elements abut on the other of the stationary body and the movable body, and
the drive device further comprises a biasing member configured to bias the actuator body so as to press the driver elements against the other of the stationary body and the movable body.

* * * * *